United States Patent [19]
Ooishi

[11] Patent Number: 6,072,345
[45] Date of Patent: *Jun. 6, 2000

[54] SEMICONDUCTOR DEVICE REALIZING INTERNAL OPERATIONAL FACTOR CORRESPONDING TO AN EXTERNAL OPERATIONAL FACTOR STABLY REGARDLESS OF FLUCTUATION OF THE EXTERNAL OPERATIONAL FACTOR

[75] Inventor: Tsukasa Ooishi, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/979,481

[22] Filed: Nov. 26, 1997

Related U.S. Application Data

[63] Continuation of application No. 08/594,207, Jan. 31, 1996.

[30] Foreign Application Priority Data

Feb. 6, 1995 [JP] Japan .................................... 7-018086
May 22, 1995 [JP] Japan .................................... 7-122621

[51] Int. Cl.$^7$ ........................................................ A03L 7/14
[52] U.S. Cl. .......................... 327/157; 327/530; 327/535
[58] Field of Search ................................... 327/147, 148, 327/155, 156, 157, 530, 535; 331/17

[56] References Cited

U.S. PATENT DOCUMENTS

| | | | |
|---|---|---|---|
| 4,633,193 | 12/1986 | Scordo | 331/1 A |
| 4,849,993 | 7/1989 | Johnson et al. | 331/1 A |
| 5,012,142 | 4/1991 | Sonntag | 327/158 |

(List continued on next page.)

FOREIGN PATENT DOCUMENTS

| | | |
|---|---|---|
| 0 355 466 | 2/1990 | European Pat. Off. . |
| 0 442 461 A2 | 8/1991 | European Pat. Off. . |
| 43 26 844 A1 | 7/1994 | Germany . |

OTHER PUBLICATIONS

Dejan Mijuskovic et al., "Cell–Based Fully Integrated CMOS Frequency Synthesizers", IEEE Journal of Solid–State Circuits, vol. 29, No. 3, Mar. 1994.

Ulrich, D. "Stabilisiertes Labor–Netzgerät Für grossen Ausgangsspannungsbereich", Funkschau 1970, No. 2, pp. 51–52.

Linear Databook de Fa. National Semiconductor Corporation, 1982, pp. 1–10 and 1–11.

(List continued on next page.)

*Primary Examiner*—Tim Callahan
*Assistant Examiner*—An T. Luu
*Attorney, Agent, or Firm*—McDermott, Will & Emery

[57] ABSTRACT

A semiconductor memory device includes a difference adjusting circuit for detecting difference in at least one of phase and frequency between an external clock signal and an internal clock signal, for outputting a control potential for reducing the difference, and a current control circuit for adjusting driving current of an internal clock signal generating circuit in accordance with an output potential from the difference adjusting circuit. The current control circuit includes a current change restricting circuit for making smaller an amount of change of current in the clock signal generating circuit with respect to the change in the output potential from the difference adjusting circuit. An internal power supply voltage obtained by lowering internally the external power supply voltage is applied to the clock signal generating circuit. Further, when supply of the external clock signal is stopped, the output potential from the difference adjusting circuit is held. The internal power supply potential generating circuit further includes a current control circuit for adjusting an amount of current for supplying the internal power supply potential in accordance with the difference between an internal power supply potential and a prescribed potential level.

23 Claims, 26 Drawing Sheets

U.S. PATENT DOCUMENTS

| | | | |
|---|---|---|---|
| 5,061,907 | 10/1991 | Rasmussen | 331/57 |
| 5,075,640 | 12/1991 | Miyazawa | 331/10 |
| 5,077,518 | 12/1991 | Han | 327/541 |
| 5,087,834 | 2/1992 | Tsay | 327/541 |
| 5,126,692 | 6/1992 | Shearer et al. | 331/17 |
| 5,132,565 | 7/1992 | Kuzumoto | 327/541 |
| 5,144,156 | 9/1992 | Kawasaki | 307/262 |
| 5,175,512 | 12/1992 | Self | 331/57 |
| 5,179,303 | 1/1993 | Searles et al. | 327/157 |
| 5,180,995 | 1/1993 | Hayashi et al. | 331/57 |
| 5,191,295 | 3/1993 | Necoechea | 327/158 |
| 5,220,294 | 6/1993 | Ichikawa | 331/17 |
| 5,233,314 | 8/1993 | McDermott et al. | 327/157 |
| 5,300,898 | 4/1994 | Chen | 331/57 |
| 5,349,559 | 9/1994 | Park et al. | 327/541 |
| 5,352,935 | 10/1994 | Yamamura et al. | 327/546 |
| 5,373,477 | 12/1994 | Sugibayashi | 327/541 |
| 5,384,502 | 1/1995 | Volk | 327/157 |
| 5,412,349 | 5/1995 | Young et al. | 331/57 |
| 5,459,423 | 10/1995 | Nozawa et al. | 327/541 |
| 5,491,439 | 2/1996 | Kelkar et al. | 327/156 |
| 5,544,120 | 8/1996 | Kuwagata et al. | 331/57 |
| 5,563,553 | 10/1996 | Jackson | 327/157 |

OTHER PUBLICATIONS

"A 2.5 Delay–Locked Loop for an 18Mb 500 MB/s DRAM", Lee et al., 1994 IEEE.

"PPL Design for a 500MB/s Interface", Horowitz et al., 1993 IEEE International Solid–.

"A Delay Line Loop for Frequency Synthesis of De–Skewed Clock", Waizman.

"Cell–Based Fully Integrated CMOS Frequency Synthesizers", IEEE Journal of German Office Action dated Feb. 27, 1997 and English Translation thereof.

SEMICONDUCTOR DEVICE REALIZING INTERNAL OPERATIONAL FACTOR CORRESPONDING TO AN EXTERNAL OPERATIONAL FACTOR STABLY REGARDLESS OF FLUCTUATION OF THE EXTERNAL OPERATIONAL FACTOR

This application is a continuation of application Ser. No. 08/594,207 filed Jan. 31, 1996.

BACKGROUND OF THE INVENTION

1. Field of the Invention

The present invention relates to a semiconductor device for generating an internal operational factor corresponding to an external operational factor such as a power supply voltage or a clock signal. More specifically, the present invention relates to a semiconductor device including a phase locked loop (PLL) circuit or a delay locked-loop (DLL) circuit or a ring oscillator for generating an internal clock signal and/or a semiconductor device including a down converter for generating an internal power supply potential by down-converting level of an externally applied power supply potential.

2. Description of the Background Art

A PLL circuit has been known as a circuit for generating an internal signal which is in phase/frequency synchronization with an externally applied signal. The PLL circuit is used for reproducing color subcarrier for synchronous detection of a color burst signal in an integrated circuit for reproducing an ATC (Automatic Control) type color subcarrier, for improving stability of color reproduction in a color television. It is also used in the field of wire communication for synchronizing a clock output from a highly stable oscillator arranged in one station with a reference clock received from a high level station so as to distribute stable clock to various communication devices in the station.

FIG. 1 shows a schematic structure of a conventional PLL. Referring to FIG. 1, the PLL circuit includes a phase comparator circuit 2 receiving an internal clock intCLK and an external clock extCLK for outputting control signals UP and /DOWN corresponding to frequency and phase deviation between the internal clock intCLK and the external clock extCLK; a charge pump circuit 3 for adjusting potential level of its output node 3a in accordance with the control signals UP and /DOWN from phase comparator circuit 2; a loop filter 4 for filtering the output signal (potential) from output node 3a of charge pump circuit 3; a current adjusting potential output circuit 5 receiving the output potential VP from loop filter 4 for outputting an output potential VN corresponding to the output potential VP; and a ring oscillator having its oscillation frequency controlled in accordance with the output potential VP from loop filter 4 and the potential VN from current adjusting potential output circuit 5. The internal clock intCLK is output from ring oscillator 6.

Phase comparator 2 has a structure of a phase frequency comparator (PFC) and it sets the control signal UP at an L (low) level when the frequency of the internal clock intCLK is larger than the frequency of the external clock extCLK or when the phase of the internal clock intCLK is in advance of the phase of the external clock extCLK, and it sets the control signal UP at an H (high) level when the frequency of the internal clock intCLK is smaller than the frequency of the external clock extCLK or when the phase of the internal clock intCLK is lagged from that of the external clock extCLK. The control signal /DOWN from the phase comparator circuit 2 is set to the L level when the frequency of the internal clock intCLK is larger than the frequency of external clock extCLK or the phase of internal clock intCLK is in advance of the phase of the external clock extCLK, and it is set to the H level when the frequency of the internal clock intCLK is smaller than the frequency of the external clock extCLK or when the phase of the internal clock intCLK is lagged from the phase of the external clock extCLK. The phase comparator circuit 2 operates as a frequency error detector automatically when unlocked, and operates as a phase difference detector in a capture range.

Charge pump circuit 3 includes a constant current circuit 3c connected between a power supply node 1a to which the power supply potential VCC is applied and a node 3b, for supplying a constant current to node 3b; a p channel MOS (insulated gate type field effect) transistor 3d connected between node 3b and an output node 2a and receiving at its gate the control signal UP from phase comparator circuit; an n channel MOS transistor 3f connected between output node 3a and a node 3e and receiving at its gate the control signal /DOWN from phase comparator circuit 2; and a constant current circuit 3g connected between node 3e and a ground node 1b receiving the ground potential GND for sinking a prescribed constant current. When control signal UP is at the L level and the control signal /DOWN is at the L level, charge pump circuit 3 supplies charges to node 3a, and when control signal UP is at the H level and the control signal /DOWN is at the H level, it sinks charges from node 3a. Loop filter 4 serves as a lowpass filter for removing a high frequency component of potential change at the output node 3a of charge pump circuit 3. Loop filter 4 includes a resistance element 4b connected between output node 3a and node 4a; a resistance element 4d connected between nodes 4a and 4c; and a capacitor 4e connected between node 4c and the ground node 1b. Resistance elements 4b and 4d and the capacitor 4e constitute an RC lowpass filter, and a potential VP corresponding to the potential on output node 3a of charge pump circuit 3 is output from node 4a.

Current adjusting potential output circuit 5 includes a p channel MOS transistor 5b connected between power supply node 1a and node 5a and having its gate connected to node 4a of loop filter 4; and an n channel MOS transistor 5c connected between node 5a and ground node 1b and having its gate connected to node 5a. The n channel MOS transistor 5c has its gate and drain connected to each other and operates in a saturation region, and therefore it sets the potential at gate 5a in accordance with a current applied from p channel MOS transistor 5b, in accordance with square-law characteristic of $(Ids=\beta(Vgs-Vth)^2)$.

Ring oscillator 6 includes an odd-number of inverters 6a connected in a ring shape, each having driving current (operational current) adjusted in accordance with output potentials VP and VN. These odd-number of inverters 6a have the same structure and denoted by the same reference character. Inverter 6a includes a current adjusting p channel MOS transistor 6ab connected between power supply node 1a and a node 6aa and receiving at its gate the output potential VP from loop filter 4; a p channel MOS transistor 6ae connected between node 6aa and an output node 6ac and having its gate connected to input node 6ad; an n channel MOS transistor 6ad connected between output node 6ac and a node 6af and having its gate connected to input node 6ad; and a current adjusting n channel MOS transistor 6ah connected between node 6af and ground node 1b and receiving at its gate the output potential VN from current adjusting potential output circuit 5. The operation will be briefly described.

When the frequency of the internal clock intCLK is larger than the frequency of external clock extCLK or when the phase of the internal clock intCLK is in advance of the phase of the external clock extCLK, phase comparator circuit 2 sets control signals UP and /DOWN both to the L level. In this state, p channel MOS transistor 3d in charge pump circuit 3 is rendered conductive and n channel MOS transistor 3f is rendered non-conductive. Charges are supplied to output node 3a through p channel MOS transistor 3d which is conductive, the potential at output node 3a rises, and in response, output potential VP at node 4a of loop filter 4 increases. As the output potential VP increases, conductance of p channel MOS transistor 5b in current adjusting potential output circuit 5 becomes smaller, and current flowing therethrough becomes smaller. As the amount of current from MOS transistor 5b becomes smaller, output potential VN at node Sa lowers in response. The output potential VN changes in accordance with the square-law characteristic, and the output voltage VN settles at a level at which the currents flowing through p channel MOS transistor 5b and through n channel MOS transistor 5c become equal to each other.

When output potential VP rises and output potential VN lowers, current flowing through current adjusting p channel MOS transistor 6ab and current adjusting n channel MOS transistor 6ah of inverter 6a in ring oscillator 6 becomes smaller accordingly. Therefore, driving current (charging/discharging current) of inverter 6a becomes smaller, speed of operation of inverter 6a becomes slower, and in response, delay time in inverter 6a increases. As a result, the frequency of the internal clock intCLK output from ring oscillator 6 becomes smaller, the internal clock is generated with a delay in the next cycle, and thus the advance in phase of internal clock intCLK is adjusted.

When the frequency of internal clock intCLK is smaller than the frequency of external clock extCLK or when the phase of internal clock intCLK is lagged from the phase of external clock extCLK, the phase comparator circuit 2 sets the control signals UP and /DOWN both to the H level. The p channel MOS transistor 3d in charge pump circuit 3 is rendered non-conductive by the control signal UP which is at the H level, the n channel MOS transistor 3f is rendered conductive by the control signal /DOWN which is at the H level, charges are extracted from node 3a to the ground node 1b, and the potential at output node 3a lowers. In response, the output potential VP at output node 4a of loop filter 4 lowers. As the output potential VP lowers, conductance of p channel MOS transistor 5b increases in current adjusting potential output circuit 5, current flowing therethrough increases and output potential VN at node 5a increases. The output potential VN is settled at a level where the current flowing through n channel MOS transistor 5c becomes equal to the current flowing through p channel MOS transistor 5e.

In response to the lowering of output potential VP and the rise of output potential VN, the current flowing through current adjusting p channel MOS transistor 6ab and current adjusting n channel MOS transistor 6ah in each inverter 6a of ring oscillator 6 increases, so that the driving force of inverter 6a increases and in response, delay time of inverter 6a becomes smaller. As a result, the frequency of the internal clock intCLK output from ring oscillator 6 is made larger, and as the frequency increases, a clock is generated at an earlier timing in the next cycle, and thus the delay in phase of the internal clock intCLK can be recovered.

By the above described series of operations, the external clock extCLK and the internal clock intCLK have their phases and/or frequencies made equal by the PLL circuit. The state in which internal clock intCLK has the same frequency and phase as those of external clock extCLK will be referred to as a state in which internal clock intCLK is locked in to the external clock extCLK.

In the conventional PLL circuit shown in FIG. 1, the output potential VP of loop filter 4 is directly applied to p channel MOS transistor 5b of current adjusting potential generating circuit and to the gate of p channel MOS transistor 6ab of inverter 6a of ring oscillator 6. Therefore, only with a small fluctuation of output potential VP, the current flowing through p channel MOS transistors 5b and 5a changes significantly in accordance with the square-law characteristic. Accordingly, current flowing through n channel MOS transistor 5c largely varies, and current flowing through MOS transistor 6ah (MOS transistor for adjusting current of inverter 6a), constituting a current mirror circuit together with the MOS transistor 5c, changes significantly. By the change in current, the delay time of inverter 6a much changes. As a result, only by a small fluctuation of output potential VP from loop filter 4, internal clock intCLK output from ring oscillator 6 changes significantly. Even after the internal clock intCLX is locked in to the external clock extCLK, frequency/phase of internal clock intCLK much fluctuates because of small potential fluctuation at output node 3a of charge pump circuit 3. Accordingly, there arises a problem that the frequency of internal clock intCLK much fluctuates around the external clock extCLK, namely, the jitter of internal clock intCLK becomes larger.

When supply of the external clock extCLK is interrupted, the PLL circuit changes the output potential VP of loop filter 4 so as to lock the internal clock intCLK in the interrupted external clock extCLK, and hence the output potential VP changes significantly. Accordingly, when the external clock extCLK is applied again, it takes long time to lock the internal clock intCLK again in the external clock extCLK.

Further, since internal clock intCLK is generated by using a ring oscillator 6 having an odd-number of stages of inverters 6a connected in a ring, if the frequency of external clock extCLK is high, it becomes difficult for the speed of operation of inverter 6a to follow such high speed external clock extCLK, and thus it becomes difficult to lock the internal clock intCLK in the external clock extCLK.

Further, if the power supply potential VCC fluctuates much, the fluctuation in gate-source voltage (gate-to-source voltage) of p channel MOS transistors 5b and 6ab for current adjustment becomes larger, current flowing through MOS transistors 6ab and 6ah for current adjustment changes accordingly, and frequency of internal clock intCLK changes continuously. Therefore, it becomes difficult to lock the internal clock intCLK in the external clock extCLK, and hence it becomes difficult to generate the internal clock intCLK which has its phase synchronized with the external clock extCLK.

SUMMARY OF THE INVENTION

An object of the present invention is to provide a semiconductor device having a clock generator capable of generating an internal clock signal, as a second signal, which is synchronized in phase with (locked in) a stably incoming external signal as a first signal.

Another object of the present invention is to provide a semiconductor device having a clock generator capable of generating an internal clock signal with smaller jitter during locking.

A still another object of the present invention is to provide a semiconductor device having a clock generator capable of outputting an internal clock signal which can be easily locked in a high speed external clock signal.

Further object of the present invention is to provide a semiconductor device having a clock generator capable of generating an internal clock signal which is locked in the external clock signal at high speed when the supply of the external clock signal is interrupted and resumed.

A still further object of the present invention is to provide a power supply potential supplying circuit capable of supplying an internal power supply potential of which fluctuation is suppressed.

According to a first aspect, the present invention includes a difference adjusting circuit for detecting difference in frequency and phase of the external clock signal as the first signal and the internal clock signal as the second signal and for outputting a signal for reducing the difference in accordance with the result of detection; a differential amplifying circuit for differentially amplifying the output signal from the difference adjusting circuit and a feedback potential; and an internal clock signal generating circuit of which operational current is adjusted in accordance with the output signal from the differential amplifying circuit. The feedback potential is generated at a connection portion between a current supplying element supplying current in accordance with the output signal from the differential amplifying circuit and a resistance element connected between the current supplying element and a power supply (ground) node.

According to a second aspect of the present invention, the semiconductor device includes a difference adjusting circuit for detecting difference in at least one of phase and frequency between an internal clock signal and an external clock signal and for generating a control signal for reducing the detected difference, a current adjusting circuit for adjusting operational current of the internal clock signal generating circuit in accordance with the output signal from the difference adjusting circuit, and a holding circuit detecting a locking state of the external clock signal and the internal clock signal for holding the output signal from the difference adjusting circuit when the locking state is detected.

According to a third aspect of the present invention, in the semiconductor device, the clock generating circuit for generating the internal clock signal includes differential amplifying circuits connected in a ring.

According to a fourth aspect of the present invention, the semiconductor device includes a comparing circuit for comparing a difference between a reference potential and an internal potential and for generating an analog signal indicative of the result of comparison; a digital converting circuit for converting an analog output signal from the comparing circuit to a digital signal; an analog charge pump circuit for adjusting gate potential of a current control transistor in accordance with the analog signal from the comparing circuit; a digital charge pump circuit for adjusting gate potential of the current control transistor in accordance with the output signal from the digital converting circuit; and a current drive transistor supplied with current from the current control transistor for supplying the current to an internal power supply node in accordance with the difference between an internal power supply potential and the reference potential.

According to a fifth aspect of the present invention, the semiconductor device includes a first current drive transistor connected between an external power supply node and an internal power supply node and receiving at its gate a reference potential; a second current drive transistor receiving at its gate the reference potential for supplying current from the external power supply node; a comparing circuit for comparing difference between the internal power supply potential and the reference potential and outputting an analog signal indicative of the difference; a digital converting circuit for converting an analog output signal from the comparing circuit to a digital signal; a third current drive transistor connected between the second current drive transistor and the internal power supply node; an analog charge pump circuit for adjusting gate potential of the third current drive transistor in accordance with the analog signal from the comparing circuit; and a digital charge pump circuit for adjusting gate potential of the third current drive transistor in accordance with an output signal from the digital converting circuit.

In the present invention, in accordance with the first aspect, even when the potential of the output signal from the differential amplifying circuit changes, the change in current of the current supplying element can be suppressed by the resistance element. Therefore, the ratio of change in current of the internal clock signal generating circuit can be made smaller as compared with the change in potential of the output signal from the difference adjusting circuit, and accordingly, sensitivity of the internal clock signal generating circuit to the output signal from the difference adjusting circuit is made smaller. Therefore, internal clock signal is locked in the external clock signal precisely with smaller jitter.

In the invention in accordance with the second aspect, the potential of the signal for adjusting current applied to the internal clock signal generating circuit while supply of the external clock signal is interrupted is maintained, and therefore the internal clock signal can be generated stably even when the external clock signal is interrupted. Further, when the external clock signal is newly supplied, adjustment of the phase/frequency of the internal clock signal starts in accordance with the maintained potential. Therefore, the internal clock signal can be synchronized with the resumed external clock signal quickly.

In the invention in accordance with the third aspect, differential amplifying circuits connected in a ring and each having complementary input/output are used for the clock generator, and therefore output signal thereof can be changed at high speed, the internal clock signal can be generated at high speed following the external clock signal, and hence the internal clock signal having its phase synchronized with high speed external clock signal can be generated.

In the invention in accordance with the fourth aspect, the gate potential of the current control transistor is adjusted combining analog and digital manners, so that the supply current of the current control transistor can be adjusted in accordance with the fluctuation of the internal power supply potential, the overshoot and the undershoot of the internal power supply potential can be suppressed, and hence the internal power supply potential can be maintained stably at a constant potential level.

In the invention in accordance with the fifth aspect, a current is supplied constantly to the internal power supply node in accordance with the difference between the reference potential and the internal power supply potential, and the gate potential of still another third current drive transistor is controlled in analog manner or digital manner in accordance with the potential at the internal power supply node. Therefore, the amount of current supplied to the internal power supply node can be adjusted in accordance with the change in the internal power supply potential, and hence the internal power supply potential can be maintained stably at a prescribed potential level.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following, in which the present invention is applied to an SRAM (Static Random Access Memory) as an example. The application of the present invention is not limited to the SRAM, and it can be similarly applicable to all synchronous type semiconductor memory devices operating in synchronization with a clock, and it can also be applied to a semiconductor circuit device generating an internal clock which has its phase synchronized with an external clock.

Figure 2:
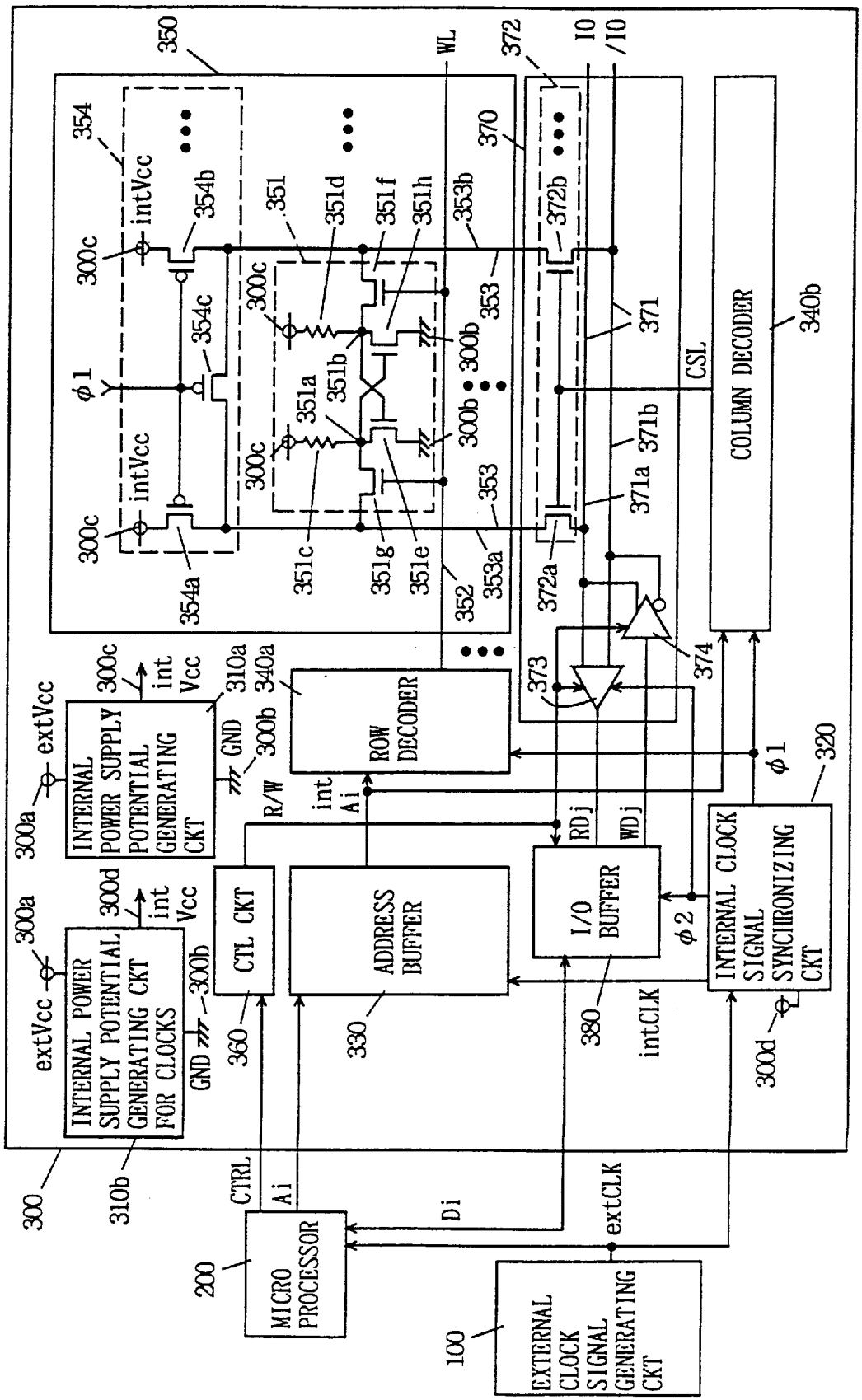
FIG. 2 shows a structure of a processing system utilizing a semiconductor memory device in accordance with one embodiment of the present invention.

FIG. 2 shows a data processing system including a microprocessor 200 and an SRAM 300 exchanging data with the microprocessor 20, as an example. The processing system includes an external clock signal generating circuit 100 for generating an external clock signal extCLK which is used as a system clock, for example, based on a source clock output from a crystal oscillator. The external clock signal extCLK from external clock signal generating circuit 100 is applied to microprocessor 200 and SRAM 300. Microprocessor 200 operates in synchronization with the external clock signal extCLK, generates and applies to the SRAM 300 a control signal CTRL (genericly representing a plurality of control signals) necessary for the SRAM 300 and an address signal Ai indicative of the location of the data to be accessed, and thus exchanges data Dj with SRAM 300.

SRAM 300 operates in synchronization with the external clock signal extCLK, receives the control signal CTRL and the address signal Ai applied from microprocessor 200, and performs memory cell selecting operation and data input/output operation. SRAM 300 includes an internal power supply potential generating circuit 310a (see FIG. 4) for generating and outputting to an internal power supply node 300c an internal power supply potential intVCC (for example, 3 V) from the external power supply potential extVCC (for example, 5 V) applied to external power supply node 300a and the ground potential GND (0 V) which is another external power supply potential applied to a ground node 300b; an internal power supply potential generating circuit 310b for clocks for generating and outputting to an internal power supply node 300d for clocks an internal power supply potential intVCC based on the external power supply potential extVCC and the ground potential GND; and an internal clock signal synchronizing circuit 320 (see FIG. 6) which operates using the internal power supply potential intVCC on the internal power supply node 300d for clocks as one operational power supply potential and outputs internal clock signal intCLK, φ1 and φ2 synchronized with the external clock signal extCLK. The internal power supply potential generating circuit 310b has similar structure as internal power supply potential generating circuit 310a, and it down-converts the external power supply potential extVCC to generate the internal power supply potential intVCC. In the present embodiment, the internal clock signal synchronizing circuit 320 is provided by a PLL circuit, as will be described in detail later.

The SRAM 300 further includes an address buffer 330 for latching an address signal Ai applied from microprocessor 200 in synchronization with the internal clock signal intCLK applied from the internal clock signal synchronizing circuit 320 and for outputting an internal address signal intAi; a row decoder 340a which is activated in synchronization with the internal clock signal φ1 from internal clock signal synchronizing circuit 320, decoding the internal address signal intAi from address buffer 330 for increasing the potential WL of the word line arranged corresponding to the memory cell designated by the internal address signal intAi; and a column decoder 340b which is activated in synchronization with the internal clock signal φ1 from internal clock signal synchronizing circuit 320 for decoding the internal address signal intAi from address buffer 330 and for increasing and driving to the selected state the potential CSL of the column selecting line corresponding to the column of the memory cell designated by the internal address signal intAi. Address buffer 330 latches the address signal Ai applied when the internal clock signal intCLK changes from the L level to the H level, and outputs internal row and column address signal intAi. When the internal address signal intAi is latched, address buffer 330 has its input portion and output portion disconnected, and the current flowing through a circuit which receives the address signal Ai is cut off. When an CMOS inverter is used, current does not flow in the CMOS inverter buffer if the potential level of the input/output signal is fixed. Therefore, a transmission gate which is rendered non-conductive when the internal clock signal intCLK is at H level may be arranged at the address buffer input stage. Other structure may be similarly used, as will be described later.

Row decoder 340a and column decoder 340b both receive internal address signal intAi in parallel applied from address buffer 330, perform decoding when the internal clock signal φ1 changes to the H level, and drive the corresponding row and column to the selected state in accordance with the result of decoding. When the internal clock signal φ1 changes to the L level, row decoder 340a and column decoder 340b both lower the word line potential WL and the potential CSL of the column selecting line which have been at the selected state, to the level of the ground potential GND. In row decoder 340a and column decoder 340b, only the output drive stage may be activated/inactivated by the clock signal φ1.

SRAM 300 further includes a memory cell array 350 in which SRAM cells are arranged in a matrix of rows and columns, and which includes memory cells 331 each of which stores 1 bit of data. A word line 352 is arranged corresponding each row of the memory cells, and the memory cells arranged in the corresponding row are connected to each word line 352. A bit line pair 353 is arranged corresponding to each column of the memory cells, and the memory cells of the corresponding column are connected to each bit line pair 353. The bit line pair 353 has bit lines 353a and 353b for transmitting mutually complementary data signals. To the bit line pair 353, a bit line equalizing circuit 354 for equalizing the potentials BL and /BL of bit lines 353a and 353b at the level of the internal power supply potential intVCC in synchronization with the internal clock signal φ1 is provided. The bit line equalizing circuit 354 is activated and supplies the internal power supply potential intVCC to the bit lines 353a and 353b, when the memory cell array 350 is not selected, that is, when the internal clock signal φ1 is at the L level, the word line 352 and the bit line pair 353 are not selected.

Memory cell 351 includes a load element 351c of a high resistance connected between internal power supply node 300c and storage node 351a; a load element 351d of a high resistance connected between internal power supply node 300c and storage node 351b; an n channel MOS drive transistor 351e connected between storage node 351a and ground node 300b and having its gate connected to storage node 351b; an n channel MOS drive transistor 351h connected between storage node 351b and ground node 300d and having its gate connected to storage node 351a; an n channel MOS access transistor 351g connected between bit line 353a and storage node 351a and having its gate connected to word line 352; and an n channel MOS access transistor 351f connected between bit line 353b and storage node 351b and having its gate connected to word line 352. Each of the load elements 351c and 301d is formed by a high resistance polycrystalline silicon or by a p channel MOS transistor (for example, a thin film transistor) having its gate connected to the corresponding storage node 351a or 351b.

Bit line equalizing circuit 354 includes a p channel precharge transistor 354a connected between internal power supply node 300c and bit line 353a and receiving at its gate the internal clock signal (1; a p channel precharge transistor 354b connected between internal power supply node 300c and bit line 353b and receiving at its gate the internal clock signal φ1; and a p channel equalize transistor 354c connected between bit line 353a and bit line 353b and receiving at its gate the internal clock signal φ1. These transistors 354a, 354b and 354c are rendered conductive when the internal clock signal φ1 attains to the L level.

The SRAM 300 further-includes a control circuit 360 receiving the control signal CTRL from the microprocessor and outputting a read/write control signal R/W; an input/output circuit 370 for performing reading/writing of data from and to the selected memory cell on the column designated by the column selecting signal CSL from column decoder 340; and an input/output buffer 380 responsive to the read/write control signal R/W from control circuit 360 and to the clock signal φ2 from internal clock signal synchronizing circuit 320 for performing data input/output between the input/output circuit 370 and the microprocessor 200 as an external device.

The control signal CTRL from microprocessor 200 to control circuit 360 includes a write enable signal /WE for designating data writing operation mode, an output enable signal /OE designating data output mode, and a chip select signal CS indicating that the SRAM is selected. Control circuit 360 is activated when the chip select signal, included in the control signal CTRL, indicates the selected state, and it outputs the read/write control signal R/W in accordance with the write enable signal /WE and output enable signal /OE.

Input/output circuit 370 includes an I/O line pair 371 as an internal data line; an I/O gate circuit 372 for connecting, in accordance with the column selecting signal CSL from column decoder 340b, the bit line pair 353 corresponding to the column designated by the column selecting signal CSL to I/O line pair 371; a sense amplifier 373 coupled to the I/O line pair 371 and responsive to the internal clock signal $\phi 2$ applied from internal clock signal synchronizing circuit 320 and from read/write control signal R/W from control circuit 360 for amplifying the potential difference generated at I/O line pair, generating an internal read data RDj and outputting it to the input/output buffer 380; and a write circuit 374 coupled between input/output buffer 380 and I/O line pair 371, responsive to the read/write control signal R/W and internal clock signal $\phi 2$ for generating complementary write data from internal write data WDj applied from input/output buffer 380 upon data writing, and for applying it to the I/O line pair 371.

I/O line pair 371 includes I/O lines 371a and 371b transmitting mutually complementary data signals.

I/O gate circuit 372 includes I/O gate provided for each bit line pair 353, which is rendered conductive when the column selecting signal CSL from column decoder 350b is at the H level, indicating the selected state. The I/O gate includes an n channel gate transistor 372a provided between bit line 353a and I/O line 371a and receiving at its gate the column selecting signal CSL, and an n channel gate transistor 372b connected between bit line 353b and I/O line 371b and receiving at its gate the column selecting signal CSL from column decoder 340b.

When the read/write control signal R/W indicates data reading and the internal clock signal $\phi 2$ attains to the L level, sense amplifier 373 is activated and amplifies the potential difference generated at I/O line pair 371 and outputs the internal read data RDj. Otherwise, the sense amplifier 373 is inactivated. Write circuit 374 is activated when the read/write control signal R/W indicates data writing, and generates a potential difference corresponding to the internal write data WDj applied from input/output buffer 380 at I/O line pair 371.

Input/output buffer 380 generates and outputs external read data Dj from internal read data RDj from sense amplifier 373 when the read/write control signal RIW indicates data reading and the internal clock signal $\phi 2$ is at the L level, and when the internal clock signal $\phi 2$ is at the H level, it latches the data RDj applied from sense amplifier 373 and holds the external read data Dj. Input/output buffer 380 takes in the external write data. Dj when read/write control signal RIW indicates data writing, and outputs internal write data WDj corresponding to the external write data Dj. The operation of the SRAM 300 shown in FIG. 2 will be briefly described with reference to FIG. 3, which is a diagram of waveforms showing the operation.

Figure 3:
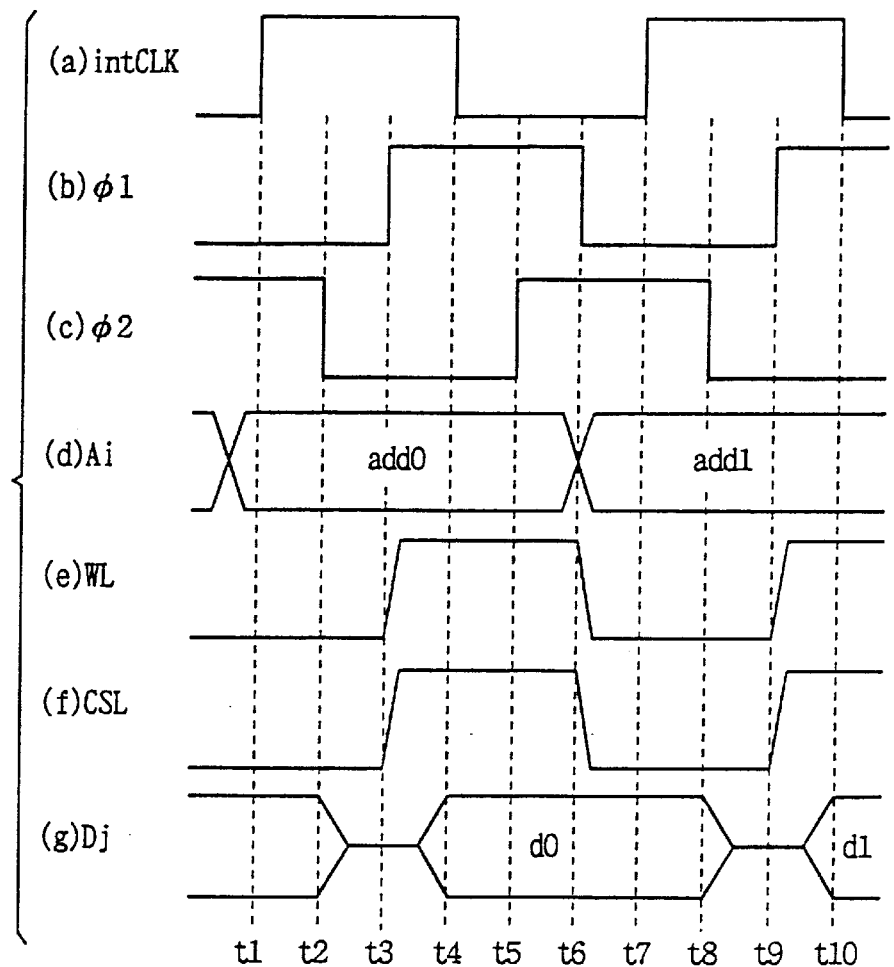
FIG. 3 is a timing chart representing the operation of the semiconductor memory device shown in FIG. 2.

Referring to FIG. 3, the control signal CTRL applied from microprocessor 200 indicates data reading, and waveforms of operation when the data is read from SRAM 300 are shown.

I t is assumed that the internal clock signal intCLK from internal clock signal synchronizing circuit 320 has already been locked in external clock signal extCLK and hence its phase is synchronized therewith.

As shown in FIG. 3 at (a), address signal Ai is se t to address ADD0. When the internal clock signal intCLK changes from the L level to the H level at time t1 as shown in FIG. 3 at (a), address buffer 330 latches the address signal Ai in response to this change, and outputs the internal address signal intAi. At this time, address buffer 330 cuts off the current flowing through a circuit which receives the externally applied address signal Ai. The structure of the address buffer will be described in detail later.

Thereafter, as shown in FIG. 3 at (c), when the internal clock signal $\phi 2$ lowers to the L level at time t2, the latched state of input/output buffer 380 is released, and sense amplifier 373 receiving the internal clock signal $\phi 2$ is activated.

Referring to FIG. 3 at (b), when the internal clock signal $\phi 1$ attains to the H level at time t3, bit line equalizing circuit 354 is inactivated, and stops equalize/precharge operation of bit line pairs 353. In response to the internal clock signal $\phi 1$, row decoder 340a is activated, and it decodes row address signal included in the internal address signal intAi applied from address buffer 330, so that the potential WL of the word line corresponding to the row designated by the row address is increased as shown in FIG. 3 at (e). Consequently, access transistors 351g and 351f included in the memory cell 351 connected to the selected word line are rendered conductive, the data stored in memory cell 351 is transmitted to bit line pair 353, and potential difference corresponding to the stored data is generated at the bit line pair 353. Further, column decoder 340b receiving the internal clock signal $\phi 1$ is activated in synchronization with the rise of internal clock signal $\phi 1$, and decodes the column address signal included in internal address signal intAi from address buffer 330, so that the corresponding column selecting signal CSL is raised to the H level as shown in FIG. 3 at (f). In the I/O gate circuit 372, in response to the column selecting signal CSL from column decoder 340b, the I/O gate provided corresponding to the selected column is rendered conductive, and transmits the potential difference generated at the bit line pair 353 corresponding to the selected column to I/O line pair 371. Sense amplifier 373 which is activated in response to the fall of the internal clock signal $\phi 2$ to the L level differentially amplifies the potential difference generated at I/O line pair 371, generates internal read data RDj of H level or L level corresponding to the potential difference, and applies it to input/output buffer 380. Input/output buffer 300 is active as the internal clock signal $\phi 2$ is at the L level, and it buffers the internal read data RDj applied from sense amplifier 373 and outputs external read data d0 as shown in FIG. 3 at (g).

At time t4, the internal clock signal intCLK falls to the L level as shown in FIG. 3 at (a), and in response, internal clock signal $\phi 2$ rises to the H level at time t5 as shown in FIG. 3 at (c). Then input/output buffer 380 latches the output data d0 and continuously outputs d0. Meanwhile, sense amplifier 373 is rendered inactive in synchronization with the rise of the internal clock signal $\phi 2$ to the H level.

Internal clock signal 41 falls to the L level at time t6 in response to the fall of internal clock signal intCLK, row decoder 340a and column decoder 340b are both rendered inactive, and the potential WL of all the word lines 352 included in memory cell array 350 and the column selecting signal CSL from column decoder 340b are set to the L level indicating the non-selected state, as shown in (e) and (f) of FIG. 3.

Bit line equalizing circuit 354 is rendered active in synchronization with the fall of internal clock signal $\phi 1$, and it equalizes and precharges the bit line pair 353 to the level of the internal power supply potential intVCC.

Thereafter, as shown in FIG. 3 at (d), address Ai is set to a state indicating an address add1 to be accessed next, and internal clock signal intCLK changes again from the L level to the H level at time t7 shown in FIG. 3 at (a). Then, similar operation as performed in the previous system cycle from time ti to t6 is performed, and data d1 stored in the memory cell designated by the address add1 is output at time t10 as shown in FIG. 3 at (g).

Figure 4:
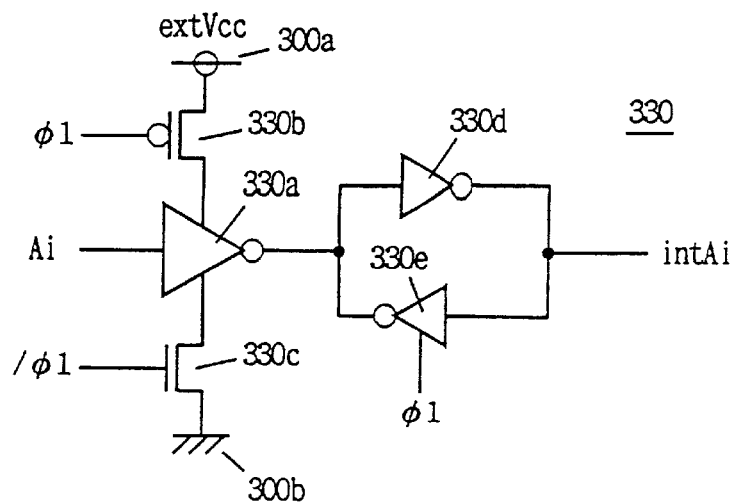
FIG. 4 schematically shows a structure of an address buffer shown in FIG. 2.

FIG. 4 shows a structure of a portion related to 1 bit of address signal of address buffer 330 shown in FIG. 2. Referring to FIG. 4, address buffer 330 includes an inverter 330a for inverting an external address signal Ai when activated; a p channel MOS transistor 330b responsive to activation of internal clock signal φ1 (L level) for supplying current from external power supply node 300a to one operational power supply node of inverter 330a; an n channel MOS transistor 330c responsive to activation of an inverted signal /φ1 of internal clock signal φ1 for forming a current path between another power supply node of inverter 330a and ground node 300b; an inverter 330d receiving an output signal from inverter 330a; and a clock inverter 330e activated when internal clock signal φ1 is at the high level, for inverting and buffering the output signal from inverter 330d for transmission to the input portion of inverter 330d.

Inverter 330a has a structure of a common CMOS inverter. Inverter 330a and MOS transistors 330b and 300c constitute a clocked inverter. When internal clock signal φ1 is at the H level, MOS transistors 330b and 330c are both rendered non-conductive, and current supply in inverter 330a is stopped. Meanwhile, in response to the H level of internal clock signal 41, clocked inverter 330e is activated, and a latch circuit is formed by inverters 330d and 330e. When internal clock signal φ1 is at the L level, MOS transistors 330b and 330c are both rendered conductive, inverter 330a is provided with operational current and operates to invert, buffer and output the external address signal Ai.

In this state, clocked inverter 330e is inactive, while inverter 330d inverts and buffers the output signal from inverter 330a, and outputs internal address signal intAi. In this case, latch circuit is not formed, and internal address signal intAi is output in accordance with the external address signal Ai.

MOS transistor 330b is connected to external power supply node 300a, and in order to render MOS transistor 330b non-conductive, the H level of internal clock signal φ1 must be increased to the level of the external power supply potential extVCC. This can be readily implementing by using a simple level converting circuit. Level conversion is not necessary for the inverted signal /φ1.

As shown in FIG. 4, by providing a clock inverter which is rendered conductive in response to the internal clock signal φ1 at the input stage receiving the external address signal Ai of address buffer 330, current consumption in address buffer 330 can be reduced. Since row decoder 300a, column decoder 340b and sense amplifier 373 are rendered inactive in accordance with internal clock signals φ1 and φ2, respectively, it is not necessary to activate these circuits constantly, and current consumption can fur consumption can further be reduced, as compared with a structure which performs a common static operation.

Figure 5:
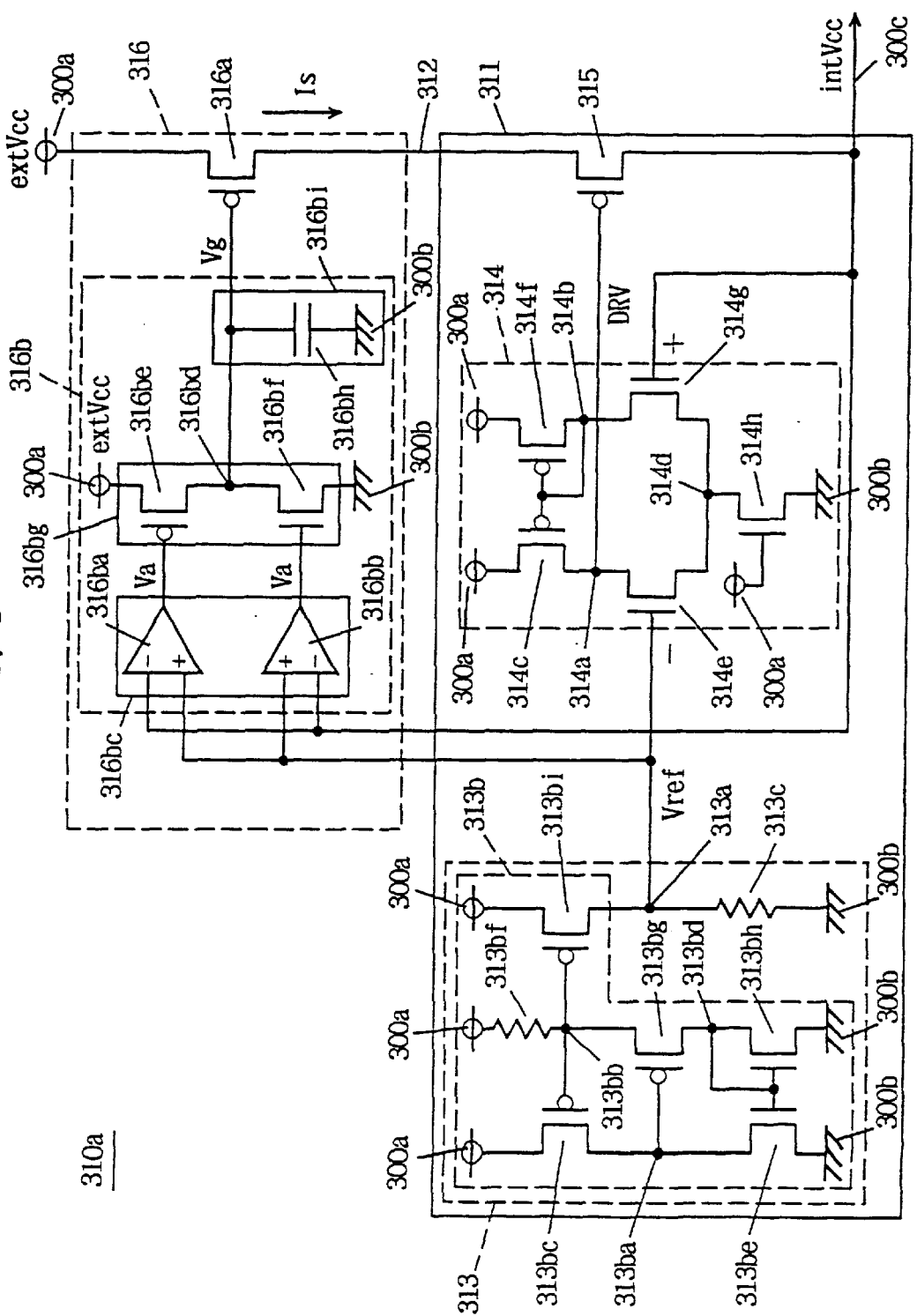
FIG. 5 shows a structure of an internal power supply potential generating circuit shown in FIG. 2.

FIG. 5 is a circuit diagram showing the structure of the internal power supply potential generating circuit 310a shown in FIG. 2. Referring to FIG. 5, internal power supply potential generating circuit 310a includes a constant voltage circuit 311 receiving a current from current supply node 312 for outputting an internal power supply potential intVCC at a level of a constant reference potential Vref on internal power supply node 300c, and a current supplying circuit 316 adjusting the amount of current supplied to current supply node 312 in accordance with the difference between internal power supply potential intVCC and the reference potential Vref. Here, the potential is measured with reference to the ground potential.

Constant voltage circuit 311 includes a reference potential generating circuit 313 receiving external power supply potential extVCC and the ground potential GND for outputting a constant reference potential Vref (for example, 3 V when extVCC=5 V) which is not influenced by the fluctuation in the external power supply potential extVCC; a differential amplifying circuit 314 comparing the reference potential Vref from reference potential generating circuit 313 and internal power supply potential intVCC for outputting a driver control signal DRV corresponding to the difference therebetween; and a driver transistor 315 constituted by a p channel MOS transistor connected between current supply node 312 and internal power supply node 300c and having its gate connected to receive the driver control signal DRV from differential amplifying circuit 314. When the internal power supply potential intVCC is lower than the reference potential Vref, differential amplifying circuit 314 lowers the potential level of driver control signal DRV. If the internal power supply potential intVCC is higher than the reference potential Vref, the differential amplifying circuit 314 increases the potential level of driver control signal DRV. The driver control signal DRV changes in an analog manner.

Reference potential generating circuit 313 includes a constant current circuit 313b connected between external power supply node 300a and reference potential node 313a for supplying a constant current regardless of the fluctuation of the external power supply potential extVCC, and a resistance element 313c connected between reference potential node 313a and ground node 300b. A reference potential Vref is output on reference potential node 313a.

Constant current circuit 313b includes a p channel MOS transistor 313bc connected between external power supply node 300a and node 313ba and having its gate connected to node 313bb; and n channel MOS transistor 313be connected between node 313ba and ground node b and having its gate connected to node 313bd; a resistance element 313bf connected between external power supply node 300a and node 313bb; a p channel MOS transistor 313bg connected between nodes 313b and 313bd and having its gate connected to node 313ba; an n channel MOS transistor 313bh connected between node 313bd and ground node 300b and having its gate connected to node 313bd; and a p channel MOS transistor 313bi connected between external power supply node 300a and reference potential node 313a and having its gate connected to node 313bb.

In constant current circuit 313b, resistance element 313bf has relatively large resistance value, and supplies small current to MOS transistors 313bg and 313bh. MOS transistors 313bh and 313be constitute a current mirror circuit, and mirror current of the current flowing through MOS transistor 313bh flows through MOS transistor 313be. The current flowing through MOS transistor 313be is supplied from MOS transistor 313bc. Current drivability of MOS transistor 313bc is made large, and source-gate voltage of MOS transistor 313bc, that is, potential difference between internal power supply node 300a and node 313bb is set to the absolute value |vthp| of the threshold MOS transistor 313bc. Therefore, the current I flowing through resistance element 313bf is given by |Vthp|/R (313ef), where R (313ef) represents resistance value of resistance element 313ef. The current I has a constant current value which is not dependent on the external power supply potential extVCC. When the current I increases, the current flowing through MOS transistors 313bg and 313bh increases, the current flowing through MOS transistor 313*be* increases, the potential at node 313*ba* increases (as the drain current of MOS transistor 313*be* is determined by the potential at node 313*ba*), the current flowing through MOS transistor 313*g* is lowered accordingly, the potential at node 313*bb* is increased, and the current flowing through MOS transistor 313*bc* is lowered. When the current flowing through resistance element 313*bf* lowers, the potential at node 313*ba* lowers, the conductance of MOS transistor 313*bg* is increased, larger amount of current is drawn out from node 313*bb*, the potential at node 313*bb* is decreased accordingly, and the current is increased through MOS transistor 313*b*. By the feedback control of MOS transistors 313*bg*, 313*bh* and 313*be*, the current flowing through MOS transistor 313*bc* and resistance element 313*bf* is made constant. The node 313*bd* is connected to the gate of MOS transistors 313bi. Therefore, a constant current flows through MOS transistor 313*bi*, as in MOS transistor 313*bc*. Reference potential Vref is determined by the current supplied from MOS transistor 313*bi* and the resistance value of resistance element 313*c*. Since the current flowing through MOS transistor 313*bi* has a constant value not dependent on the external power supply potential extVCC, the reference potential Vref also has a constant potential not dependent on the external power supply potential extVCC.

Differential amplifying circuit 314 includes a p channel MOS transistor 314*c* connected between external power supply node 300*a* and an output node 314*a* outputting a driver control signal DRV and having its gate connected to node 314*b*; an n channel MOS transistor 314*e* connected between nodes 314*a* and 314*d* and having its gate connected to receive reference potential Vref; a p channel MOS transistor 314*f* connected between external power supply node 300*a* and node 314*b* and having its gate connected to node 314*b*; an n channel MOS transistor 314*g* connected between nodes 314*b* and 314*d* and having its gate connected to receive internal power supply potential intVCC; and an n channel MOS transistor 314*h* connected between node 314*d* and ground node 300*b* and having its gate connected to external power supply node 300*a*. MOS transistors 314*c* and 314*f* constitute a current mirror circuit, MOS transistors 314*e* and 314*g* constitute a differential stage for comparing potentials applied to their gates, and MOS transistor 314*h* serves as a constant current source for supplying a relatively large constant current in accordance with the external power supply potential extVCC applied to the gate. The differential amplifying circuit 314 has a structure of a current mirror type differential amplifying circuit, of which positive input (+) is the gate of the MOS transistor 314*g* and its negative input (−) is the gate of the MOS transistor 314*e*. The signal DRV changes in a digital manner.

Current supplying circuit 316 adjusts the current supplied to current supply node 312 in accordance with the difference between internal power supply potential intVCC and reference potential Vref so that undershoot and overshoot of internal power supply potential intVCC with respect to the reference potential Vref is minimized. The current supplying circuit 316 includes a p channel current control transistor 316*a* connected between external power supply node 300*a* and current supply node 312; and a current control circuit 316*b* receiving the reference potential Vref from reference potential generating circuit 313 and the internal power supply potential intVCC on internal power supply node 300*c* for adjusting the gate potential Vg of p channel current control transistor 316*a*. The current control circuit 316*b* lowers the gate potential Vg of current control transistor 316*a* when the undershoot of the internal power supply potential intVCC with respect to the reference potential Vref becomes larger, and if the overshoot becomes larger, it increases the gate potential Vg of current control transistor 316*a*.

Current control circuit 316*b* includes a comparing circuit 316*bc* for comparing internal power supply potential intVCC with the reference potential Vref; a charge pump circuit 316*bg* for adjusting gate potential Vg of current control transistor 316*a* in accordance with an output potential Va from comparing circuit 316*bc*; and a loop filter 316*bi* connected between the gate of current control transistor 316*a* and ground node 300*b*. Comparing circuit 316*bc* includes differential amplifying circuit 316*ba* and 316*bb* having the same structure as differential amplifying circuit 314 included in constant voltage circuit 311. Each of the differential amplifying circuit 316*ba* and 316*bb* outputs a signal Va which attains to the L level when the internal power supply potential intVCC is higher than the reference potential Vref and attains to the H level if the internal power supply potential intVCC is lower than the reference voltage Vref.

Charge pump circuit 316*bg* includes a p channel MOS transistor 316*be* connected between external power supply node 300 and a node 316*bd* connected to the gate of current control transistor 316*a* and having its gate connected to the output of differential amplifying circuit 316*b*, and an n channel MOS transistor 316*bf* connected between node 316*bd* and ground node 300*b* and having its gate connected to receive output potential Va of differential amplifying circuit 316*bd*.

Loop filter 316*bi* includes a capacitor 316*bh* connected between node 316*bd* and ground node 300*b*, and suppresses an abrupt change in gate potential Vg. The operation of internal power supply potential generating circuit 310*a* shown in FIG. 5 will be briefly described.

When the internal power supply potential extVCC is within the range of about 5 V to about 2 V, reference potential generating circuit 313 operates stably, a constant current is supplied from current control circuit 316*b*, and the reference potential Vref output from reference potential generating circuit 313 is kept at a constant potential level accordingly, regardless of the fluctuation of external power supply potential extVCC. Differential amplifying circuit 314 receives the reference potential Vref and internal power supply potential intVCC, and compares this. When internal circuitry such as decoders 340*a* and 340*b* connected to internal power supply node 300*c* and memory cell 351 operate and consume current and the internal power supply potential intVCC becomes lower than the reference potential Vref (that is, when there is an undershoot), the driver control signal DRV output from output node 314*a* lowers and increases the conductance of drive transistor 315. Drive transistor 315 supplies a large amount of current to internal power supply node 300*c* in accordance with the increased conductance, thereby increasing internal power supply potential intVCC. When internal power supply potential intVCC becomes higher than the reference potential Vref by the current supply (when there is an overshoot) differential amplifying circuit 314 raises the driver control signal DRV and reduces conductance of driver transistor 315, so that the amount of current supply to internal power supply node 300*c* is reduced. When the internal circuit is in operation at this time, the internal power supply potential intVCC is consumed by the operating internal circuitry, and hence it becomes lower. When the current supply to current supplying node 312 is small, the internal power supply potential intVCC which has become lower than the reference potential Vref does not increase at high speed, and hence the undershoot becomes larger. Meanwhile, if the current supplied to current supply node 312 is increased, the internal power supply potential intVCC increases at high speed, and hence the overshoot becomes larger. Generation of the undershoot and the overshoot will be described with reference to FIGS. 6 and 7.

Figure 6:
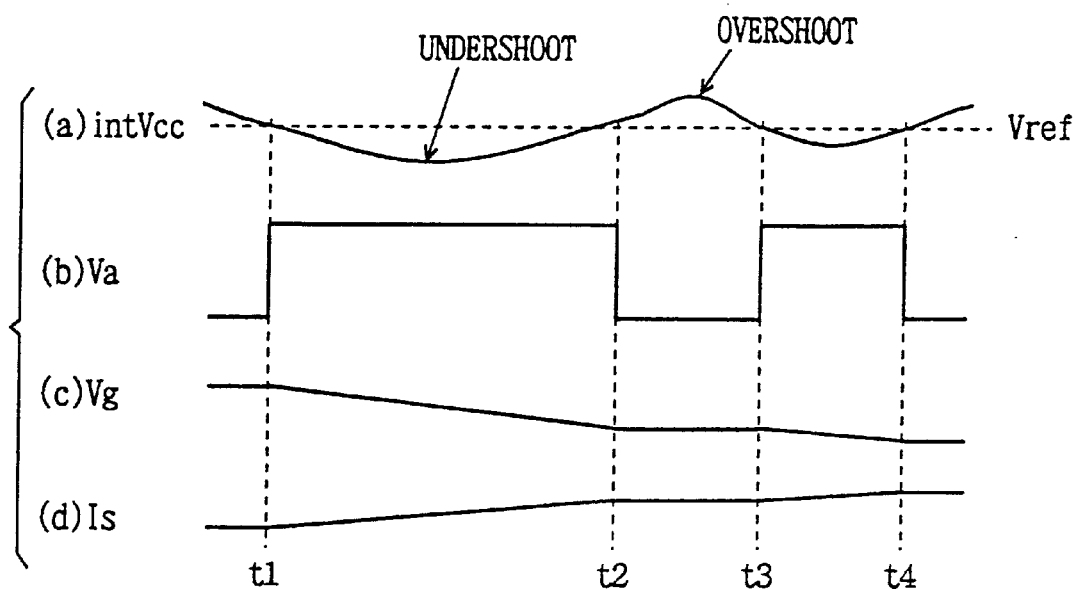
FIGS. 6 and 7 are timing charts representing the operation of the internal power supply potential generating circuit shown in FIG. 5.

FIG. 6 is a timing chart showing the operation of the current supplying circuit 316 when there is a large undershoot of internal power supply potential intVCC. If the undershoot of internal power supply potential intVCC becomes larger from time t1 to t2 as shown in (a) of FIG. 6, the output potential Va from differential amplifying circuits 316ba and 316bb included in comparing circuit 316bc is kept at the H level for a long period of time as shown at (b) of FIG. 6, and the time period in which p channel MOS transistor 316bb included in charge pump circuit 316bg is rendered non-conductive and n channel MOS transistor 316bf is rendered conductive becomes longer. Therefore, as shown in (c) of FIG. 6, the potential Vg on current control transistor 316a is discharged by the conduction of MOS transistor 316bf of charge pump circuit 316bg and lowers significantly. As a result, conductance of current control transistor 316a is increased, the current Is supplied from external power supply node 300a to power supply node 312 becomes larger as shown in (d) of FIG. 6, and hence the internal power supply potential intVCC is increased at high speed. From time t2 to t3, the internal power supply potential intVCC increases to be higher than the reference potential Vref because of this large amount of current. Accordingly, by the function of differential amplifying circuit 316bc, gate potential Vg is kept increased in this period and the amount of current supplied is reduced. At this time, since the difference between internal power supply potential VCC and the reference potential Vref is small, the amount of change of current Is supplied to current supply node 312 through current control transistor 316a is small, and hence the undershoot of internal power supply potential intVCC in the period from time t3 to t4 is made smaller. After the time point t2 where large undershoot of internal power supply potential intVCC is suppressed, the period in which L level and H level of output potential Va from each of differential amplifying circuit 316ba and 316bb is made approximately the same. Therefore, by the function of the loop filter 316bi, the gate potential Vg of current control transistor 316a and supply current Is do not change much as shown in (c) and (d) of FIG. 6, but these are maintained at approximately constant values. During this period, the internal power supply potential intVCC vibrates with a small amplitude. However, the vibration is smoothed because of a parasitic resistance or stabilizing capacitance incidental to the internal power supply node 300c, and an internal power supply potential intVCC at the level of the reference potential Vref is output.

The operation when the overshoot of internal power supply potential intVCC becomes larger will be described with reference to the timing chart of FIG. 7.

Figure 7:
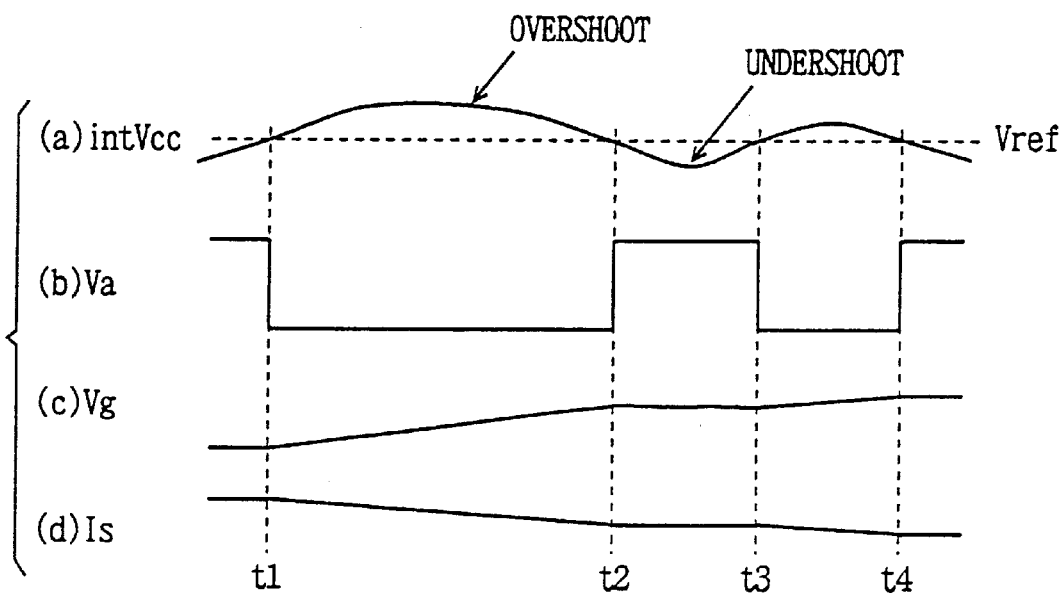

When the overshoot of the internal power supply potential intVCC becomes large at time t1 to t2 in FIG. 7 at (a), the output potential Va of differential amplifying circuits 316ba and 316bb of comparing circuit 316bc is kept at the L level for a long period of time as shown at (b) of FIG. 7, and accordingly, the period in which p channel MOS transistor 316be is rendered conductive and n channel MOS transistor 316bf is rendered non-conductive in charge pump circuit 316bg becomes longer. By the p channel MOS transistor 316be which is set to the conductive state, the gate potential Vg of current control transistor 316a increases significantly as shown in (c) of FIG. 7. Consequently, the current Is supplied through current control transistor 316a to current supply node 312 becomes smaller as shown in FIG. 7 at (d), and increase in potential of internal power supply potential intVCC is suppressed. By the reduced supply current, the internal power supply potential intVCC lowers, and if it becomes the reference potential Vref at time t2, the gate potential Vg is again lowered by charge pump circuit 316bg, so that the supply current Is is increased a little to suppress the undershoot. Consequently, overshoot in a period from t3 to t4 can be made sufficiently small. In the stable state after the time point t2, the period in which the output potential Va from differential amplifying circuit 316ba and 316bb is kept at the L level and H level are made shorter to be approximately equal to each other as shown in FIG. 7 at (d), and therefore supply potential Is and the gate potential Vg of current control transistor 316a hardly change as shown in (c) and (d) of FIG. 7. Consequently, in the similar manner as at the time of generation of large undershoot, the internal power supply potential intVCC is maintained at the level of the reference potential Vref.

As described above, by adjusting the amount of current supplied to current supply node 312 in accordance with the difference between internal power supply potential VCC and reference potential Vref, even when the drive transistors 315 performs on/off operation in digital manner by using the control signal DRV output from differential amplifying circuit 314, the undershoot/overshoot can be suppressed quickly and hence the internal power supply potential intVCC can be returned to the prescribed reference potential Vref level.

Figure 8:
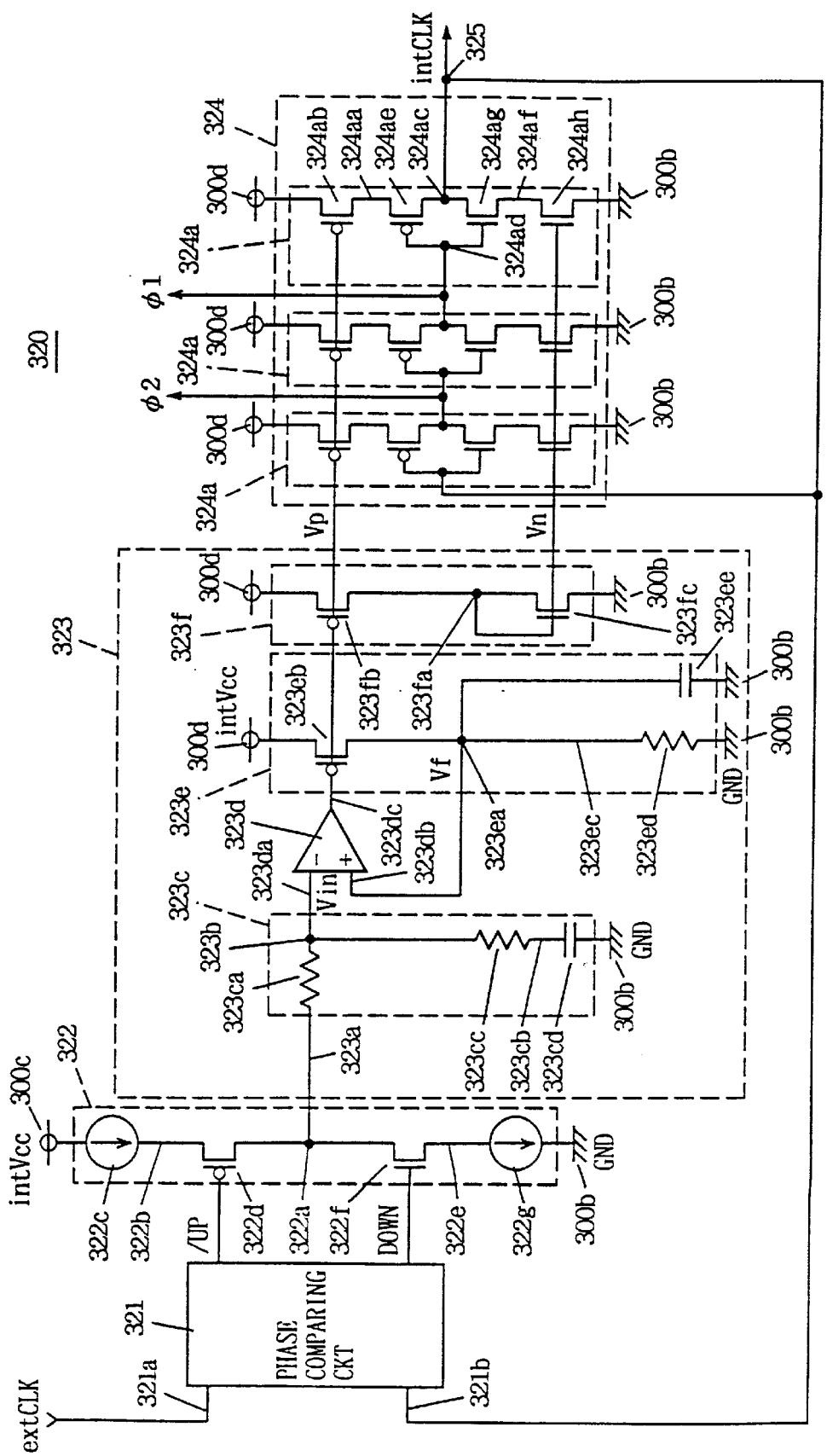
FIG. 8 shows a structure of an internal clock signal synchronizing circuit in the semiconductor memory device in accordance with a second embodiment of the present invention.

FIG. 8 shows an example of a specific structure of the internal clock signal synchronizing circuit 320 shown in FIG. 2. Referring to FIG. 8, internal clock signal synchronizing circuit 320 includes a phase comparator circuit 321 for outputting comparison signals /UP and DOWN in accordance with deviation in frequency and phase between external clock signal extCLK applied to external clock input node 312a and internal clock signal intCLK applied to internal clock input node 321b; a charge pump circuit 322 for charging/discharging node 322a in accordance with control signals /UP and DOWN output from phase comparator circuit 321; and a current control circuit 323 for outputting control potentials Vp and Vn for adjusting operational current of ring oscillator 324 in accordance with the potential at output node 322a of charge pump circuit 322.

Phase comparator circuit 321 sets the comparison signal /UP to H level, when frequency of internal clock signal intCLK is larger than the frequency of external clock signal extCLK or when the phase of internal clock signal intCLK is advanced than the phase of external clock signal extCLK, and sets the comparison signal /UP to the L level when the frequency of the internal clock signal intCLK is smaller than the frequency of external clock signal extCLK or when the phase of internal clock signal intCLK is delayed from the phase of the external clock signal extCLK. Comparison signal DOWN is set to the H level when the frequency of internal clock signal intCLK is larger than the frequency of external clock signal extCLK or when the phase of internal clock signal intCLK is advanced than the external clock signal extCLK, and it is set to the L level when the frequency of internal clock signal intCLK is smaller than the frequency of external clock signal extCLK or when the phase of internal clock signal intCLK is delayed from the phase of external clock signal extCLK.

When comparison signal /UP is at the L level and comparison signal DOWN is at the L level, charge pump circuit 322 supplies charges to charging/discharging node 322a, and when comparison signal /UP is at the H level and comparison signal DOWN is at the H level, it sinks charges from charge/discharge node 322a. Charge pump circuit 322 includes a constant current circuit 322c connected between internal power supply node 300c and node 322b; a p channel MOS transistor 322d connected between node 322b and charging/discharging node 322a and having its gate connected to receive the comparison signal /UP from phase comparator circuit 321; an n channel MOS transistor 322f connected between charging/discharging node 322a and node 322e and having its gate connected to receive the comparison signal DOWN from phase comparator circuit 321; and a constant current circuit 322g connected between node 322e and ground node 300b. Constant current circuit 322c and 322g have the same structure as the constant current circuit 313b of reference potential generating circuit 313 included in internal power supply potential generating circuit 310a shown in FIG. 5. However, since constant current circuit 322g sinks current, the conductivity type of the transistors and the polarities of potentials applied to power supply nodes are all opposite to those of the constant current circuit 313b shown in FIG. 5. By the constant current circuit 322c and 322g, a constant current is supplied, regardless of the fluctuations in internal power supply potential intVCC and the ground potential GND.

Current control circuit 323 outputs potentials Vp and Vn to ring oscillator 324 for controlling operational current thereof. The p channel current control signal Vp lowers when the potential at charging/discharging node 322a of charge pump circuit 322 increases, while the n channel current control signal Vn increases when the potential at charging/discharging node 322a of charge pump circuit 322 lowers. Current control circuit 323 includes a loop filter 323c for performing lowpass filtering operation on the potential at node 323a connected to the charging/discharging node 322a of charge pump circuit 322 and for transmitting the filtered result to node 323b; an operational amplifier 323d for differentially amplifying the output potential Vin of loop filter 323c and a feedback potential Vf, which will be described later; a p channel current control circuit 323e for generating the feedback potential Vf in accordance with the output signal from operational amplifier 323d; and an n channel current control circuit 323f for generating the n channel current control signal Vn in accordance with the output signal from operational amplifier 232d, that is, the p channel current control signal Vp.

Operational amplifier 323d includes a first node 323da connected through loop filter 323c to charging/discharging node 322a, a second input node 323db receiving the feedback potential Vf, and an amplifying output node 323dc for outputting p channel power supply control signal Vp.

Loop filter 323c includes a resistance element 323ca connected between nodes 323a and 323b, a resistance element 323cc connected between nodes 323b and 323cb, and a capacitor 323cd connected between node 323cb and ground node 300b. Loop filter 323c has a time constant determined by the resistance value of resistance elements 323ca and 323cc and the capacitance value of capacitor 323cd, and it functions as a lowpass filter.

Operational amplifier 323d has similar structure as the differential amplifying circuit 314 included in the internal power supply potential generating circuit 310a shown in FIG. 5. However, the output signal from operational amplifier 323 changes in an analog manner.

The p channel current control circuit 323e includes a p channel MOS transistor 323eb connected between internal power supply node 300d for clocks and node 323ea and having its gate connected to the amplifying output node 323dc of operational amplifier 323d, a resistance element 323ed connected between node 323ea and ground node 300b, and a capacitor 323ee connected parallel to resistance element 323ed between node 323ea and ground node 300b. Node 323ea is connected to the second input node 323db of operational amplifier 323d and outputs the feedback potential Vf. Resistance element 323dd and capacitor 323ee has a function of stably generating the potential Vf of node 323ea.

The n channel current control circuit 323f includes a p channel MOS transistor 323fb connected between internal power supply node 300d for clocks and the node 323fa at which the n channel current control signal Vn is output and having its gate connected to the amplifying output node 323dc of operational amplifier 323d, and an n channel MOS transistor 323fc connected between node 323fa and ground node 300b and having its gate connected to node 323fa.

Internal clock signal generating circuit 324 includes a ring oscillator constituted by an odd number of stages (three stages) of inverters 324a. The inverters 324a has its driving current (charging/discharging current) controlled by p channel current control signal Vp and n channel current control signal Vn, and when the driving current is large, the delay time is made shorter and when the driving current is made smaller, the delay time is increased. Therefore, the internal clock signal intCLK output from the internal clock signal generating circuit 324 has higher frequency when the driving current is larger, and lower frequency when the driving current is smaller.

Inverter 324a includes a p channel current control transistor 324ab connected between internal power supply node 300d for clocks and node 324aa and having its gate connected to amplifying output node 323d of operational amplifier 323d; a p channel MOS transistor 324ae connected between node 324aa and output node 324ac and having its gate connected to internal node 324ad; an n channel MOS transistor 324ag connected between output node 324ac and node 324af and having its gate connected to input node 324ab; and an n channel current control transistor 324ah connected between node 324af and ground node 300b and having its gate connected to receive the n channel current control signal Vn. Three stages of inverters 324a are connected in a ring. The internal clock signal $\phi 2$ is output from the first stage of inverter 324a, the internal clock signal $\phi 1$ is output from the second stage of inverter 324a and the internal clock signal intCLK is output from the last stage (third stage) of inverter 324a. The operation of the external clock signal synchronizing circuit 320 shown in FIG. 8 will be described.

When the frequency of internal clock signal intCLK is higher than that of the external clock signal extCLK or when the phase of the internal clock signal intCLK is advanced than the phase of the external clock signal extCLK, phase output circuit 321 sets the comparison signals /UP and DOWN both to the H level. In response, the p channel MOS transistor 322d of charge pump circuit 322 is rendered non-conductive, n channel MOS transistor 322f is rendered conductive, charges are drawn out from charging/discharging node 322a through MOS transistor 322f which is conductive, and the potential at node 322a lowers. As the potential at charging/discharging node 322 lowers, the potential Vin at node 323b, that is, at the first input node 323da of operational amplifier 323d lowers through the loop filter 323c. Operational amplifier 323d increases the potential level of the p channel current control signal Vp output to the amplifying output node 323dc, as the difference from the feedback potential Vf applied to the second input node 323db becomes larger as the input potential Vin lowers. As the potential of p channel current control signal Vp increases, the amount of current supplied by MOS transistor 323eb in p channel current control circuit 323e lowers, and accordingly, the potential level of the feedback potential Vf at node 323ea lowers. Therefore, the operational amplifier 323d adjusts the potential level of p channel current control signal Vp such that the feedback potential Vf becomes equal to the input potential Vin applied to the input node 323da.

Figure 1:
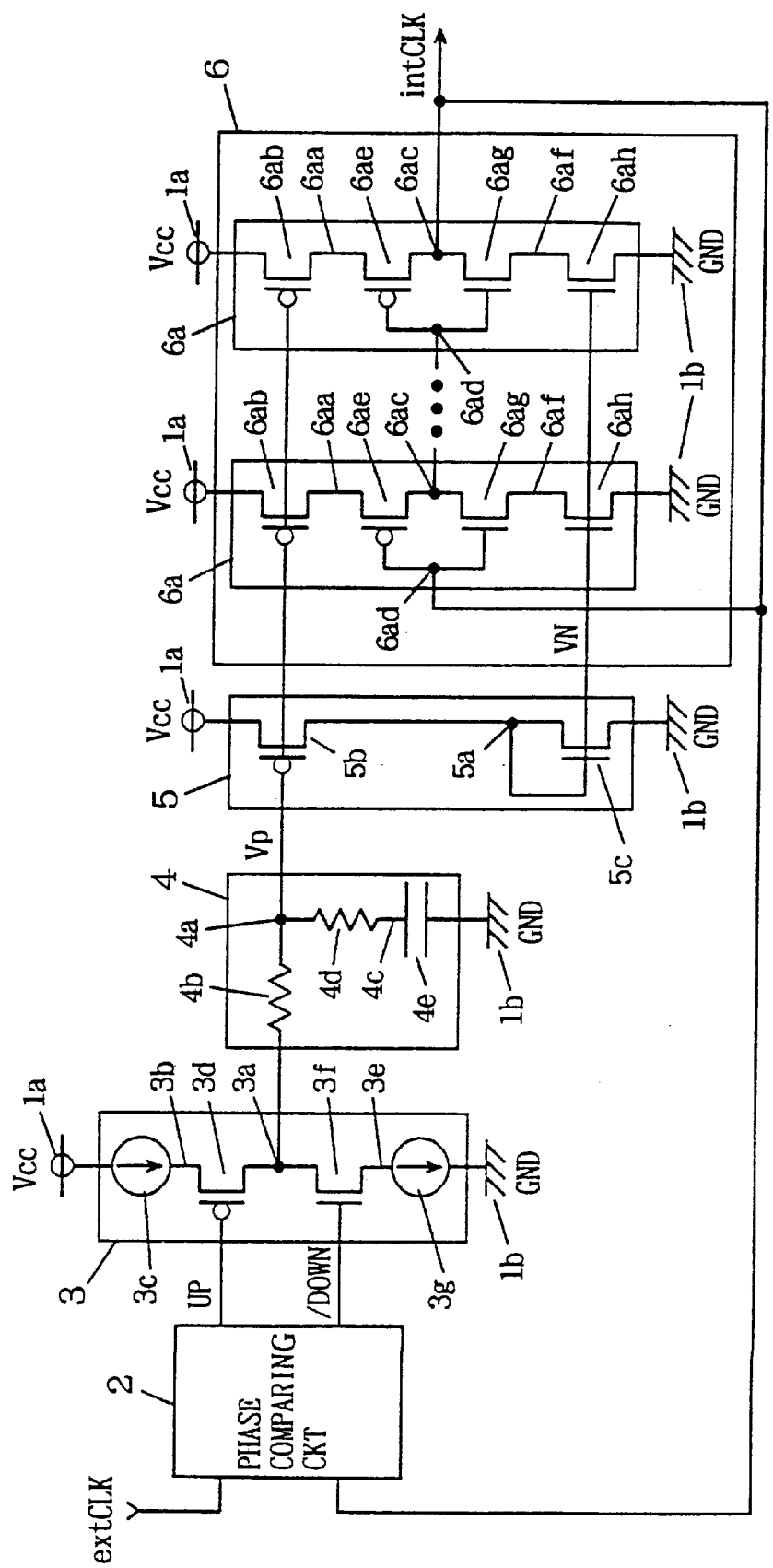
FIG. 1 shows an example of a structure of a conventional PLL circuit.

Meanwhile, when the potential level of p channel current control signal Vp increases, the amount of current flowing through p channel MOS transistor 323fb in n channel current control circuit 323f becomes smaller, and accordingly, the potential level of n channel current control signal Vn output from node 323fa becomes lower. Finally, the n channel current control signal Vn settles at a potential level at which the current flowing through n channel MOS transistor 323fc becomes equal to the current flowing through p channel MOS transistor 323fb (the operation is the same as in the conventional PLL circuit shown in FIG. 1).

When the p channel current control signal Vb rises and the n channel current control signal Vn lowers, the current flowing through p channel current control transistor 324ab and n channel current control transistor 324ah in inverter 324a included in internal clock signal generating circuit 324 becomes smaller and hence delay time in inverter 324a becomes longer. Therefore, the frequency of the internal clock signal intCLK output from the internal clock signal generating circuit 324 becomes smaller, the timing of generation of the clock in the next cycle is delayed and thus advance in phase is corrected.

When the frequency of the internal clock signal intCLK is smaller than the external clock signal extCLK or when the phase of the internal clock signal intCLK is delayed from that of external clock signal extCLK, phase comparator circuit 321 sets comparison signals /UP and DOWN both to the L level. The p channel MOS transistor 322b is rendered conductive and n channel MOS transistor 322f is rendered non-conductive in charge pump circuit 322, the charging/discharging node 322a is provided with charges through p channel MOS transistor 322b which is conductive, and accordingly, the potential Vin at node 323da increases through loop filter 323c. As the potential of input potential Vin at node 323da increases, operational amplifier 323d lowers the potential level of the p channel current control signal Vp at output node 323dc. In p channel current control circuit 323e, supply current of MOS transistor 323eb increases, and in response, the potential of feedback potential Vf increases. When the feedback potential Vf becomes higher than the input potential Vin, operational amplifier 323d increases the potential level of output node 323dc conversely, so as to lower the feedback potential Vf. Therefore, operational amplifier 323d adjusts the potential level of p channel current control signal Vp so that the input potential Vin and input potential Vf become equal to each other. In n channel current control circuit 323f, current flowing through p channel MOS transistor 323fb increases, and the potential level at node 323fa increases. As a result, the amount of current flowing through p channel MOS transistors 324ab and n channel MOS transistor 324ah in inverter 324a of internal clock signal generating circuit 324 becomes larger and delay time of inverter 324a becomes shorter. Thus the frequency of internal clock signal intCLK is increased, and as the frequency is increased, the internal clock signal is generated at an earlier timing in the next cycle, thus the delay in phase can be reduced.

The currents flowing through p channel current control transistor 324ab and n channel current control transistor 324ah included in inverter 324a are made equal by the function of n channel current control circuit 323f. The current flowing through p channel current control transistor 324ab is made equal to the current flowing through p channel MOS transistor 323eb in p channel current control circuit 323e (because both receive the control potential Vp at their gates: provided that sizes (gate widths) are the same). The current flowing through p channel MOS transistor 323eb is equal to the current I flowing through resistance element 323ed having a resistance value R, and the voltage applied across resistance element 323ed is equal to the feedback potential Vf at node 323ea. The feedback potential Vf is made equal to the input potential Vin applied to the input node 323da, by operational amplifier 323d. Therefore, the current I flowing through resistance element 323ed can be represented as I=Vin/R. The amount of change of the current I with respect to the change in input potential Vin is proportional to 1/R. Therefore, when the resistance value R of resistance element 323ed is made sufficiently large, the amount of change in current I is very small even when the input potential Vin, that is, the output potential of loop filter 323c, changes significantly. Therefore, the amount of change in the driving current of inverter 324a in internal clock signal generating circuit 324 is small, and therefore after the internal clock signal intCLK is locked in external clock signal extCLK, the jitter of internal clock signal intCLK can be made small. Since the amount of current flowing through inverters 324a is adjusted by using operational amplifier 323d, the amount of current I can be adjusted correctly at high speed in accordance with difference in phase and/or frequency between external clock signal extCLK and the internal clock signal intCLK. Further, as the sensitivity is a little lowered, excessive adjustment of internal clock signal intCLK is prevented, and hence frequency and phase of internal clock signal intCLK can be readily controlled.

Figure 9:
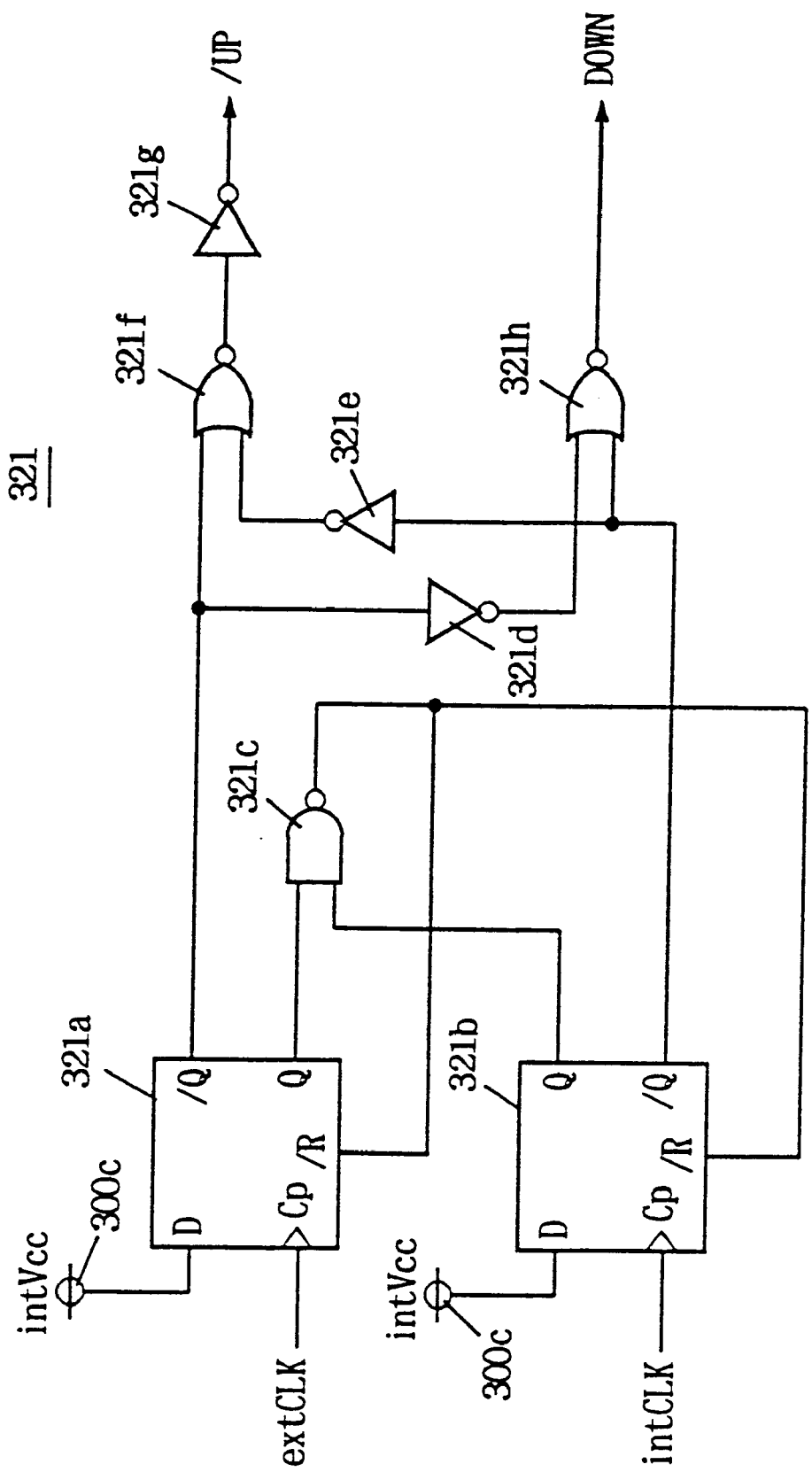
FIG. 9 schematically shows an example of a structure of a phase comparator circuit shown in FIG. 8.

FIG. 9 schematically shows a structure of phase comparing circuit 321 shown in FIG. 8. In FIG. 9, structure of that portion which performs only phase adjustment at a rise of the external clock signal and the internal clock signal, of the phase comparing circuit 321 is shown. A circuit having similar structure as that shown in FIG. 9 is provided which operates in response to the fall of the external clock signal extCLK and the internal clock signal intCLK. Referring to FIG. 9, phase comparing circuit 321 includes a D flipflop 321a having a D input coupled to internal power supply node 300c, a clock input CP receiving external clock signal extCLK, complementary output nodes Q and /Q, and a reset input /R; a D flipflop 312b having a D input coupled to internal power supply node 300c, a clock input CP receiving internal clock signal intCLK, complementary output nodes Q and /Q and a reset input /R; an NAND gate 321c receiving a signal from output Q from D flipflop 321a and an output signal from output Q of D flipflop 312b; an inverter 321d inverting an output signal from output /Q of D flipflop 321a; an inverter 321e inverting a signal from output /Q of D flipflop 321b; an NOR gate 321f receiving a signal from output /Q of D flipflop 321a and an output signal from inverter 312e; an inverter 321g inverting an output signal from NOR gate 321f; and an NOR gate 321h receiving an output signal from output /Q of D flipflop 321d and an output signal from inverter 321a. The control signal /UP is output from inverter 321g, and control signal DOWN is output from NOR gate 321h. The output signal from NAND gate 321c is applied to reset input /R of D flipflop 321a 321b. The operation will be briefly described.

D flipflops 321a and 321b latch signals applied to the D inputs when clock signals extCLK and intCLK applied to the clock inputs CP rise, respectively. Therefore, from the output Q of D flipflops 321a and 321b, a signal which attains to the H level at the rise of clock signals extCLK and intCLK is output. When the signals from outputs Q of D flipflop 321a and 321b both attain to the H level, the output signal of NAND gate 321c attains to the L level, and D flipflops 321a and 321b are both reset. When the phase of external clock signal extCLK is in advance of the phase of internal clock signal intCLK, the output signal from output /Q of D flipflop 321a is kept at the L level from the rise of external clock signal extCLK to the rise of the internal clock signal intCLK. In this state, the NOR gate 321f keeps the output signal at the high level during the period of phase difference, and control signal /UP is set to the L level in response. At this time, the output signal of inverter 321d is set to the H level, and control signal DOWN is set to the L level.

Conversely, if the phase of internal clock signal intCLK advances the phase of external clock signal extCLK, the output /Q of D flipflop 321b is kept at the L level while the phase is different. Since the output /Q of D flipflop 321a is at the H level in this period, the control signal DOWN from NOR gate 321h is set to the H level. Meanwhile, control signal /UP maintains the H level, as the output signal of inverter 321e is set to the H level. By using the structure shown in FIG. 9, in the period corresponding to the phase difference between internal clock signal intCLK and external clock signal extCLK, the control signal DOWN and /UP can be kept active. When the phase difference at the fall of the internal clock signal intCLK and external clock signal extCLK is to be detected, the D flipflops 321a and 321b should be adapted to have a down edge trigger type structure. When the rise and fall of the clock signal should both be detected, these circuits may be provided in parallel, and the output from each NOR gate is received by an OR gate.

The operation of the internal clock signal synchronizing circuit 320 shown in FIG. 8 will be described with reference to FIG. 10, which is a timing diagram.

Figure 10:
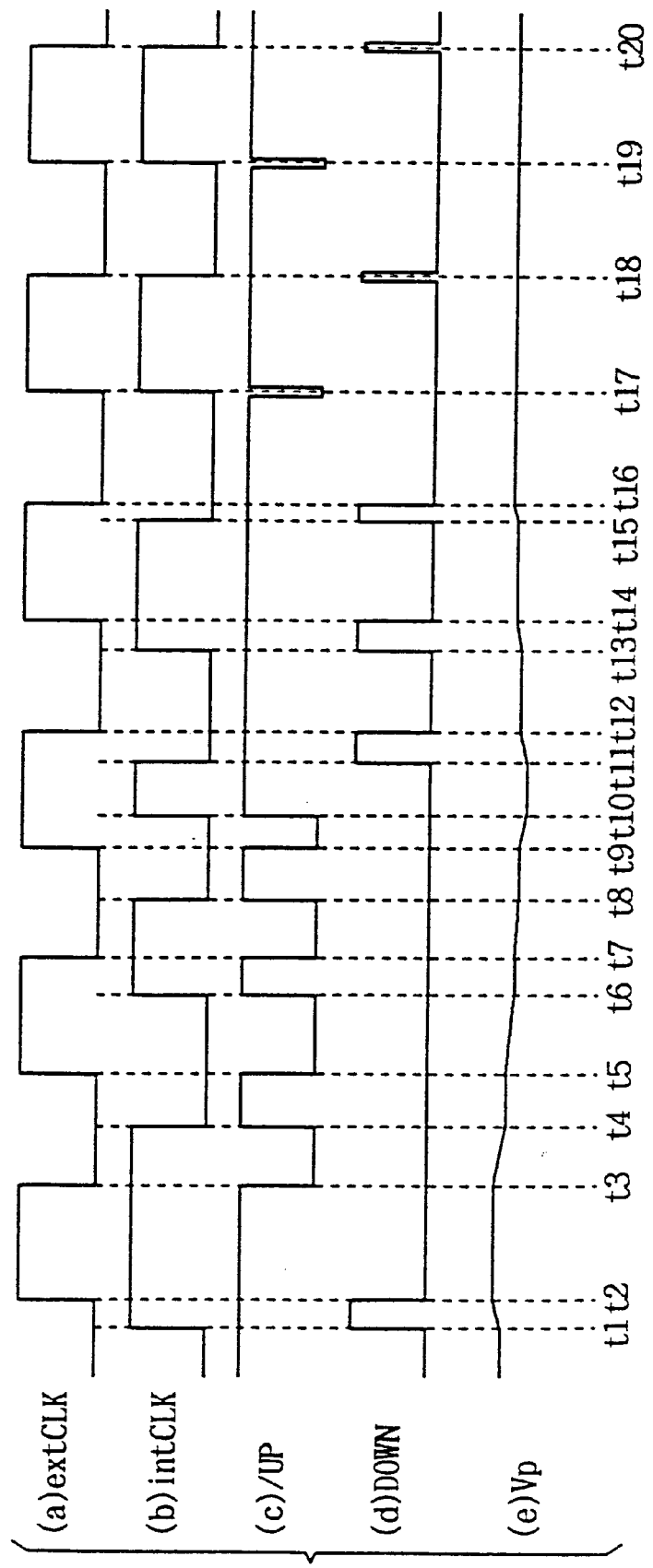
FIG. 10 is a timing chart representing the operation of the internal clock signal synchronizing circuit shown in FIG. 8.

As shown in (a) and (b) of FIG. 10, just before the time point t1, the external clock signal extCLK and internal clock intCLK are both at the same L level. In this state, in phase comparing circuit 321, the D flipflop of FIG. 9 is reset, and hence comparing signal /UP is at the H level as shown in (c) of FIG. 10, and comparing signal DOWN is kept at the L level as shown in (d) of FIG. 10. In this state, MOS transistors 322d and 322f included in charge pump circuit 322 are both non-conductive, and charging/discharging is not performed at charging/discharging node 322a.

As shown in (a) and (b) of FIG. 10, internal clock intCLK rises to the H level at time t1, and external clock extCLK rises to the H level at time t2. Since internal clock signal intCLK is advanced in phase to external clock signal extCLK, phase comparing circuit 321 detects this, maintains the comparing signal /UP at the H level as shown in (c) of FIG. 1.0, and raises the comparing signal DOWN to the H level as shown in (d) of FIG. 10. Consequently, n channel MOS transistor 322f included in charge pump circuit 322 is rendered conductive, charges are sunk from charging/discharging node 322a, and the potential at input potential Vin of operational amplifier 323d lowers. Therefore, in this state, current control circuit 323 raises the potential level of p channel current control signal Vp as shown in (e) of FIG. 10, so that the frequency of internal clock signal intCLK is made smaller.

Referring to (a) of FIG. 10, when external clock signal extCLK rises to the H level at time t2, phase comparing circuit 321 is reset, maintains the comparing signal /UP at the H level at shown in FIG. 10(c) of FIG. 10, and sets the comparing signal DOWN to the L level as shown in FIG. 10(d). Consequently, charge pump circuit 322 stops charging/discharging at charging/discharging node 322a.

Referring to (a) of FIG. 10, external clock signal extCLK falls at time t3. Phase comparing circuit 321 detects the delay in phase of internal clock signal intCLK from external clock signal extCLK, sets the comparing signal /UP to the L level as shown in (c) of FIG. 10 and maintains the comparing signal DOWN at the L level as shown in (d) of FIG. 10. Consequently, p channel MOS transistor 322b included in charge pump circuit 322 is rendered conductive, charges are supplied to charge/discharging node 322a, and hence the potential thereof increases. In response, current control circuit 323 lowers the p channel current signal Vp as shown in FIG. 10 at (e) and increases the frequency of internal clock signal intCLK. Consequently, internal clock signal intCLK falls at time t4 as shown in (b) of FIG. 10. At time t4, external clock signal extCLK and internal clock signal intCLK both attain to the L level, phase comparing circuit 321 is reset again and it sets the comparing signal /UP at the H level as shown in (c) of FIG. 10, the comparing signal DOWN at the L level as shown in (d) of FIG. 10, and stops the charging/discharging operation of charging/discharging node 322a of charge pump circuit 322.

When the external clock signal extCLK rises at time t5 as shown in FIG. 10 at (a), the internal clock signal intCLK is still at the L level at that time, therefore phase comparing circuit 321 detects the delay in phase of internal clock signal intCLK from external clock signal extCLK, and therefore it sets the comparing signal /UP at the L level as shown in (c) of FIG. 10 and maintains the comparing signal DOWN at the L level as shown in (d) of FIG. 10. Again, charges are supplied to the charging/discharging node 322a by charge pump circuit 322 and in response, current control circuit 323 lowers the potential level of p channel current control signal Vp as shown in (e) of FIG. 10, so as to further increase the frequency of internal clock signal intCLK. In response to the increase of the frequency, internal clock signal intCLK rises at time t6 as shown in (b) of FIG. 10. When external clock signal extCLK and internal clock signal intCLK are both set to the H level, phase comparing circuit 321 is reset again and it sets the comparing signal /UP at the H level as shown in (c) of FIG. 10, maintains the comparing signal DOWN as shown in (d) of FIG. 10, and hence stops the charging/ discharging operation of charging/discharging node 322a of charge pump circuit 322.

When external clock signal extCLK falls at time t7, internal clock signal intCLK is still at the H level at this time. Therefore, phase comparing circuit 321 detects the delay in the phase of internal clock signal intCLK from external clock signal extCLK, and it sets the comparing signal /UP to the L level as shown in (c) of FIG. 10, and maintains the comparing signal DOWN at the L level as shown in (d) of FIG. 10. Again, by charge pump circuit 322, charges are supplied to charging/discharging node 322a, the potential level of p channel current control signal Vp from current control circuit 323 lowers as shown in (e) of FIG. 10 in response, and the frequency of internal clock signal intCLK is further increased. When internal clock signal intCLK rises at time t8 as shown in (b) of FIG. 10, phase comparing circuit 321 is reset, it returns the comparing signal /UP to the H level and maintains the comparing signal DOWN at the L level, and therefore charging/discharging operation of the charging/discharging node 322a of charge pump circuit 322 is stopped.

Referring to (a) and (b) of FIG. 10, when internal clock signal intCLK falls at time t11 and then external clock signal extCLK falls to the L level at time t12, phase comparing circuit 321 detects that the internal clock signal intCLK is advanced in phase to external clock signal extCLK, and it maintains the comparing signal /UP at the H level and raises the comparing signal DOWN to the H level. Consequently, charges are sunk from charging/discharging node 322a of charge pump circuit 322, the potential lowers accordingly, the potential level of p channel current control signal Vp from current control circuit 323 increases as shown (e) of FIG. 10, and the frequency of internal clock signal intCLK is made smaller. When external clock signal extCLK falls at time t12, both the external clock signal extCLK and internal clock signal intCLK are set to the L level. Consequently, comparing circuit 321 is reset, comparing signal /UP is set to the H level, comparing signal DOWN is maintained at the L level, and hence charging/discharging operation of charging/discharging node 322a of charge pump circuit 322 is stopped.

When internal clock signal intCLK rises at time t13 and then external clock signal extCLK rises to the H level at time t14, phase comparing circuit 321 detects the phase of internal clock signal intCLK still advancing to external clock signal extCLK, and-hence it maintains the comparing signal /UP at the H level and raises the comparing signal DOWN to the H level. Charges are sunk from charging/ discharging node 322a of charge pump circuit 322, and hence current control circuit 323 increases the potential level of p channel current control signal Vp and makes smaller the frequency of internal clock signal intCLK. When the external clock signal extCLK rises at time t12 as shown in (a) of FIG. 10, phase comparing circuit 321 resets both comparing signals /UP and DOWN as clock signals extCLK and intCLK are at the L level, so that charging/discharging operation of charging/discharging node 322a of charge pump circuit 322 is stopped.

When internal clock signal intCLK rises at time t15 and external clock signal extCLK falls to the L level at time t16, phase comparing circuit 321 detects the phase of internal clock signal intCLK which is still advanced to external clock signal extCLK, and it maintains the comparing signal /UP at the H level and raises the comparing signal DOWN to the H level. Consequently, charges are drawn out from charging/ discharging node 322a in charge pump circuit 322, potential level of p channel current control signal Vp from current control circuit 323 increases, and the frequency of internal clock signal intCLK is further reduced. External clock signal extCLK falls at time t16. External clock signal extCLK and internal clock signal intCLK are both set to the L level, phase comparing circuit 321 is reset again, and it sets the comparing signal /UP to the H level, sets the comparing signal DOWN to the L level, so that the charging/ discharging operation of charging/discharging node 322a of charge pump circuit 322 is stopped.

By repeating the above described operation, as shown at time t7 and thereafter of FIG. 10, when internal clock signal intCLK is synchronized with external clock signal extCLK (locked in), comparing signals /UP and DOWN are hardly activated, and these comparing signals /UP and DOWN are activated only for a while at the time of rise and fall of external clock signal extCLK. Thus, charging/discharging of charging/discharging node 322a by charge pump circuit-322 is hardly carried out, and the potential of p channel current control signal Vp output from current control circuit 323 hardly changes but is kept almost constant.

In this state, when the internal clock signal is locked, comparing signals /UP and DOWN are active and the p channel current control signal Vp changes, the amount of change in the operational current flowing through inverter 324a is very small, because of operational amplifier 323d, and fluctuation in frequency hardly occurs accordingly, so that the jitter of the internal clock signal intCLK at the time of lock in can be surely suppressed.

Further, the change in amount of current of inverter circuit 324a in internal clock signal generating circuit 324 is made relatively small by operational amplifier 323d, and therefore when the phase of the internal clock signal intCLK is advanced, excessive adjustment caused by over driving resulting in delay in phase of internal clock signal intCLK can be prevented. Therefore, the internal clock signal intCLK can be accurately synchronized with external clock signal extCLK at high speed.

By the above described structure, the following advantages can be obtained. Since activation/inactivation of internal circuitry is controlled in accordance with internal clock signal intCLK, φ1 and φ2 from internal clock signal synchronizing circuit 320, these circuits do not operate constantly, and hence current consumption can be reduced.

Further, since internal clock signal intCLK is generated by internal clock signal synchronizing circuit 320 using internal power supply potential intVCC which is more stable than external power supply potential extVCC as operational power supply potential, fluctuation of internal clock signal intCLK can be suppressed, internal clock signal intCLK can be readily locked in external clock signal extCLK, and jitter of the internal clock signal intCLK after locked in can be made smaller.

Since internal power supply potential generating circuit 310b for clocks supplying internal power supply potential intVCC for generating the internal clock is provided separately from the internal power supply potential generating circuit 310a supplying internal power supply potential intVCC to other internal circuits, the internal power supply potential intVCC for generating internal clock signal is made stable and not influenced by the operation of other internal circuits. Therefore it becomes easier to lock internal clock signal intCLK in external clock signal extCLK, and the jitter of the internal clock signal intCLK after locked in is made smaller.

Further, in the internal power supply potential generating circuits 310a and 310b, current supplying circuit 316 supplying current to current supply node 312 is provided to make smaller the undershoot and overshoot of internal power supply potential intVCC with respect to the reference potential Vref, and hence stable internal power supply potential intVCC can be obtained.

Further, in the internal clock signal synchronizing circuit 320, the p channel current control signal Vp is generated through operational amplifier 323b in accordance with the input potential Vin from loop filter 323c and feedback potential Vf, significant change in driving current of internal clock signal generating circuit 324 caused by a small change in input potential Vin can be suppressed by the resistance R for generating the feedback potential, and hence deviation from internal clock signal intCLK from the external clock signal extCLK (jitter) after the internal clock signal intCLK is locked in the external clock signal extCLK can be made smaller.

[Embodiment 2]

The second embodiment of the present invention will be described. In the second embodiment, the structure of the current control circuit 323 for generating current control signals Vp and Vn included in internal clock signal synchronizing circuit 320 provided in SRAM 300 differs from that of the first embodiment. In the following, the same structure as in the first embodiment will be denoted by the same reference characters and description thereof is not repeated. Only the different points will be described.

Figure 11:
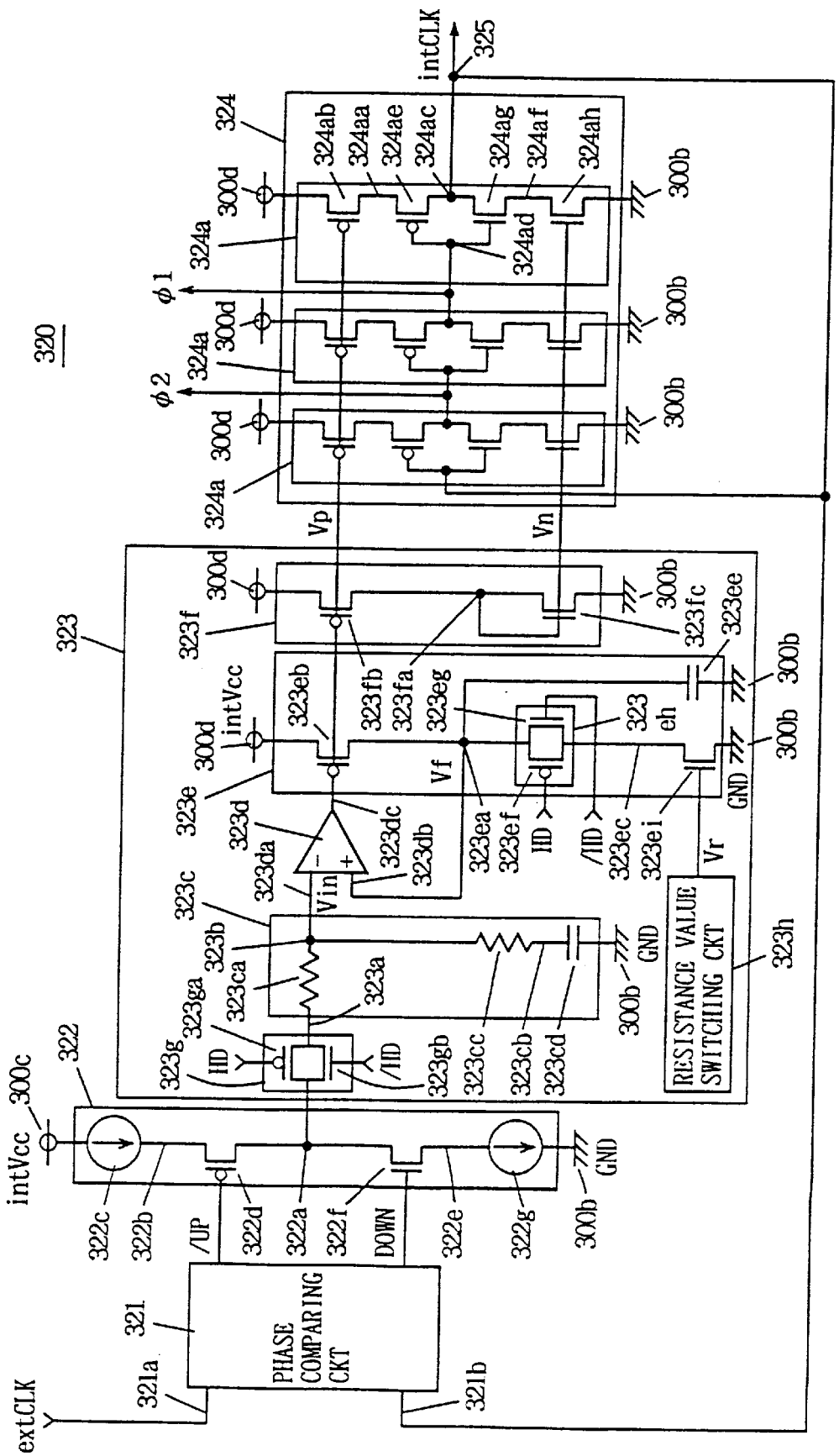
FIG. 11 shows another structure of the internal clock signal synchronizing circuit.

FIG. 11 shows a structure of internal clock signal synchronizing circuit 320 in accordance with the second embodiment of the present invention. Referring to FIG. 11, current control circuit 323 includes a transfer gate 323g connected between charging/discharging node 322a of charge pump circuit 322 and an input node 323a of loop filter 323c. The transfer gate 323g includes a p channel MOS transistor 323ga connected between charging/discharging node 322a and node 323a and receiving at its gate a holding signal HD, and an n channel MOS transistor 323gb connected parallel to p channel MOS transistor 323ga between charging/discharging node 322 and node 323a and receiving at its gate a holding signal/HD. Therefore, the first input node 323da of operational amplifier 323d is connected to charging/discharging node 322a through loop filter 323c and transfer gate 323g.

Hold signals HD and /HD are complementary to each other, which are set to the H level and L level respectively, when supply of the external clock signal extCLK to external clock signal input node 321 is stopped. The structure of the portion for generating hold signals HD and /HD will be described later.

The p channel current control circuit 323e for generating feedback potential Vf in accordance with the output potential of operational amplifier 323d includes a p channel MOS transistor 323eb connected between internal power supply node 300d and node 323ea and receiving at its gate an output potential from operational amplifier 323d; a transfer gate 323eh connected between nodes 323ea and 323ec and selectively set to the conductive state in response to hold signals HD and /HD; and an n channel MOS transistor 323ei connected between node 323ec and ground node 300b and receiving at its gate a switching potential Vr from resistance value switching circuit 323h. Transfer gate 323eh includes a p channel MOS transistor 323ef connected between nodes 323ea and 323ec and receiving at its gate the hold signal HD, and an n channel MOS transistor 323eg connected parallel to p channel MOS transistor 323ef between nodes 323ea and 323ef and receiving at its gate the hold signal /HD.

The structure of resistance value switching circuit 323h will be described later. These circuits increases the switching potential Vr when the external power supply potential extVCC and ground potential GND are applied, and thereafter lowers and maintains the switching potential Vr at a prescribed low potential. Node 323ea is connected to a second input node 323db-of operational amplifier 323d.

Figure 12A:
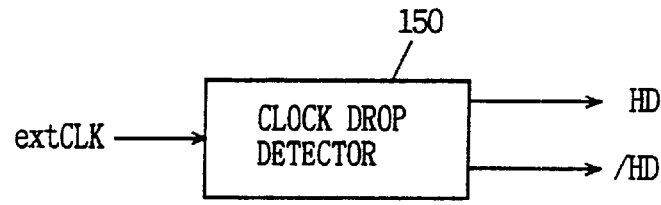
FIG. 12A is a block diagram schematically showing a structure for generating a holding signal shown in FIG. 11.

FIG. 12A is a block diagram schematically showing a circuit structure for generating hold signals HD and /HD. Referring to FIG. 12A, hold signals HD and /HD are generated by a clock drop detector 150 for detecting a lack of external clock signal extCLK. When the external clock signal extCLK is missed or the supply thereof is stopped, clock drop detector 150 sets hold signals HD and /HD to the H level and L level, respectively.

Figure 12B:
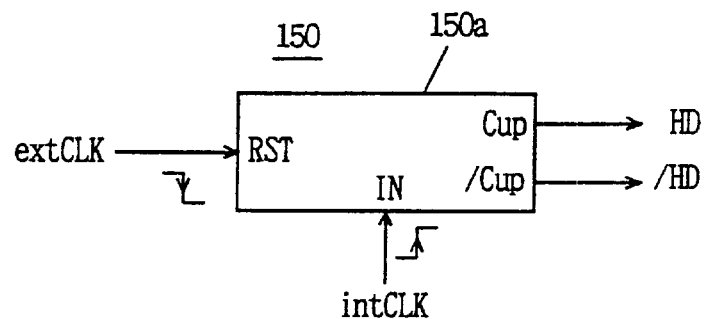
FIG. 12B shows an example of a structure of a clock drop detector shown in FIG. 12A.

FIG. 12B shows a specific structure of clock drop detector 150. Referring to FIG. 12B, clock drop detector 150 includes a counter 150a counting the internal clock signal intCLK. Counter 150a receives at a reset input RST, the external clock signal extCLK, and outputs hold signals HD and /HD from count up outputs Cup and /Cup. When the count of the internal clock signal intCLK reaches a prescribed value, the hold signals HD and /HD from count up output nodes Cup and /Cup are set to the H level and L level, respectively. When external clock signal extCLK is applied to reset input RST, count value of counter 150a is reset. The count value at which counter 150a counts up is set at an appropriate value. When the external clock signal extCLK is not applied continuously for a prescribed count value, that is, in a prescribed number of clock cycle periods of the internal clock signal, hold signals HD and /HD are set to the H level and L level, respectively. Counter 150a increments the count value in response to the rise of internal clock signal intCLK, and resets the count value in response to the fall of the external clock signal intCLK. Therefore, when the external clock signal extCLK is supplied in each cycle of internal clock signal intCLK, the count value of counter 150a is reset to the initial value constantly in the clock cycle. Therefore, stop or lack of the supply of external clock signal extCLK can be detected.

Figure 12C:
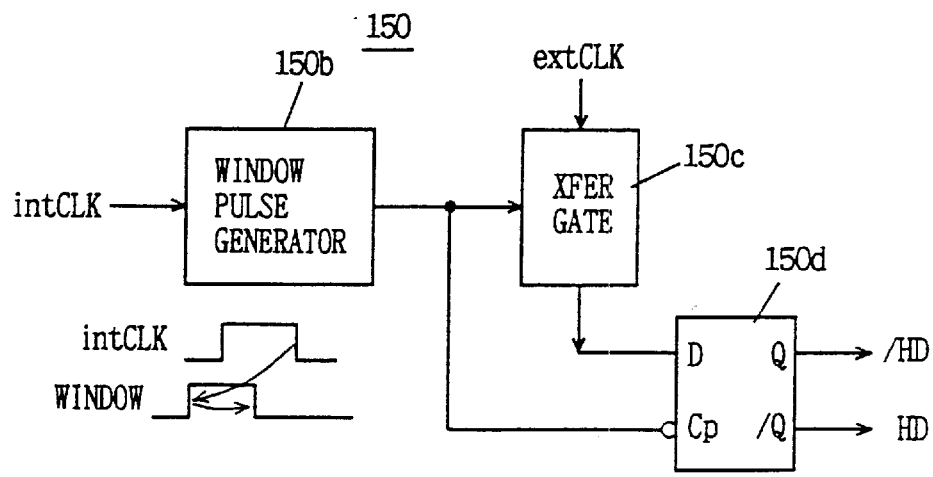
FIG. 12C shows another example of the structure of the clock drop detector shown in FIG. 12A.

FIG. 12C shows another structure of clock drop detector 150. Referring to FIG. 12C, clock drop detector 150 includes a window pulse generator 150b responsive to the internal clock signal intCLK for generating a window pulse having a prescribed time width, a transfer gate 150c responsive to the window pulse from window pulse generator 150b for passing the external clock signal extCLK and a D flipflop 150d for taking and latching a signal transmitted from transfer gate 150c in synchronization with the fall of the window pulse from window pulse generator 150b. Hold signals HD and /HD are output from Q and /Q outputs of D flipflop 150d. Window pulse generator 150d generates the window pulse having a prescribed width after the lapse of a prescribed time period in response to the fall of internal clock signal intCLK. The window pulse has a time width which includes the time point at which internal clock signal intCLK or the external clock extCLK rises. Transfer gate 150c passes the external clock signal extCLK when the window pulse is at the H level, and otherwise maintains the non-conductive state. D flipflop 150d takes the signal applied to the D input at the fall of the window pulse. Therefore, if the external clock signal extCLK is not supplied, the signal applied to the D input is at the L level, the hold signal /HD output from output Q is at L level, and the hold signal HD output from /Q output is at the H level. If the external clock signal extCLK is supplied while the window pulse is at the H level, the D flipflop 150d receives a signal at the H level at its D input at the fall of the window pulse, which is applied to the clock input Cp, and therefore the hold signal /HD from output Q attains to the H level and hold signal HD from output /Q is set to the L level. By using the window pulse, whether or not the external clock signal extCLK is applied in each clock cycle of internal clock signal intCLK can be identified.

Figure 12D:
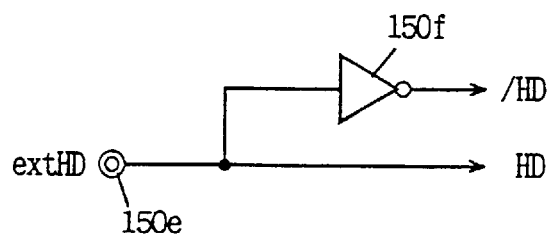
FIG. 12D shows still another structure for generating the holding signal.

FIG. 12D shows a still another structure for generating hold signals HD and /HD. Referring to FIG. 12D, a hold signal extHD is applied externally to an external signal input node 150e. Hold signal /HD is output from an inverter 150f coupled to signal input node 150e. When data processing is not performed in a data processing system such as a portable personal computer, generation of a system clock is stopped so as to reduce current and power consumption. Such operation mode is referred to as a snoop mode or a sleep mode. Therefore, when generation of the external clock signal extCLK is stopped in such a case, the external microprocessor 200 can identify this interruption of clock generation, and hence hold signal extHD can be supplied from such a microprocessor 200 to SRAM 300.

Figure 13A:
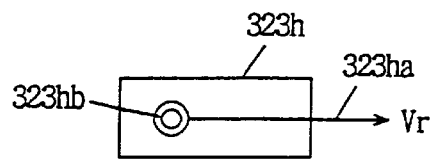
FIG. 13A shows a structure of a resistance value switching circuit shown in FIG. 11.

FIG. 13A shows a specific structure of the resistance value switching circuit 323h shown in FIG. 11. Referring to FIG.

Figure 13B:
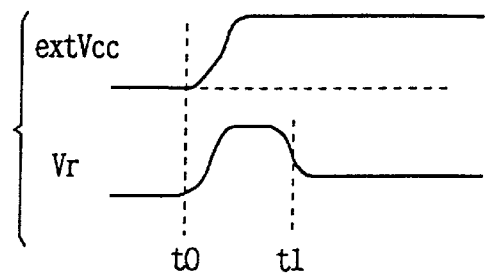
FIG. 13B is a timing chart showing waveform of operation thereof.

13A, resistance value switching circuit 323*h* outputs a resistance value switching potential Vr to output node 323*ha*. The output node 323*ha* is connected to external terminal 323*hb*. As shown in FIG. 13B, at time to, external power supply ext and ground potential GND are turned on and external power supply potential extVCC (for example, 5 V) is applied, the switching potential Vr applied to external terminal 323*hb* is also set to the same potential level as the external power supply potential. When a prescribed time period passes from power on and the internal circuitry is stabilized, the resistance value switching potential Vr applied to external terminal 323*hb* is set to a potential (for example, 1V) lower than the external power supply potential extVCC. Therefore, referring to FIG. 11, since the resistance value switching potential Vr is applied to the gate of n channel MOS transistor 323*ei*, the resistance value of MOS transistor 323*ei* is minimized when the power is turned on, and when the stable state is achieved, the resistance value is increased.

Figure 14A:
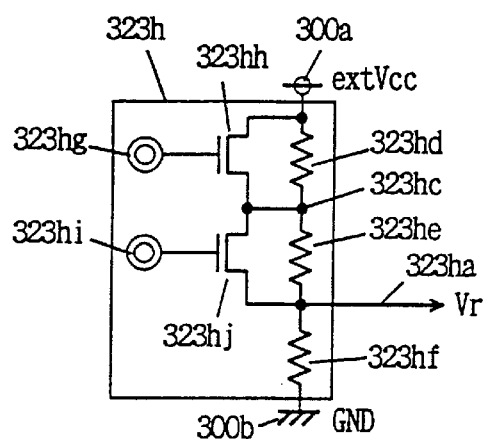
FIG. 14A shows another structure of the resistance value switching circuit shown in FIG. 11.
Figure 14B:
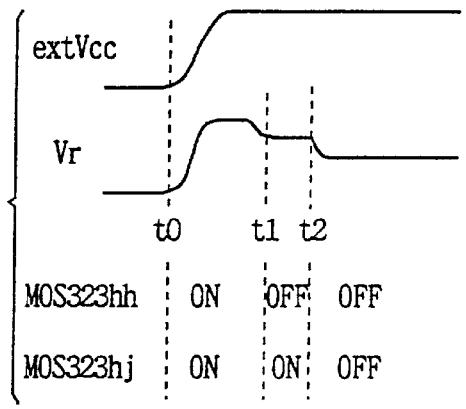
FIG. 14B shows timing of operation thereof.

FIG. 14A shows another specific structure of resistance value switching circuit 323*h* shown in FIG. 11, and FIG. 14B shows the operational waveform thereof. Referring to FIG. 14A, resistance value switching circuit 323*h* includes a resistance element 323*hd* connected between external power supply node 300*a* and node 323*hc*, a resistance element 323*he* connected between node 323*hc* and output node 323*ha*, a resistance element 323*hf* connected between output node 323*ha* and ground node 300*b*, an n channel MOS transistor 323*hh* connected parallel to resistance element 323*hd* between external power supply node 300*b* and node 323*hc* and having its gate connected to external terminal 323*hg*, and an n channel MOS transistor 323*hj* connected between node 323*hc* and output node 323*ha* parallel to resistance element 323*he* and having its gate connected to external terminal 323*hi*.

As in FIG. 14B, when power is turned on at time t0, external power supply potential extVCC is applied to external terminals 323*hg* and 323*hi* at this time. In response, MOS transistors 323*hh* and 323*hj* are both rendered conductive. The resistance value of resistance element 323*hf* is made sufficient larger than the on resistance of MOS transistor 323*hh* and 323*hj*. Therefore, switching potential Vr from output node 323*ha* is set to the level of the external power supply potential extVcc, as the resistance elements 323*hd* and 323*he* are short-circuited by the MOS transistors 323*hh* and 323*hj*. After the lapse of a prescribed time period, external power supply potential extVCC is applied to one of the external terminals 323*hg* and 323*hi* at time t1, and the ground potential GND is applied to the other. In FIG. 14B, the ground potential GND is shown to be applied to external terminal 323*hg*. In this state, one of the MOS transistors 323*hh* and 323*hj* is rendered non-conductive. Therefore, when resistance elements 323*hd*, 323*he* and 323*hf* all have the same resistance values, the resistance value between external power supply node 300*a* and output node 300*ha* is made equal to the resistance value between output node 323*ha* and ground node 300*b*, and switching potential Vr is set to the potential level of approximately extVCC/2.

After the lapse of another time period at time t2, the ground potential GND is supplied to external terminals 323*hg* and 323*hi*, and MOS transistors 323*hh* and 323*hj* are rendered non-conductive. In this state, resistance elements 323*hd*, 323*he* and 323*f* are connected in series between external power supply node 300*a* and ground 300*b*, and since these resistance elements have the same resistance value, switching potential Vr is set to the potential level of extVCC/3.

Figure 15A:
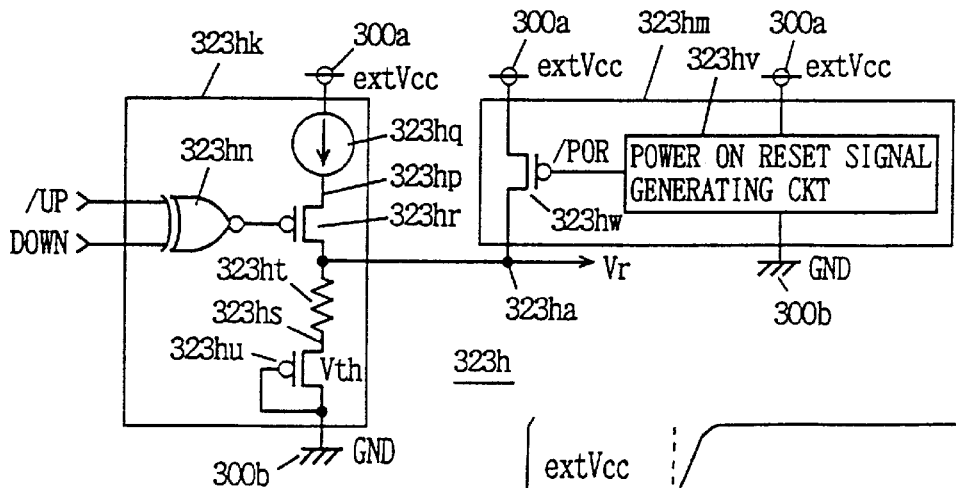
FIG. 15A shows a still further structure of the resistance value switching circuit shown in FIG. 11.
Figure 15B:
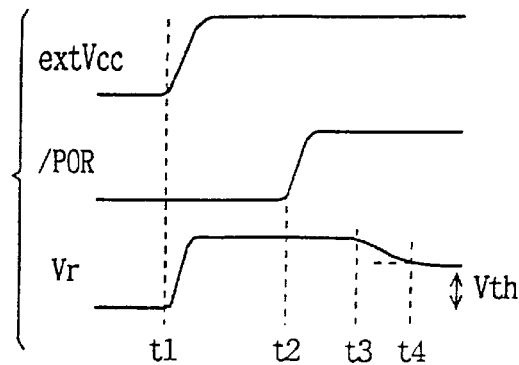
FIG. 15B shows the timing of operation thereof.

FIG. 15A shows still another specific circuit structure of resistance value switching circuit 323*h* shown in FIG. 11 and FIG. 15B shows the operational waveform thereof. Referring to FIG. 15A, resistance value switching circuit 323*h* includes a resistance control circuit 323*hk* for adjusting potential level of switching potential Vr in accordance with logical coincidence/incoincidence of comparing signals /UP and DOWN from phase comparing circuit 321, and a start up circuit 323*hm* for setting the resistance switching potential Vr to the external power supply potential extVCC for a prescribed time period at the time of power on. When the internal clock signal intCLK is not locked in external clock signal extCLK and therefore the time in which comparing signals /UP and DOWN are kept at the active state of L level and H level respectively is made long, the resistance control circuit 323*hk* sets the resistance value switching potential Vr output from output node 323*ha* approximately to the external power supply potential extVCC, and as the internal clock signal intCLK comes to be locked in external clock signal extCLK and the time period in which comparing signals /UP and DOWN are active becomes shorter, the circuit lowers the resistance value switching potential Vr and finally, it sets the resistance value switching potential to about 1 V. The resistance control circuit 323*hk* includes an EXOR circuit 323*hn* receiving comparing signals /UP and DOWN for determining coincidence/incoincidence therebetween, a constant current circuit 323*hq* connected between external power supply node 300*a* and node 323*hp*, a p channel MOS transistor 323*hr* connected between node 323*hv* and output node 323*ha* and receiving at its gate the output signal from NOR circuit 323*hn*, a resistance element 323*ht* connected between output node 323*ha* and node 323*hs*, and a p channel MOS transistor 323*hu* connected between node 323*hs* and ground node 300*b* and having its gate connected to ground node 300*b*. The resistance value of resistance element 323*ht* is made sufficiently larger than the on resistance of p channel MOS transistor 323*hu*. Therefore, MOS transistor 323*hu* operates in a diode mode, and the potential at node 323*hs* is maintained at the level of the absolute value of the threshold voltage Vth.

Start up circuit 323*hm* includes a power on reset signal generating circuit 323*hv* for outputting a power on reset signal /POR which is kept at the L level for a prescribed time period at a rise (power on) of the external power supply potential extVCC and thereafter set to the H level, and a p channel start up transistor 323*hw* connected between external power supply node 300*a* and output node 323*ha* and having its gate connected to receive the power on reset signal /POR.

When power is turned on and the potential level of external power supply potential extVCC rises at time t1, power on reset signal /POR is set to and kept at the L level for a prescribed time period, that is, up to the time point t2. During this period, p channel start up transistor 323*hw* is kept conductive, electrically short-circuits the external power supply node 300*a* and output node 323*ha*, and sets the switching potential Vr at the potential level of external power supply potential extVCC. When power on reset signal /POR rises to the H level at time t2, transistor 323*hw* is rendered non-conductive.

Constant current circuit 323*hq* has similar structure as constant current circuit 323*c* included in charge pump circuit 322, and at this time point, it is set to an operative state and supplies a constant current. At time t2, if there is large difference in phase/frequency between internal clock signal intCLK and external clock signal extCLK, the period in which comparing signal /UP and DOWN are kept active becomes longer. In that case, the period in which the output signal from EXOR circuit 323*hn* is at the L level becomes longer, and accordingly, the period in which p channel MOS transistor 323*hr* is conductive becomes longer. Therefore, in this period, the switching potential Vr output from output node 323*ha* is maintained at the potential level of external power supply potential extVCC.

At time t3, when the difference in phase/frequency between internal clock signal intCLK and external clock signal extCLK becomes smaller, the period in which the output signal from EXNOR circuit 323*hn* is kept at the L level becomes shorter. Accordingly, the period in which p channel MOS transistor 323*hr* is kept conductive becomes shorter, and the period of charging the output node 323*ha* becomes shorter. Therefore, the period of discharging through resistance element 323*ht* becomes longer. Therefore, the potential level of the switching potential Vr output from output node 323*ha* gradually lowers. At time t4, when the internal clock signal intCLK is locked in the external clock signal extCLK, the comparing signals /UP and DOWN are maintained almost inactive state, and hence p channel MOS transistor 323*hr* is maintained non-conductive almost in the entire period. Therefore, output node 323*ha* is discharged through resistance element 323*hd* and MOS transistor 323*hu* and finally, the switching potential Vr is maintained at the potential level of the absolute value Vth of the threshold voltage of MOS transistor 323*hu*.

As described above, when the external power supply potential extVCC and the ground potential GND are turned on, the switching potential Vr is set to the potential level of approximately the external power supply potential extVCC by the start up circuit 323*hm*. Thereafter, as the time passes, the potential level of switching potential Vr lowers by the function of resistance control circuit 323*hk*. Therefore, when the resistance value switching circuit 323*h* shown in FIG. 15A is used, the resistance value of n channel MOS transistor 323*ei* included in the power control circuit is the smallest at the time of power on, and the resistance value is increased at the time of lock in.

As described above, since the resistance value of resistance transistor 323*ei* shown in FIG. 11 is minimized at the time of power supply and it is gradually increased thereafter, when there is a large difference in phase and frequency between internal clock signal intCLK and external clock signal extCLK at the time of power on, the current control signals Vp and Vn fluctuate significantly with respect to the fluctuation in input potential Vin input to the first input node 323*da* of operational amplifier 323*d* shown in FIG. 11, and accordingly, driving current of the ring oscillator changes significantly. Therefore, internal clock signal intCLK is quickly pulled near to the external clock signal extCLK. Meanwhile, when the internal clock signal intCLK is about to be locked in clock signal extCLK, the resistance value of resistance transistor 323*ei* has been increased, the change in driving current of the ring oscillator relative to the change in control signals Vp and Vn is made smaller, and internal clock signal intCLK changes relatively slowly. Therefore, it becomes easier to lock the internal clock signal intCLK in the external clock signal extCLK, and the jitter of the internal clock signal intCLK after lock in can be made smaller.

Further, when supply of the external clock signal extCLK to external clock signal input node 321*a* is stopped, hold signal HD is set to the H level and hold signal /HD is set to the L level. In response, the transfer gate 323*j* provided at the loop filter input portion is rendered non-conductive, and the output potential Vin of loop filter 323*c* is maintained for a prescribed time period. Similarly, in power supply control circuit 323*e*, transfer gate 323*eh* is rendered non-conductive, and the feedback potential Vf is kept at a constant potential level for a prescribed time period by the capacitor 323*ee*. Since input potential Vin and feedback potential Vf are held for a prescribed time period, the potential levels of current control signals Vp and Vn are held accordingly, and hence internal clock signal intCLK maintains the state it assume when the supply of the external clock signal extCLK is stopped, for this time period. Therefore, even when supply of the external clock signal extCLK is temporarily interrupted, the internal clock signal intCLK is output stably. When supply of the external clock signal extCLK is resumed, hold signals HD and /HD are set to the L level and H level, respectively, and transfer gates 323*g* and 323*eh* are rendered conductive. Consequently, the phase and frequency of the internal clock signal intCLK are adjusted in accordance with the phase/frequency of the external clock signal extCLK. In this case, the external clock signal extCLK is simply interrupted or disconnected temporarily and hence the phase and frequency of the newly applied external clock signal extCLK are not much different from those before interruption. Therefore, internal clock signal intCLK can be readily locked in the external clock signal extCLK.

[Embodiment 3]

Figure 16:
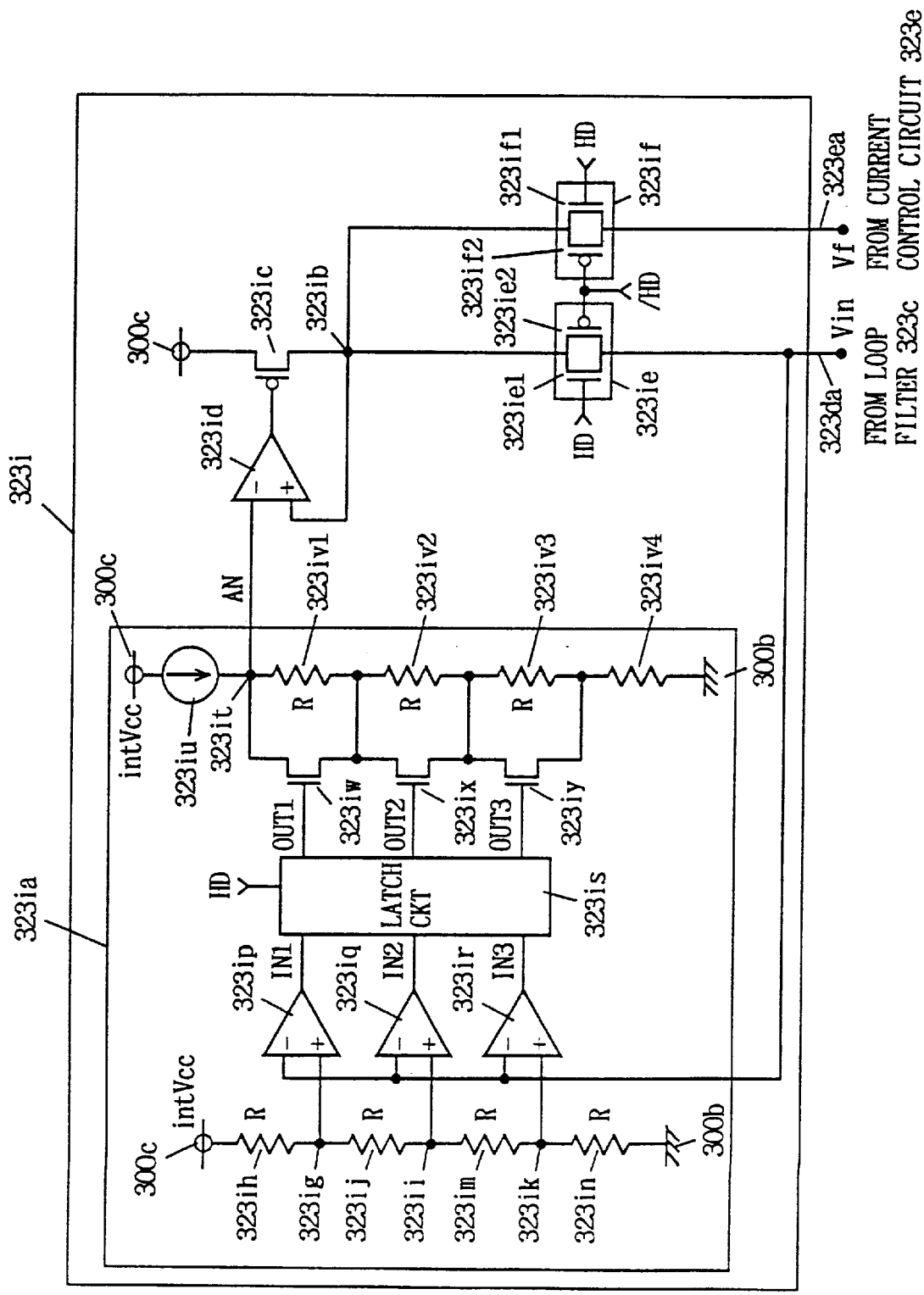
FIG. 16 shows a structure of a potential holding circuit added to the current control circuit shown in FIG. 11.

FIG. 16 shows a structure of a main portion of an SRAM in accordance with the third embodiment of the present invention. In the embodiment shown in FIG. 16, in addition to the structure shown in FIG. 11, a potential holding circuit 323*i* for holding input potentials Vin and Vf of operational amplifier 323*d* is provided. Except this point, the structure is the same as that of Embodiment 2, and description thereof is not repeated.

Referring to FIG. 16, potential holding circuit 323i includes a potential storing circuit 323*ia* responsive to the hold signal HD for storing an input potential Vin on node 323*da*; a p channel MOS transistor 323*ic* connected between internal power supply node 300*c* and node 323*ib*; an operational amplifier 323*id* having an input receiving an analog signal AN from potential storing circuit 323*ia* and a potential at node 323*ib* and an output connected to the gate of p channel MOS transistor 323*ic*; a transfer gate 323*ie*1 connected between nodes 323*ib* and 323*da* and selectively set to the conductive state in response to hold signals HD and /HD; and a transfer gate 323*if* connected between nodes 323*ib* and 323*ea* and selectively set to the conductive state in response to the hold signals HD and /HD. When hold signal HD changes from the L level to the H level and indicates interruption of the supply of external clock signal extCLK, potential storing circuit 323*ia* converts the input potential Vin on node 323*da* to a digital signal and stores it, and applies the stored digital signal as an analog signal AN. Transfer gates 323*e* and 323*if* are rendered conductive when the hold signal HD changes from the L level to the H level, indicating interruption of the external clock signal extCLK.

The potential storing circuit 323*ia* includes a resistance element 323*ih* connected between internal power supply node 300*c* and node 323*ig* and having a resistance value R; a resistance element 323*ij* connected between nodes 323*ig* and 323*ii* and having resistance value R; a resistance element 323*im* connected between nodes 323*ii* and 323*ik* and having resistance value R; a resistance element 323*in* connected between node 323*ik* and ground node 300*b*; a differential amplifying circuit 323*ip* having a negative input receiving input potential Vin and a positive input receiving the potential (3·intVCC/4) on node 323*ig*, for outputting a signal IN1 at the H level when the input signal Vin is lower than node 323*ig* and otherwise outputting the output signal IN1 at the L level; a differential amplifying circuit 323*iq* having a negative input receiving input potential Vin and a positive input receiving the potential on node 323*ii* for outputting a signal IN2 which is at the H level when the input potential Vin is lower than the potential at node 323*ii*; a differential amplifying circuit 323*ir* having a negative input receiving the input potential Vin and a positive input receiving the potential (intVCC/4) on node 323*ik*, for outputting a signal IN3 which attains to the H level when the input potential Vin is lower than the potential on node 323*ik*; and a latch circuit 323*is* for latching output signals IN1, IN2 and IN3 from differential amplifying circuits 323*ip*, 323*iq* and 323*ir* in response to transition of data holding signal HD from the L level to the H level, and outputting these as output signals OUT1, OUT2 and OUT3. The output signals IN1, IN2 and IN3 from differential amplifying circuits 323*ip*, 323*iq* and 323*ir* change in digital manner. The latch circuit 323*is* is formed, for example, by a D type flipflop.

Potential storing circuit 323*ia* further includes a constant current circuit 323*iu* connected between internal power supply node 300*c* and node 323*it* to which analog signal AN is output, for supplying a constant current i (=intVCC/(4·R)); resistance elements 323*iv*1, 323*iv*2, 323*iv*3 and 323*iv*4 connected in series with each other between node 323*it* and ground node 300*b* and each having the resistance value R; an n channel MOS transistor 323*iw* connected at both ends of resistance element 323*iv*1 and receiving at its gate the signal OUT1 from latch circuit 323*if*; an n channel MOS transistor 323*ix* connected parallel to resistance element 323*iv*2 and receiving at its gate the signal OUT2 from latch circuit 323*is*; and an n channel MOS transistor 323*iy* connected parallel to resistance element 323*iv*3 and receiving at its gate the signal OUT3 from latch circuit 323*is*.

Transfer gate 323*ie* includes an n channel MOS transistor 323*ie*1 connected between node 323*ib* and input node 323*da* (or an output node 323*b* of loop filter 323*c*) and receiving at its gate the holding signal HD and a p channel MOS transistor 323*ie*2 connected parallel to n channel MOS transistor 323*ie*1 between node 323*ib* and input node 323*da* and receiving at its gate the holding signal /HD. Transfer gate 323*if* includes an n channel MOS transistor 323*if*1 connected between nodes 323*ib* and 323*ea* (an input node of operational amplifier 323*d*) and receiving at its gate the holding signal HD, and a p channel MOS transistor 323*if*2 connected parallel to n channel MOS transistor 323*if*1 between nodes 323*ib* and 323*ea* and receiving at its gate the holding signal /HD. The operation will be described.

In potential storing circuit 323*ia*, if the input potential Vin from node 323*da* is within a range of ground potential and the potential intVCC/4 at node 323*it*, the signals IN1, IN2 and IN3 output from differential amplifying circuits 323*ip*, 323*iq* and 323*ir* are set to the H level, H level and H level, respectively. When the input potential Vin is within the range of from the potential (intVCC/4) on node 323*ik* to the potential (intVCC/2) on node 323*ii*, the signals IN1, IN2 and IN3 output from differential amplifying circuits 323*ib*, 323*iq* and 323*ir* are set to the H level, H level and L level, respectively. When the input potential Vin is within the range from the potential (intVCC/2) on node 323*ii* to the potential (3·intVCC/4) on node 323*ig*, the signals IN1, IN2 and IN3 output from differential amplifying circuits 323*ip*, 323*iq* and 323*ir* are set to H level, L level, and L level, respectively. When the internal potential Vin is within the range from the potential (3·intVCC/4) on node 323*ig* to the internal power supply potential intVCC, the signals IN1, IN2 and IN3 output from differential amplifying circuit 323*ip*, 323*iq* and 323*ir* are set to the L level, L level and L level, respectively.

When the supply of the external clock signal extCLK is interrupted and the hold signal HD is set to the H level, latch circuit 323*is* latches these input signals IN1 to IN3, and outputs these as output signals OUT1 to OUT3. When the signals OUT1, OUT2 and OUT3 are at the H level, H level and H level, respectively, n channel MOS transistors 323*iw*, 323*ix* and 323*iy* are all rendered conductive, and hence the combined resistance value between node 323*it* and ground node 300*b* is set approximately R. The current I supplied by constant current circuit 323*iu* is i=intVCC/(4·R), and hence the analog signal AN output from node 323*it* will be AN=R·i=intVCC/4.

When the signals OUT1, OUT2 and OUT3 are at the H level, H level, and L level, respectively, n channel MOS transistors 323*iw* and 323*ix* are rendered conductive and MOS transistor 323*iy* is rendered non-conductive. Therefore, combined resistance value between node 323*it* and ground node 300*b* is set approximately 2·R. In this case, the analog signal AN output from node 323*it* will be AN=2·R·i=intVCC/2.

When the signals OUT1, OUT2 and OUT3 are at the H level, L level and L level, respectively, n channel MOS transistor 323*iw* is rendered conductive, and n channel MOS transistors 323*ix* and 323*iy* are both rendered nonconductive. Therefore, combined resistance value between node 323*it* and ground node 300*b* is approximately 3·R. Therefore, the analog signal AN output from node 323*it* will be AN=3·R·i=3·intVCC/4.

When the signals OUT1, OUT2 and OUT3 are at the L level, L level and L level, respectively, n channel MOS transistors 323*iw*, 323*is* and 323*iy* are all rendered nonconductive, and therefore combined resistance value between node 323*it* and ground node 300*b* is set approximately 4·R. Therefore, the analog signal AN output from node 323*it* will be AN=4·R·i=intVCC.

Namely, the potential storing circuit 323*ia* converts the input potential Vin to a digital signal with a resolution of four steps and stores the same, and outputs the stored digital signal after converting it to an analog signal AN by a circuit constituted by constant current circuit 323*if* and resistance elements 323*iv*1 to 323*iv*4.

When the potential on node 323*ib* is higher than the analog signal AN, operational amplifier 323*ie* renders p channel MOS transistor 323*ic* non-conductive, and if the potential on node 323*ib* is lower than the analog signal AN, renders p channel MOS transistor 323*hc* conductive. Therefore, the potential on node 323*iv* is made equal to the potential of analog signal AN. Transfer gates 323*ie* and 323*if* are rendered conductive when the supply of the external clock signal extCLK is stopped. Therefore, as the node 323*iv* is electrically connected to nodes 323*da* and 323*ea*, when the supply of the external clock signal extCLK is stopped, the input potential Vin on node 323*da* and feedback potential Vf on node 323*ea* are made equal to and held at the potential of analog signal AN.

Since the input potential Vin and feedback potential Vf are held by potential holding circuit 323*i* and current control signals Vp and Vn are held accordingly, internal clock signal intCLK maintains the state it assumed when the supply of the external clock signal extCLK was stopped. Therefore, when the supply of the external clock signal extCLK is resumed, the internal clock signal intCLK can be quickly locked in the external clock signal extCLK.

Especially, as potential holding circuit 323*i* is used, the potential level of the input potential Vin can be held for a long period of time by latch circuit 323*is*, unlike the structure of FIG. 11, and therefore, the internal clock signal intCLK can be supplied stably even when the external clock signal extCLK is stopped for a long period of time.

[Embodiment 4]

Figure 17:
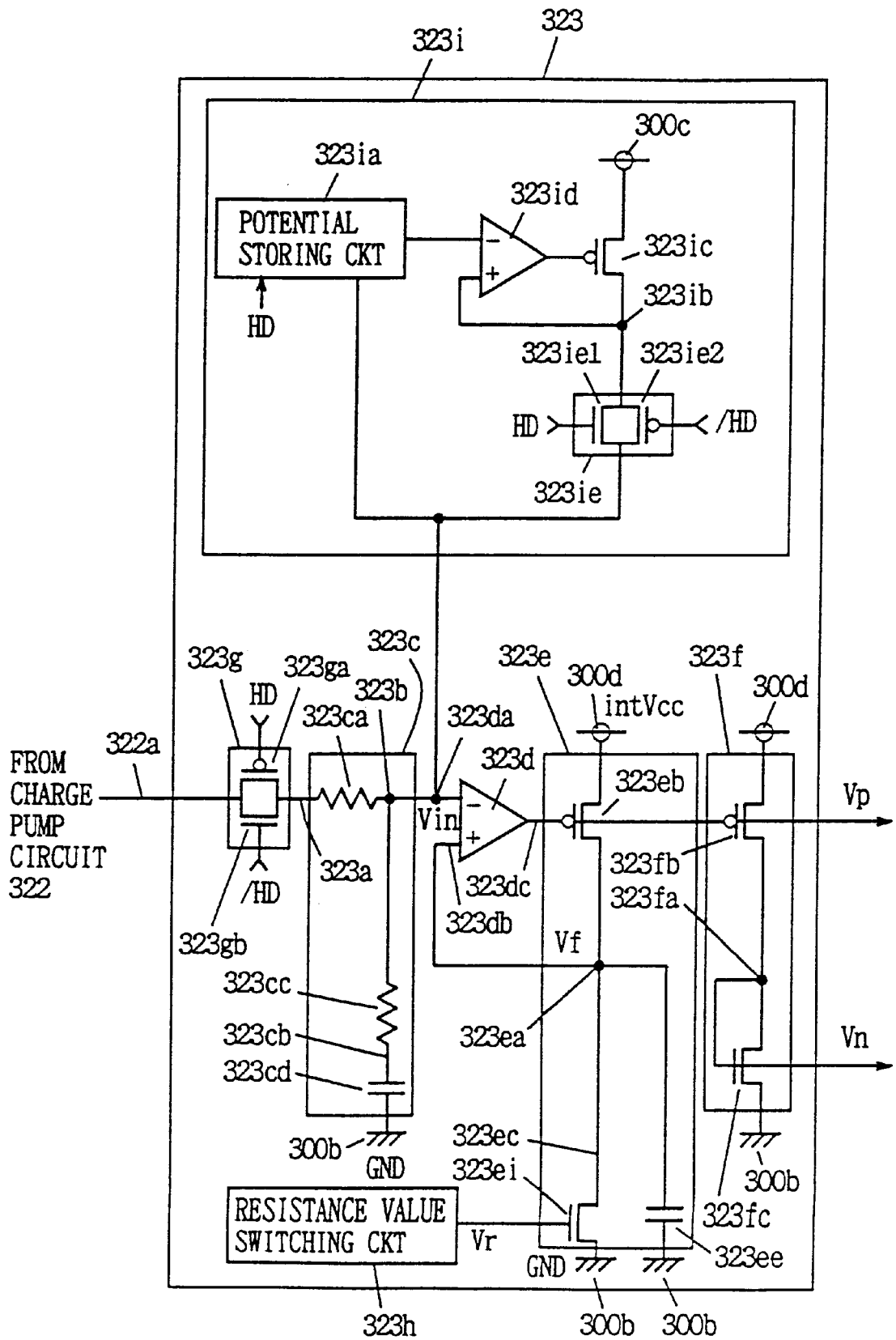
FIG. 17 shows another structure of the potential holding circuit.

FIG. 17 shows a structure of a main portion of a semiconductor memory device in accordance with the fourth embodiment of the present invention. FIG. 17 shows only the structure of current control circuit 323. The structure of other portions is the same as the third embodiment above, and therefore components corresponding to those of Embodiments 1 to 3 are denoted by the same reference characters and detailed description thereof is not repeated.

In the structure shown in FIG. 17, potential holding circuit 323*i* holds only the input potential Vin of operational amplifier 323*d* and adjusts this potential. Therefore, in potential holding circuit 323*i*, only a transfer gate 323*ie* is provided between nodes 323*iv* and 323*da*. The transfer gate 323*if* for feedback potential Vf shown in FIG. 16 is not provided.

Different from the structure shown in FIG. 11, in p channel current control circuit 323*e*, transfer gate 323*eh* is not provided between node 323*ea* and MOS transistor ei.

In the structure shown in FIG. 17, when application of external clock signal extCLK to the external clock signal input node 321*a* is stopped, the input potential Vin on the first input node 323*da* of operational amplifier 323*d* is held by potential holding circuit 323*i*. What is held by the potential holding circuit 323*i* is only the input potential Vif and not the potential of feedback potential Vf. However, if the input potential Vin is held by potential holding circuit 323*i*, operational amplifier 323*d* operates to make equal the input potential Vin and the feedback potential Vf from node 323*ea* with each other. Therefore, even if the feedback potential Vf on node 323*ea* is not held by the potential holding circuit 323*i*, the feedback potential Vf can be held at the state it assumed when the supply of the external clock signal extCLK is stopped, by operational amplifier 323*e*, and hence internal clock signal intCLK is surely maintained at the state it assumed when the supply of the external clock signal extCLK is stopped.

In accordance with the structure shown in FIG. 17, the transfer gate 323*if* in potential holding circuit 323*i* and transfer gate 323*gh* in p channel current control circuit 323*e* become unnecessary, and therefore as compared with the structure shown in FIG. 16, layout area of the internal clock signal synchronizing circuit 320 can be reduced.

[Embodiment 5]

Figure 18:
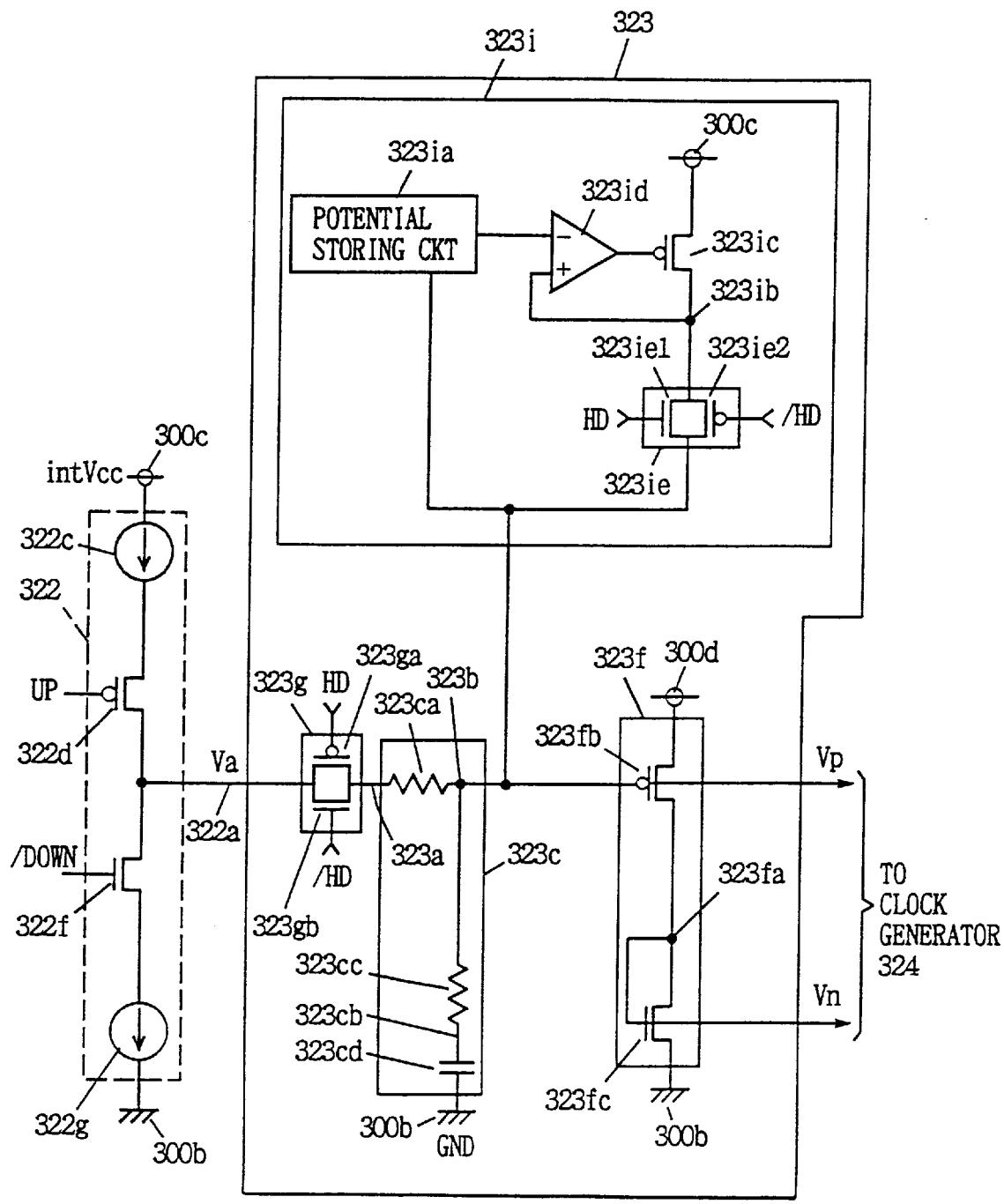
FIG. 18 shows a still further structure of the potential holding circuit.

FIG. 18 shows a structure of a main portion of a semiconductor memory device in accordance with a fifth embodiment of the present invention. FIG. 18 shows the structure of the current control circuit 323 only, and other structures are the same as those of the first to fourth embodiments above. In the structure of current control circuit 323 shown in FIG. 18, operational amplifier 323*d* and p channel current control circuit 323*e* are not provided. In charge pump circuit 322, p channel MOS transistor 322*d* receives an inverted signal UP of the comparing signal /UP at its gate, and n channel MOS transistor 322*f* receives an inverted signal /DOWN of comparing signal DOWN at its gate. Other structures are the same as those of the Embodiment 4 above, and corresponding portions are denoted by the same reference characters.

In the structure shown in FIG. 18, when the phase/frequency of internal clock signal intCLK advances that of external clock signal extCLK, comparing signal UP is set to the H level, and comparing signal /DOWN is set to the H level. In this state, the potential Va at node 322*a* lowers as it is discharged by MOS transistor 322*f*, and accordingly, the potential level of p channel current control signal Vp also lowers. Conversely, if the phase/frequency of internal clock signal intCLK is delayed, comparing signal UP is set to the L level and comparing signal /DOWN is set to the L level. In this state, the potential VA on node 322*a* is charged through MOS transistor 322*d*, and hence the potential increases. Accordingly, the potential level of p channel current control signal Vp also increases, the phase of internal clock signal intCLK is delayed, and frequency is made smaller accordingly. When the internal clock signal intCLK is synchronized in phase with external clock signal extCLK, comparing signal UP is set to the H level and comparing signal /DOWN is set to the L level, and potential Va does not change.

When the supply of the external clock signal extCLK is stopped, transfer gate 323*g* is rendered non-conductive and transfer gate 323*ie* is rendered conductive. Consequently, the potential level of p channel current control signal Vp output from the output node 323*b* of loop filter 323*c* is held by potential holding circuit 32*i*, and internal clock signal intCLK is maintained at the state it assumed when the supply of the external clock signal extCLK was stopped. When the supply of the external clock signal extCLK is resumed, transfer gates 323*g* is rendered conductive and transfer gate 323*ie* is rendered non-conductive. The potential level of p channel current control signal Vp changes from the state it assumes when the phase is synchronized, in accordance with the output potential Va from charge pump circuit 322. Therefore, when the supply of the clock is resumed, the internal clock signal intCLK can be readily locked in the external clock signal extCLK.

[Embodiment 6]

Figure 19:
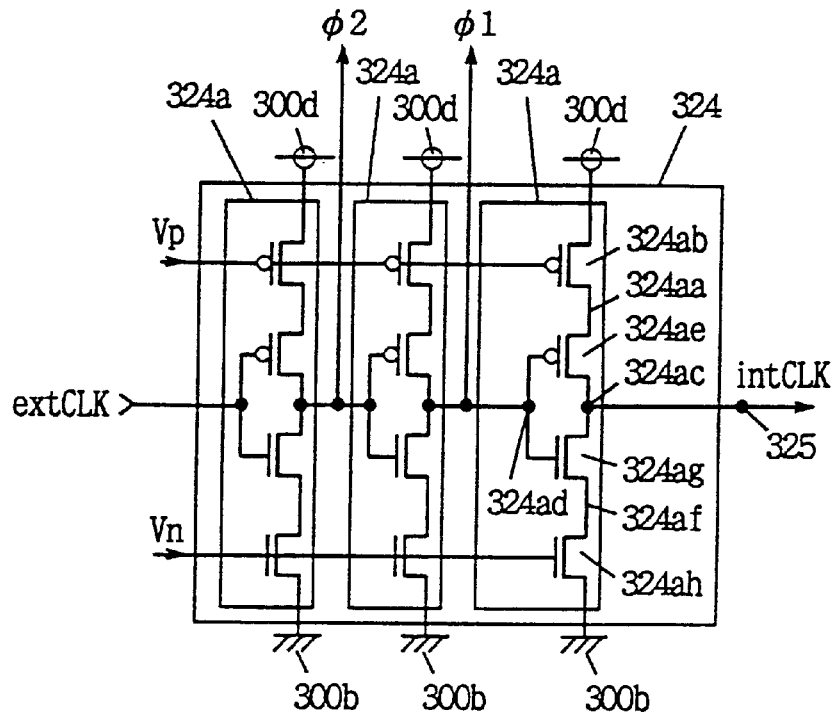
FIG. 19 shows another structure of the internal clock signal generating circuit.

FIG. 19 shows a structure of a main portion of a semiconductor memory device in accordance with a sixth embodiment of the present invention. In FIG. 19, only the structure of internal clock signal generating circuit 324 included in internal clock signal synchronizing circuit 320 is shown. Other structures are the same as those of any of the first to fifth embodiments. In the structure shown in FIG. 19, a DLL (Delay Locked Loop) circuit is used in place of PLL circuit, to generate internal clock signal intCLK. More specifically, as shown in FIG. 19, instead of the ring oscillator included in internal clock generating circuit 324, a delay circuit receiving external clock signal extCLK is used, as shown in FIG. 19. The internal clock signal generating circuit 324 includes three stages of inverters 324 which receives external clock signal extCLK, delays and inverts it to generate the internal clock signal intCLK. The structure of inverter 324*a* is the same as that shown in FIG. 8, and corresponding portions are denoted by the same reference characters.

The operation of the structure shown in FIG. 19 will be described with reference to FIG. 20 which is a diagram of waveforms thereof.

Figure 20:
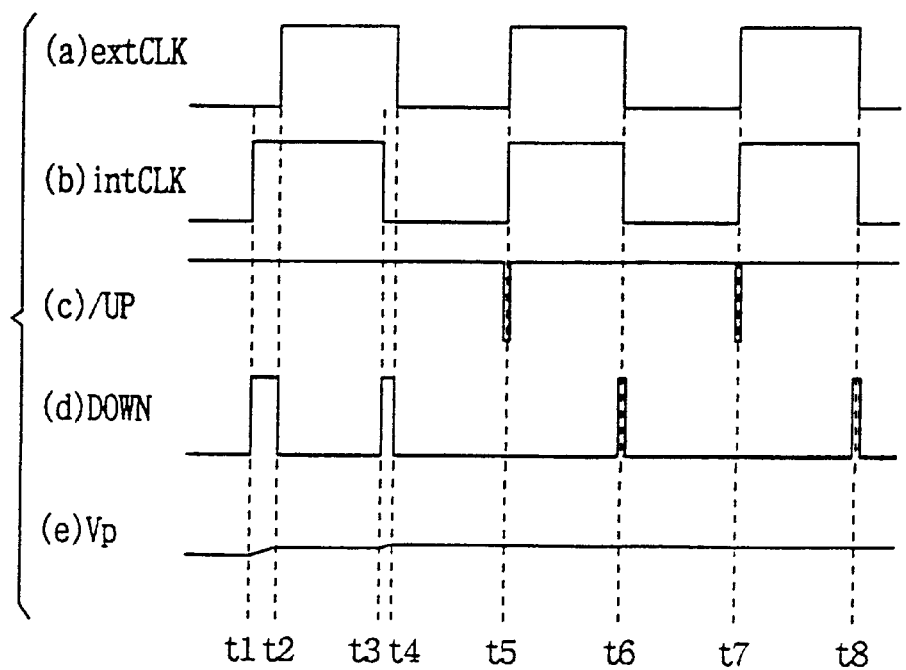
FIGS. 20 and 21 show timings of operation of the internal clock signal generating circuit shown in FIG. 19.

FIG. 20 shows the operation of the internal clock signal synchronizing circuit 320 in accordance with comparing signals /UP and DOWN, when the phase of internal clock signal intCLK advances that of external clock signal extCLK. As shown in (a) and (b) of FIG. 20, just before the time point t1, external clock signal extCLK and internal clock signal intCLK are both at the same level of L, and hence phase comparing circuit 321 sets the comparing signal /UP to the H level as shown in (c) of FIG. 20 and sets the comparing signal DOWN to the L level as shown in (d) of FIG. 20. In this state, MOS transistors 322*d* and 322*f* (see FIG. 11, for example) included in charge pump circuit 322 are both off, and the potential level of p channel current control signal Vp does not change, as shown in (e) of FIG. 20.

Referring to (a) and (b) of FIG. 20, when the internal clock signal intCLK rises to the H level at time t1 and thereafter external clock signal extCLK rises to the H level at time t2, phase comparing circuit 321 detects the phase of the internal clock signal intCLK advancing the external clock signal extCLK, and it maintains the comparing signal /UP at the H level as shown in (c) of FIG. 20 and raises the comparing signal DOWN as shown in (d) of FIG. 20. Consequently, by charge pump circuit 322 and current control circuit 323, the potential level of p channel current control signal Vp increases as shown at (e) of FIG. 20. Consequently, driving current (operational current or charging/discharging current) of inverter 324a included in internal clock signal generating circuit 324 decreases, and delay time of internal clock signal intCLK becomes longer.

Referring to (a) of FIG. 20, when the external clock signal extCLK rises to the H level at time t2, external clock signal extCLK and internal clock signal intCLK are both set to the H level, phase comparing circuit 321 resets the comparing signals /UP and DOWN as shown in (c) and (d) of FIG. 20, and the change of p channel current control signal Vp is stopped. Thereafter, when the internal clock signal intCLK falls at time t3 earlier than the time t4 when the external clock signal extCLK falls to the L level as shown at (a) and (b) of FIG. 20, phase comparing circuit 321 detects the advance in phase of internal clock signal intCLK to external clock signal extCLK, so that comparing signal /UP is maintained at the H level as shown in (c) of FIG. 20 and comparing signal DOWN is set to the H level as shown at (d) of FIG. 20. Consequently, the potential level of p channel current control signal Vp increases as shown in (e) of FIG. 20 by charge pump circuit 322 and current control circuit 323, and delay time of internal clock signal intCLK is made longer.

As shown at time t5 and thereafter in FIG. 20, when internal clock signal intCLK is synchronized with external clock signal extCLK (when locked in), comparing signals /UP and DOWN are hardly activated, and they are activated for a very short period of time at the rise and fall of external clock signal extCLK as shown in (c) and (d) of FIG. 20. Therefore, p channel current control signal Vp hardly changes but is maintained at approximately constant potential level, as shown in (e) of FIG. 20.

Referring now to the timing chart of FIG. 21, the operation when the phase of internal clock signal intCLK is delayed from the phase of external clock signal extCLK will be described.

Figure 21:
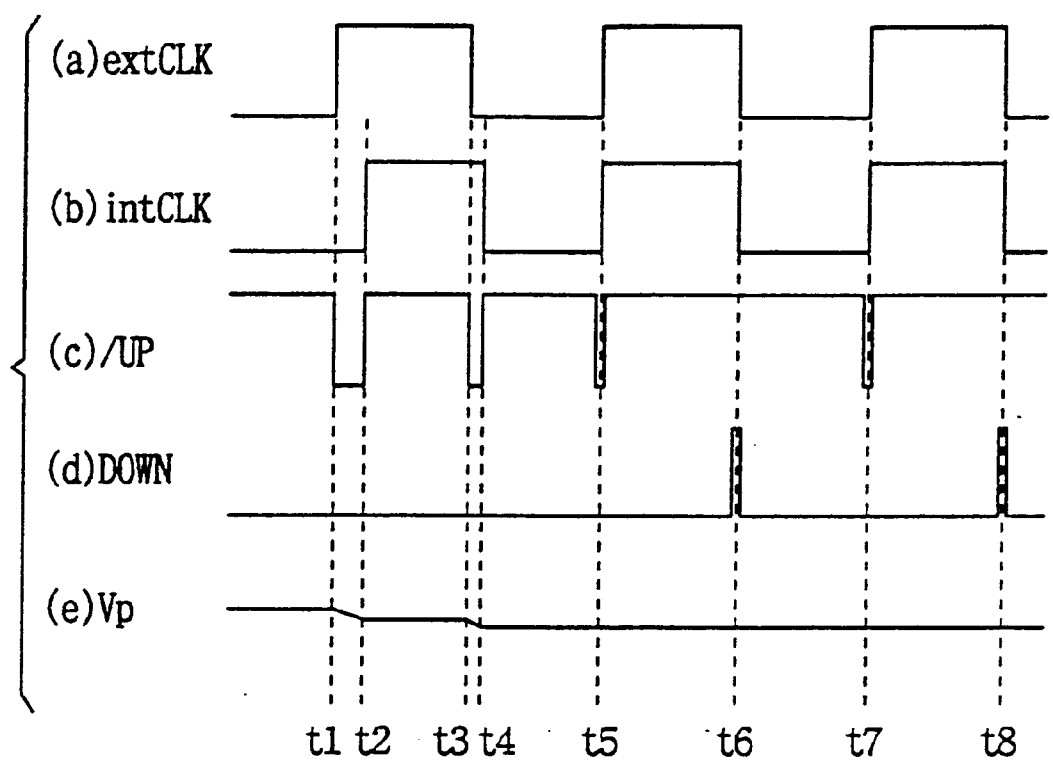

As shown in (a) and (b) of FIG. 21, just before the time point t1, external clock signal extCLK and internal clock signal intCLK are both at the same level of L, and hence phase comparing circuit 321 is reset, and comparing signals /UP and DOWN are held at the H level and L level as shown in (c) and (d) of FIG. 17. In this state, the p channel current control signal Vp does not change as shown in (e) of FIG. 21.

Referring to (a) of FIG. 21, when external clock signal extCLK rises to the H level at time t1, phase comparing circuit 321 detects the delay in phase of internal clock signal intCLK from external clock signal extCLK, so that it lowers the comparing signal /UP to the L level as shown in (c) of FIG. 21, and accordingly, the potential level of p channel current control signal Vp is lowered as shown in (e) of FIG. 21 by charge pump circuit 322 and current control circuit 323. In response, driving current (charging/discharging current) of internal clock signal generating circuit 324 (inverter 324a) is increased, and delay time of internal clock signal intCLK is made shorter.

As shown in (a) of FIG. 21, when internal clock signal intCLK rises at time t2, external clock signal extCLK and internal clock signal intCLK both attain to the H level, phase comparing circuit 321 is reset, and comparing signals /UP and DOWN are set to the H level and L level, as shown in (c) and (d) of FIG. 21, respectively. In this state, the p channel current control signal Vp does not change as shown in (e) of FIG. 21.

Referring to (a) and (b) of FIG. 21, when external clock signal extCLK falls to the L level at time t3, and thereafter internal clock signal intCLK falls at time t4, phase comparing circuit 321 detects the delay in phase of internal clock signal intCLK from external clock signal extCLK, lowers the comparing signal /UP to the L level as shown in (c) of FIG. 21, and maintains the comparing signal DOWN at the L level as shown in (d) of FIG. 21. Consequently, p channel current control signal Vp has its potential lowered as shown in (e) of FIG. 21, and the delay time of internal clock signal intCLK is made shorter.

When the internal clock signal intCLK is synchronized with the external clock signal extCLK (when locked in), comparing signals /UP and DOWN are hardly activated after time point t5, as shown in FIG. 21, and these signals are activated for only-a very short period of time at the rise and fall of the external clock signal extCLK as shown in (c) and (d) of FIG. 21. Therefore, p channel current control signal Vp hardly changes as shown in (a) of FIG. 21 but maintains approximately constant potential level.

Even when the inverter delay circuit as described above is used, the same effect as in the Embodiments 1 to 5 above can be obtained. The internal clock signal generating circuit 324 functions as a delay circuit, and therefore there may be provided even number of stages of inverters 324a (since it is not necessary to form a ring oscillator).

[Embodiment 7]

Figure 22A:
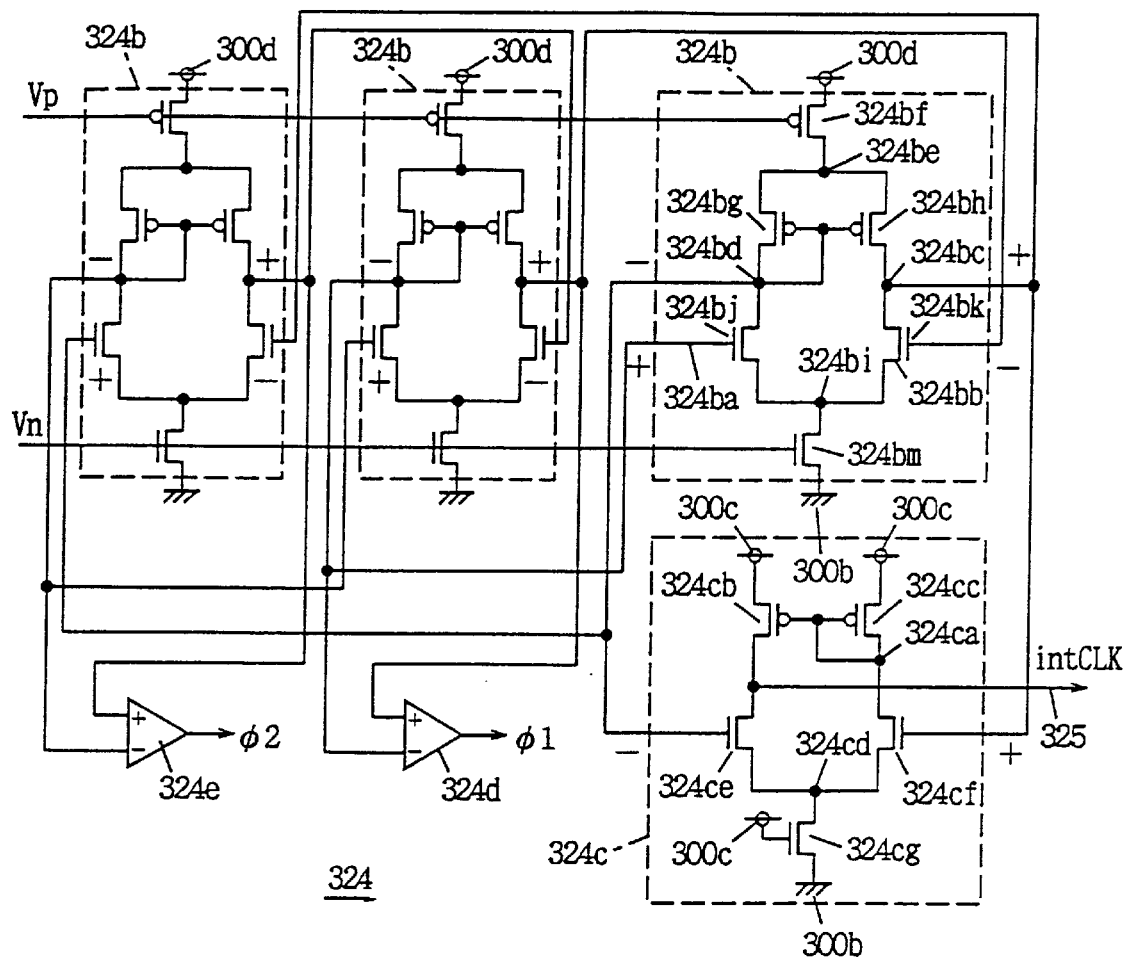
FIG. 22A shows a still further structure of the internal clock signal generating circuit.
Figure 22B:
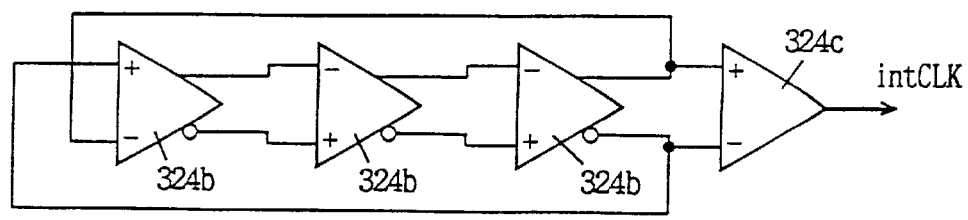
FIG. 22B is a block diagram in logic level showing the manner of connection of FIG. 22A.

FIGS. 22A and 22B schematically show the structure of the main portion of the SRAM in accordance with the seventh embodiment. FIGS. 22A and 22B show the structure of the internal clock signal generating circuit 324. Other structures are the same as Embodiments 1 to 5 above, and hence these are omitted. Referring to FIG. 22A, there are three differential amplifying circuits 324b connected in a ring, and a differential amplifying circuit (internal clock buffer) 324c for amplifying the output of the differential amplifying circuit 324b at the last stage. Each of the differential amplifying circuits 324a includes complementary input nodes 324ba and 324bb and complementary output nodes 324bc and 324bd. When the potential at input node 324ba is higher than that of input node 324bb, the potential at output node 324bc is set higher than that at output node 324bd. At this time, a potential differential larger than the potential difference generated between input nodes 324ba and 324bb is generated between out put nodes 324bc and 324bd. Conversely, if the potential at input node 324ba is lower than the potential at 324bb, the potential at output node 324bc is set lower than the potential at output node 324bd. In this case also, a potential difference larger than that developed between input nodes 324ba and 324bb is generated between output nodes 324bc and 324bd.

Differential amplifying circuit 324b includes a p channel current control transistor 324bf connected between internal power supply node 300d for clocks and node 324be and receiving at its gate the p channel current control signal Vp;

a p channel MOS transistor 324*bg* connected between node 324*be* and output node 324*bd* and having its gate connected to output node 324*bd;* a p channel MOS transistor 324*bh* connected between node 324*be* and output node 324*bc* and having its gate connected to output node 324*bd;* an n channel input transistor 324*bj* connected between output node 324*bd* and node 324*bi* and having its gate connected to input node 324*ba;* an n channel input transistor 324*bk* connected between output node 324*bc* and node 324*bi* and having its-gate connected to input node 324*bb;* and an n channel current control transistor 324*bm* connected between node 324*bi* and ground node 300*b* and having its gate connected to receive n channel current control signal Vn. The p channel MOS transistors 324*bg* and 324*bh* constitute a current mirror circuit.

Differential amplifying circuit (internal clock buffer) 324*c* receiving complementary output signals of differential amplifying circuit 324*b* at the last stage serves as an internal clock buffer which differentially amplifies the complementary output signals from differential amplifying circuit 324*b* at the last stage to generate an internal clock signal intCLK which is set to the H level or the L level. Internal clock buffer 324*c* includes a p channel MOS transistor 324*cb* connected between internal power supply node 300*c* and internal clock signal output node 325 and having its gate connected to node 324*ca;* a p channel MOS transistor 324*cc* connected between internal power supply node 300*c* and node 324*ca* and having its gate connected to node 324*ca;* an n channel MOS transistor 324*ce* connected between internal clock signal output node 325 and node 324*cb* and having its gate connected to output node 324*bd* of differential amplifying circuit 324*b* of the last stage; an n channel MOS transistor 324*cf* connected between nodes 324*ca* and 324*cd* and having its gate connected to output node 324*bc* of differential amplifying circuit 324*b* of the last stage; and an n channel MOS transistor 324*cg* connected between node 324*cd* and ground node 300*b* and having its gate connected to internal power supply node 300*c.* The p channel MOS transistors 324*gcc* and 324*cb* constitute a current mirror circuit. The n channel MOS transistor 324*cg* serving as a current source transistor has its gate connected to internal power supply node 300*c,* and it has large current drivability. Therefore, internal clock buffer 324*c* has large operational current, and it drives the internal clock signal intCLK to the H level or to the L level at high speed.

Internal clock signal φ1 is output from internal clock buffer 324*d* which receives complementary output signals of differential amplifying circuit 324*b* of the second stage. Internal clock signal φ2 is output from internal clock buffer 324*e* which receives complementary output signals output from differential amplifying circuit 324*b* of the first stage. Internal clock buffers 324*d* and 324*e* have the same structure as internal clock buffer 324*c.*

FIG. 22B shows connection between differential amplifying circuit 324*b* and internal clock buffer 324*c* shown in FIG. 22A. As shown in FIG. 22B, the positive output signal and the complemental output signal of differential amplifying circuit 324*b* of the first stage are applied to the positive and negative input nodes of differential amplifying circuit 324*b* of the second stage. The positive and complemental output signals of differential amplifying circuit 324*b* of the second stage are applied to the negative and positive input nodes of differential amplifying circuit 324*b* of the last stage. The positive and complemental output signals from differential amplifying circuit 324*b* of the last stage are applied to the negative and positive input nodes of differential amplifying circuit 324*b* of the first stage, as well as to the positive and negative input nodes of internal clock buffer 324*c.* Each differential amplifying circuit 324*b* functions as an inversion amplifier, and they constitute a ring oscillator in combination. In this case, differential amplifying circuit 324*b* has superior amplifying characteristic as compared with an inverter having a common CMOS structure, and amplitude of the positive and negative output signals is made smaller than that between the internal power supply potential Vcc and the ground potential GND (amount of operational current is adjusted by current control signals Vp and Vn). Therefore, the differential amplifying circuits 324*b* operate at high speed, and output signals change at high speed. Therefore, even when the external clock signal extCLK has a high frequency, internal clock signal intCLK which has its phase synchronized with this high speed external clock signal extCLK can be surely generated.

Internal clock buffer 324*c* includes current source transistor 324*cg* which has large conductance, and hence it provides large current drivability. Therefore, it operates at high speed, and drives internal clock signal intCLK to the H level and to the L level at high speed.

Figure 23:
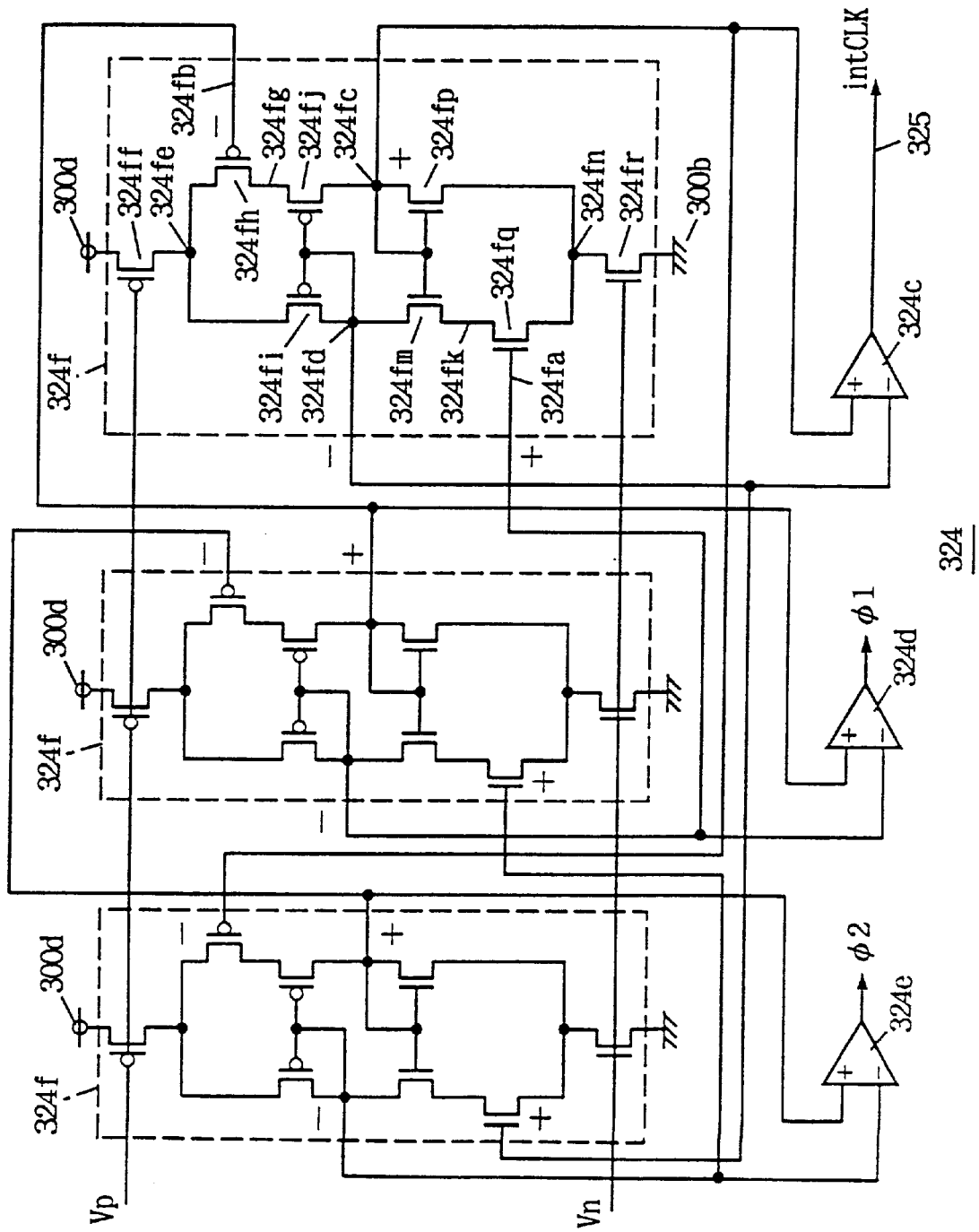
FIG. 23 shows another structure of the differential amplifying circuit shown in FIG. 22A.

FIG. 23 shows another structure of the internal clock signal generating circuit 324. In the structure shown in FIG. 23 also, there is provided three stages of differential amplifying circuits 324*f* constituting a ring oscillator. The differential amplifying circuit 324*f* includes complementary input nodes 324*fa* and 324*fb,* and complementary output nodes 324*fc* and 324*fd.* When the potential at input node 324*fa* is higher than that of input node 324*fe,* the potential at output node 324*fc* is made higher than that of output node 324*fd.* At this time, the potential difference developed between output nodes 324*fc* and 324*fd* is made larger than the potential difference between input nodes 324*fa* and 324*fb.*

Differential amplifying circuit 324*f* includes a p channel current control transistor 324*ff* connected between internal power supply node 300*d* for clocks and node 324*fe* and receiving at its gate-the p channel current control signal Vp; a p channel input transistor 324*fh* connected between nodes 324*fe* and 324*fg* and having its gate connected to input node 324*fb;* a p channel MOS transistor 324*fi* connected between node 324*fe* and output node 324*fd* and having its gate connected to output node 324*fd;* a p channel MOS transistor 324*fj* connected between node 324*fg* and output node 324*fc* and having its gate connected to output node 324*fd;* an n channel MOS transistor 324*fm* connected between output node 324*fd* and node 324*fk* and having its gate connected to output node 324*fc;* an n channel MOS transistor 324*fp* connected between output node 324*fc* and node 324*fn* and having its gate connected to node 324*fc;* an n channel input transistor 324*fq* connected between nodes 324*fk* and 324*fn* and having its gate connected to input node 324*fa;* and an n channel current control transistor 324*fr* connected between node 324*fn* and ground node 300*b* and having its gate connected to receive n channel current control signal Vn. The p channel MOS transistors 324*fd* and 324*fj* constitute a current mirror circuit, and n channel MOS transistors 324*fm* and 324*fp* constitute a current mirror circuit. The current mirror circuits constitute a closed loop, which sets the current flowing through MOS transistors 324*fi,* 324*fj,* 324*fp* and 324*fm* to the same value.

The internal clock buffers 324*c* to 324*d* have the same structure as shown in FIG. 22. Internal clock buffer 324*e* generates internal clock signal φ2 from the complementary output signals of the differential amplifying circuit 324*f* of the first stage, internal clock buffer 324*d* generates internal clock signal φ1 from the complementary output signals of the differential amplifying circuit 324*f* of the second stage, and internal clock buffer 324*c* generates the internal clock signal intCLK from the complementary output signals of the differential amplifying circuit 324*f* of the last stage.

In the differential amplifying circuit 324*f*, if the signal potential applied to input node 324*fa* is higher than that applied to input node 324*fb*, conductances of MOS transistors 324*fq* and 324*fh* increase, and hence current flowing therethrough increases. The current flowing through p channel MOS transistor 324*fh* flows through MOS transistors 324*fj* and 324*fp*. The current flowing through MOS transistor 324*fa* is applied through MOS transistors 324*fi* and 324*fm*. Since the current mirror circuits constitute a closed loop, the currents flowing through MOS transistors 324*fj*, 324*fp*, 324*fm* and 324*fi* have the same current value. Therefore, the amount of current flowing through these transistors becomes large, and due to the increase of the amount of the current, the gate potential of MOS transistors 324*fp* constituting a master stage of the current mirror circuit increases in accordance with the square law characteristic of the MOS transistor, while the gate potential of MOS transistor 324*fi* decreases. More specifically, potential level of output node 324*fc* increases and output potential of output node 324*fd* lowers. Therefore, the potential difference of the signals applied to input nodes 324*fa* and 324*fb* is amplified and output to output nodes 324*fc* and 324*fd*.

The manner of connection of the input and output nodes of differential amplifying circuit 324*f* is the same as the connection of differential amplifying circuit 324*b* shown in FIG. 22B.

Figure 24:
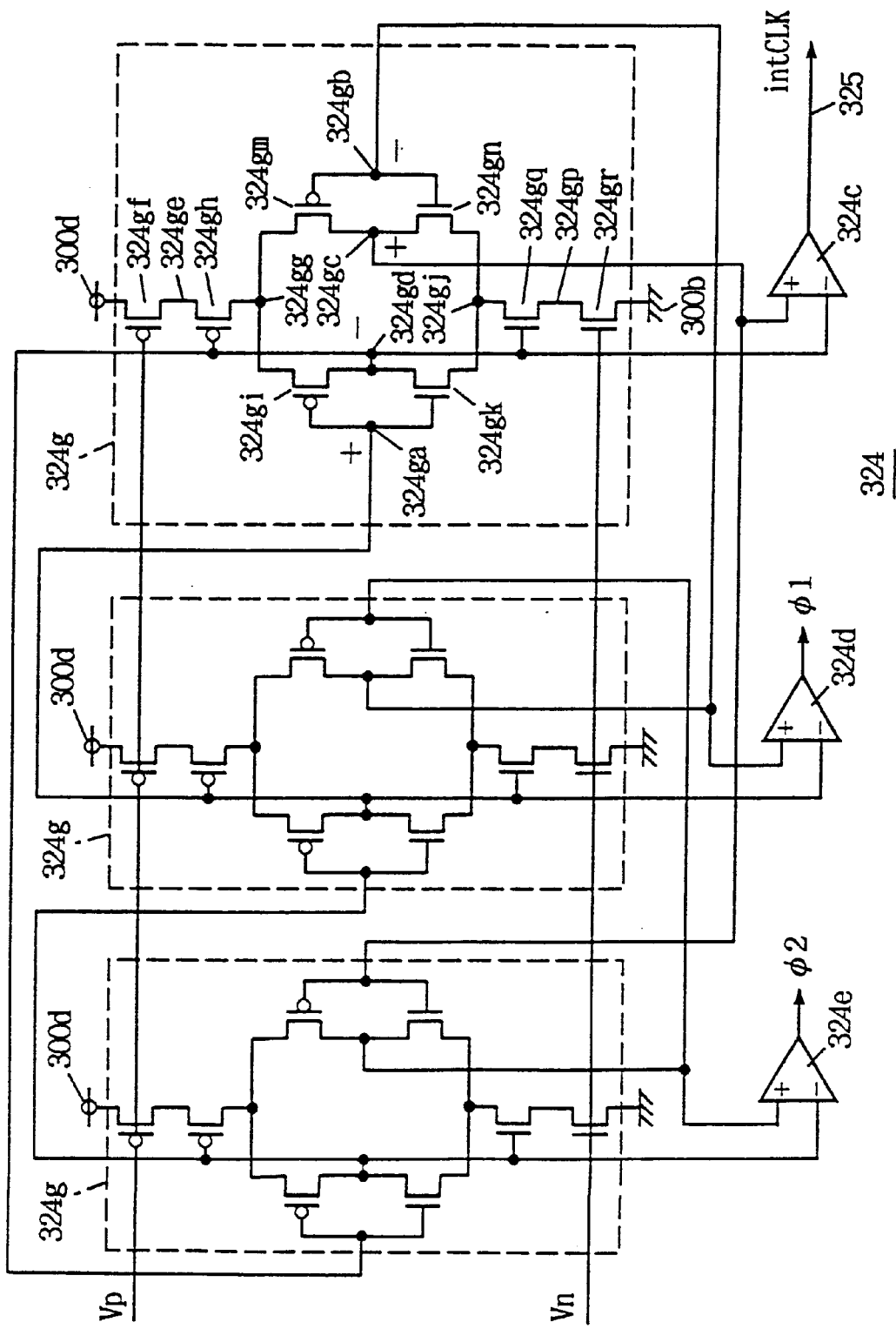
FIG. 24 shows another structure of the differential amplifying circuit shown in FIG. 22A.

FIG. 24 shows a still further structure of internal clock signal generating circuit 324. Referring to FIG. 24, each of the differential amplifying circuit 324*g* connected in a ring includes a p channel current control transistor 324*gf* connected between internal power supply node 300*d* for clocks and node 324*ge* and receiving at its gate p channel current control signal Vp; a p channel MOS transistor 324*gh* connected between nodes 324*ge* and 324*gg* and having its gate connected to output node 324*gd*; a p channel input transistor 324*gi* connected between node 324*gg* and output node 324*gd* and having its gate connected to input node 324*ga*; an n channel input transistor 324*gk* connected between output node 324*gb* and node 324*gd* and having its gate connected to input node 324*ga*; a p channel input transistor 324*gm* connected between node 324*gg* and output node 324*gc* and having its gate connected to input node 324*gb*; an n channel input transistor 324*gn* connected between output node 324*gc* and node 324*gj* and having its gate connected to input node 324*gb*, an n channel MOS transistor 324*gb* connected between nodes 324*gj* and 324*gp* and having its gate connected to output node 324*gd*; and an n channel current control transistor 324*gr* connected between node 324*gp* and ground node 300*b* and having its gate connected to receive n channel current control signal Vn. The p channel input transistor 324*gi* and n channel input transistor 324*gk* constitute a CMOS inverter, and p channel input transistor 324*gm* and n channel input transistor 324*gn* constitute a CMOS inverter. The operation of the differential amplifying circuit 324*g* shown in FIG. 24 will be briefly described.

When the signal potential applied to input node 324*ga* is higher than the signal potential applied to input node 324*gb*, the potential at output node 324*gd* is made lower than the potential of output node 324*c* by amplifying operation of inverters, since transistors 324*gi* and 324*gk* constitute an inverter and transistors 324*gm* and 324*gn* constitute an inverter. When the potential at output node 324*gd* lowers, conductance of n channel MOS transistor 324*gh* increases, conductance of n channel MOS transistor 324*gq* is made smaller, and potential at output node 324*gc* is made higher. Conversely, if the signal potential at input node 324*ga* is lower than the signal potential of input node 324*gb*, the signal potential at output node 324*gd* is made higher than the signal potential of output node 324*gc*. At this time, conductance of n channel MOS transistor 324*gq* is increased, and conductance of p channel MOS transistor 324*gh* is made smaller. Therefore, decrease in potential at output node 324*gd* is made larger, and potential difference between the signals applied to input nodes 324*ga* and 324*gb* is enlarged.

The structures of internal clock buffers 324*c* to 324*e* are the same as those shown in FIG. 22.

Figure 25:
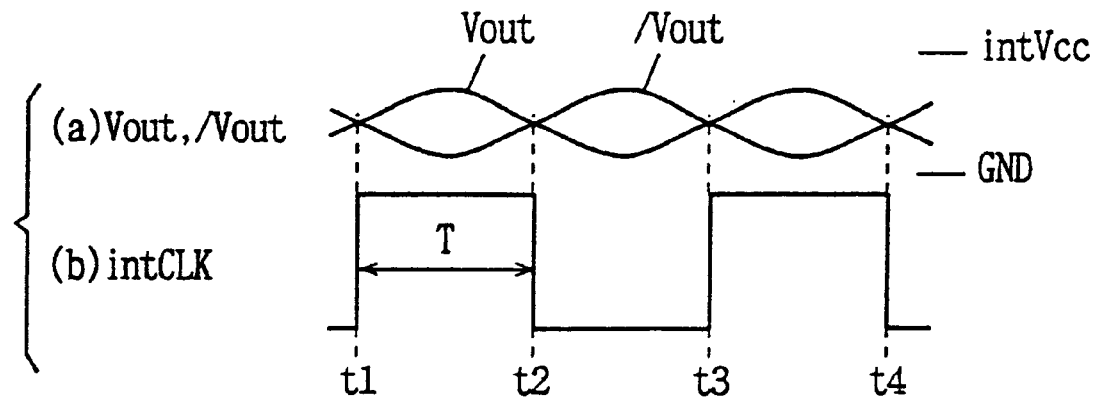
FIG. 25 is a timing chart showing the operation of the internal clock signal generating circuit shown in FIGS. 22A to 24.

FIG. 25 is a timing chart showing the operation of internal clock signal generating circuit 324 employing the ring oscillator utilizing the differential amplifying circuits shown in FIGS. 22A to 24. FIG. 25 shows output potentials Vout and /Vout of differential amplifying circuit 324*b*, 324*f* or 324*p* of the last stage, as well as internal clock signal intCLK. As shown in (a) of FIG. 25, the complementary output potentials Vout and /Vout do not swing fully between internal power supply potential intVCC and the ground potential GND. However, differential amplifying circuit 324*b*, 324*f* or 324*g* amplifies the applied complementary input signals. As shown in (a) of FIG. 25, in the period from t1 to t2, if the potential Vout becomes higher than the potential /Vout, complementary signals Vout and /Vout are buffered by internal clock buffer 324*c*, and internal clock signal intCLK is set to the H level of internal power supply potential intVCC. Meanwhile, as shown in (a) of FIG. 25, if the potential Vout becomes lower than the potential /Vout in the period from t2 to t3, the potential difference is amplified by buffer processing, and hence internal clock signal intCLK is set to the L level as shown in (b) of FIG. 25. The speed of operation (speed of response) of differential amplifying circuits 324*b*, 324*f* and 324*g* is determined by the magnitude of the driving current. Therefore, by adjusting operational current (driving current) flowing through these amplifying circuits by current control signals Vp and Vn, the speed of response (speed of operation) of the differential amplifying circuit can be adjusted, and accordingly, the phase of the internal clock signal intCLK can be adjusted. Here, if the driving current (operational current) decreases, the speed of operation of the differential amplifying circuit decreases, the speed of change in potential at the output node becomes slow, and hence delay time increases.

Therefore, when p channel current control signal Vp lowers and the potential of n channel current control signal Vn increases, the frequency of internal clock signal intCLK is increased (or the phase is advanced), and when the potential of p channel current control signal Vp increases and the potential of n channel current control signal Vn lowers, the frequency of internal clock signal intCLK is increased (or the phase is delayed), and hence as in the embodiment above, the internal clock signal intCLK can be locked in the external clock signal extCLK. Further, since the ring oscillator employs three stages of differential amplifying circuits which amplify complementary input signals and output complementary output signals, small potential difference between complementary input signals is amplified by these amplifying circuits and transmitted to the differential amplifying circuit of the next stage, and hence the time for the change in level of the complementary output signals to be transmitted from the first stage to the last stage and again fed back to the differential amplifying circuit of the first stage becomes shorter. Accordingly, a high speed of internal clock signal intCLK can be generated. Further, since the amplitude of the complementary output signals of differential amplifying circuit do not swing fully, the change of the complementary output signals can be speeded up. Therefore, internal clock signal intCLK of high frequency can be generated, and hence even when high speed external clock signal extCLK is applied, the internal clock signal intCLK can be locked in the high speed external clock signal extCLK immediately.

[Embodiment 8]

In the eighth embodiment, when the internal clock signal intCLK is locked in the external clock signal extCLK, lock in signal LK is made active, and the current supplied to internal current supplying node 312 is maintained constant.

Figure 26:
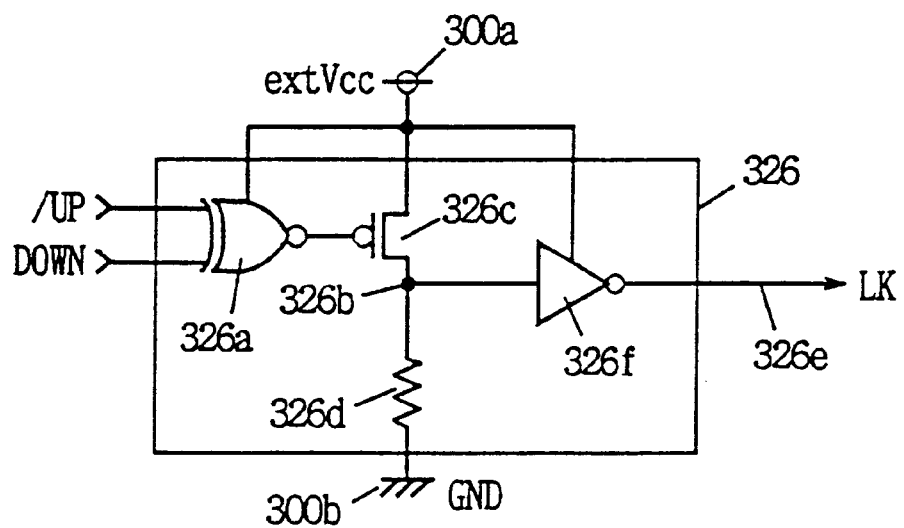
FIG. 26 shows a structure of a lock detecting circuit for detecting locking of the internal clock signal in the external clock signal.

FIG. 26 shows a structure of a lock in detecting circuit 326. Lock in detecting circuit 326 is included in internal clock signal synchronizing circuit 320. Referring to FIG. 26, lock in detecting circuit 326 includes an extNOR circuit 326a receiving comparing signals /UP and DOWN from phase comparing circuit 321; a p channel MOS transistor 326c connected between external power supply node 300a and node 326b and receiving at its gate an output signal from EXNOR circuit 326a; a resistance element 326d connected between node 326b and ground node 300b; and an inverter 326f for inverting and amplifying signal potential on node 326b and outputting lock in signal LK at output node 326e. The components of lock in detecting circuit 326 all operate using external power supply potential extVCC as one operational power supply potential. When the logic of comparing signal /UP is the same as that of the signal DOWN, EXNOR circuit 326a outputs a signal at the H level, and when these signals have different logics, outputs a signal at the L level. The operation will be described.

When internal clock signal intCLK is not locked in external clock signal extCLK, the period in which comparing signals /UP and DOWN are set to the active level of L and H, respectively, becomes longer. In response, the time in which the output signal from EXNOR circuit 326a is kept at the L level becomes longer, and hence amount of charges for charging node 326b through MOS transistor 326c increases. Therefore, the potential at node 326b attains approximately the level of the external power supply potential extVCC. In this stage, lock in signal LK is set to the L level by inverter 326f.

Meanwhile, as the internal clock signal intCLK comes to be locked in external clock signal extCLK, the period in which comparing signals /UP and DOWN are kept at the active state of L level nd H level, respectively, becomes shorter. In this state, the period in which the output signal of EXNOR circuit 326a is kept at the L level becomes shorter, the amount of charges supplied to node 326d from MOS transistor 326c becomes smaller, and the degree of discharge to the ground node from node 326d through resistance element 326d becomes larger. In this state, the potential at node 326b is set approximately to the ground potential GND level, and lock in signal LK is set to the H level which is at the level of the external power supply potential extVCC, by inverter 326f. Therefore, by the lock in detecting circuit 326 shown in FIG. 26, whether or not the internal clock signal intCLK is locked in external clock signal extCLK can be readily identified. The resistance value of resistance element 326b have only to be set larger than the on resistance of p channel MOS transistor 326c.

Figure 27:
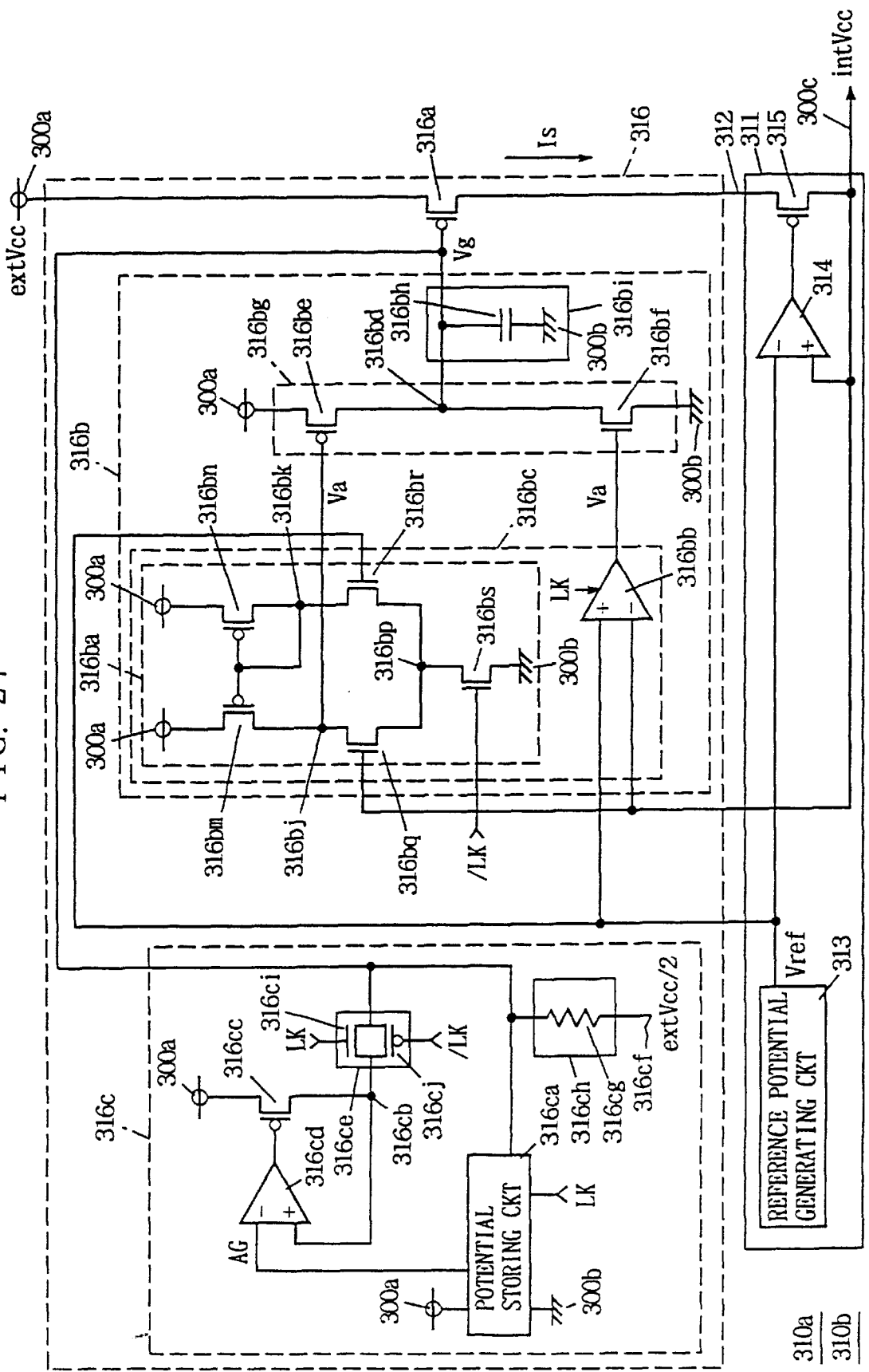
FIG. 27 shows a still further structure of the internal power supply potential generating circuit.

FIG. 27 shows a circuit structure of internal power supply potential generating circuit 310a. Internal power supply potential generating circuit 310b for clocks has the same structure as that in FIG. 27. Referring to FIG. 27, internal power supply potential generating circuit 310a includes a constant voltage circuit 311 supplied with current from current supply node 312 for generating an internal power supply potential intVCC at the level of the reference potential Vref at internal power supply node 300c, and a current supplying circuit 316 for supplying current in accordance with a difference between internal power supply potential intVCC and reference potential Vref to current supply node 312. Current supplying circuit 316 includes a current drive transistor 316a connected between external power supply node 300a and current supplying node 312 for supplying current Is from external power supply node 300a to current supply node 312; a gate potential holding circuit 316c for holding gate potential Vg of drive transistor 316a when lock in signal LK is activated; and a current control circuit 316b for adjusting gate potential Vg of drive transistors 316a in accordance with the difference between internal power supply potential intVCC and reference potential Vref.

Current control circuit 316b includes a charge pump circuit 316bg for adjusting gate potential Vg, and a comparing circuit 316bc comparing reference potential Vref with internal power supply potential intVCC for adjusting charge pump operation of charge pump circuit 316bg in accordance with the result of comparison. The comparing circuit 316b includes a differential amplifying circuit 316ba which is activated when lock in signal LK is inactivated, and a differential amplifying circuit 316bb having the same structure as differential amplifying circuit 316ba and which is activated when the lock in signal LK is inactivated. The output potentials Va from differential amplifying circuits 316ba and 316bb are applied to the gates of p-channel MOS transistors 316bb and 316bf included in charge pump circuit 316bg.

Differential amplifying circuit 316ba includes a p channel MOS transistor 316bm connected between external power supply node 300a and node 316bj and its gate connected to node 316bk; a p channel MOS transistor 316bn connected between external power supply node 300a and node 316bk and having its gate connected to node 316bk; an n channel MOS transistor 316bg connected between nodes 316bj and 316bp and having its gate connected to receive internal power supply potential intVCC; an n channel MOS transistor 316br connected between nodes 316bb and 316bk and having its gate connected to receive reference potential Vref; and an n channel MOS transistor 316bs connected between node 316bp and ground node 300b and receiving at its gate an inverted signal /LK of lock in signal LK. The p channel MOS transistors 316bn and 316bm constitute a current mirror circuit. The n channel MOS transistor 316bs functions as a current source of differential amplifying circuit 316b. Differential amplifying circuit 316bb also has the same structure as differential amplifying circuit 316ba. Therefore, when the lock in signal LK is set to the active state of L level indicating the state of lock in, the inverted signal /LK is set to the L level, n channel MOS transistor 316bs is rendered non-conductive and differential amplifying circuits 316ba and 316bb are both rendered non-conductive. However, since differential amplifying circuits 316ba and 316bb output Va at H level and L level when inactive, the positions of current source transistors are different.

Holding circuit 316c includes a potential storing circuit 316ca for storing gate potential Vg of current driver transistor 316a when lock in signal LK changes from the L level to the H level; a p channel MOS transistor 316cc connected between external power supply node 300a and node 316cb; a transfer gate 316ce for electrically connecting the gate of current control transistor 316a to node 316cb when lock in signal LK is activated; and a differential amplifying circuit 316*cd* for comparing the potential on node 316*cb* with the potential 316*ag* stored in potential storing circuit 316*ca*. Potential storing circuit 316*ca* operates using the external power supply potential extVCC on external power supply node 300*a* and the ground potential GND on ground node 300*e* at both operational power supply, converts the gate potential Vg to a digital signal and stores it, and converts the stored digital signal to an analog signal AG for output. The potential storing circuit 316*ca* has the same structure as potential storing circuit 323*ia* shown in FIG. 16 except that the external power supply potential extVCC is utilized and that lock in-signal LK is used instead of hold signal HD. Therefore, in the potential storing circuit 316*ca*, the gate potential Vg of current control transistor 316*a* when the internal clock signal intCLK is locked in external clock signal extCLK is held. Differential amplifying circuit 316*cd* has the same structure as operational amplifier 323*d* shown in FIG. 11. Transfer gate 316*ce* includes a parallel body of an n channel MOS transistor 316*ce* receiving at its gate the lock in signal LK and a p channel MOS transistor 316*cj* receiving at its gate the lock in signal /LK.

Circuit 316*c* further includes a start up circuit 316*ch* for transmitting a potential of one half the external power supply potential extVCC to the gate of current control transistor 316*a*. Start up circuit 316*ch* includes a resistance element 316*cg* having relatively high resistance, which transmits the potential extVCC/2 applied to node 316*cf* to the gate of current control transistor 316*a*. Operational amplifier 316*cd* receives the potential on node 316*cb* at its positive input, and receives the analog signal AG at its negative input. Transfer gate 316*ce* is rendered conductive when lock in signal LK is activated indicating the lock in of the internal clock signal intCLK.

When the external power supply potential extVCC is applied, a gate potential Vg (=extVCC/2) which is almost the optimum value is transmitted through start up circuit 316*ch* to the gate of current control drive transistor 316*a*. Accordingly, the current Is applied to current supply node 312 can be set to the optimal value, and the internal power supply potential intVCC can be set to the prescribed potential level at high speed. When charging/discharging of the gate of current control transistor 316*a* by charge pump circuit 316*bg* starts, the charging/discharging current by charge pump circuit 316*bg* is far larger than the current flowing through resistance elements 316*cg* having high resistance value. Therefore, start up circuit 316*ch* hardly contributes to the operation of adjusting the gate potential Vg. By utilizing the internal power supply voltage generating circuit 310*a* shown in FIG. 27, when internal clock signal intCLK is locked in and the internal circuit operation stabilized, the constant current IS can be supplied stably and the internal power supply potential intVCC can be maintained at the prescribed potential level accordingly, by adjusting the gate potential Vg of current control transistor 316*a* at a constant potential level when the internal clock signal intCLK is locked in.

Further, in the internal power supply voltage generating circuit 310*b* for clocks, when the internal clock signal intCLK is locked in, the amount of current consumption does not change, since the operation of the internal clock signal synchronizing circuit is stabilized, the amount of current consumption is constant, and hence by supplying optimal current Is through current control transistor 316*a*, the internal power supply potential intVCC applied to internal power supply node for clocks can be maintained at the constant potential level.

At this time (when locked in), the output potential Va of differential amplifying circuit 316*ba* is set to the H level, and output potential Va of differential amplifying circuit 316*bb* is set to the L level. Therefore, in the differential amplifying circuit 316*bb*, current source transistor 316*bs* is formed by a p channel MOS transistor receiving at its gate the lock in signal, and it is provided between external power supply node 300*a* and p channel MOS transistors constituting the current mirror circuit. The differential amplifying circuits 316*ba* and 316*bb* have the same circuit structure except the position of the current source transistor and the polarity of the lock in signal. Therefore, when the lock signal LK is activated, charge pump operation of charge pump circuit 316*bg* is inhibited, and gate potential Vg of current control transistor 316*a* is held at the potential level at the time of locked in.

Figure 28:
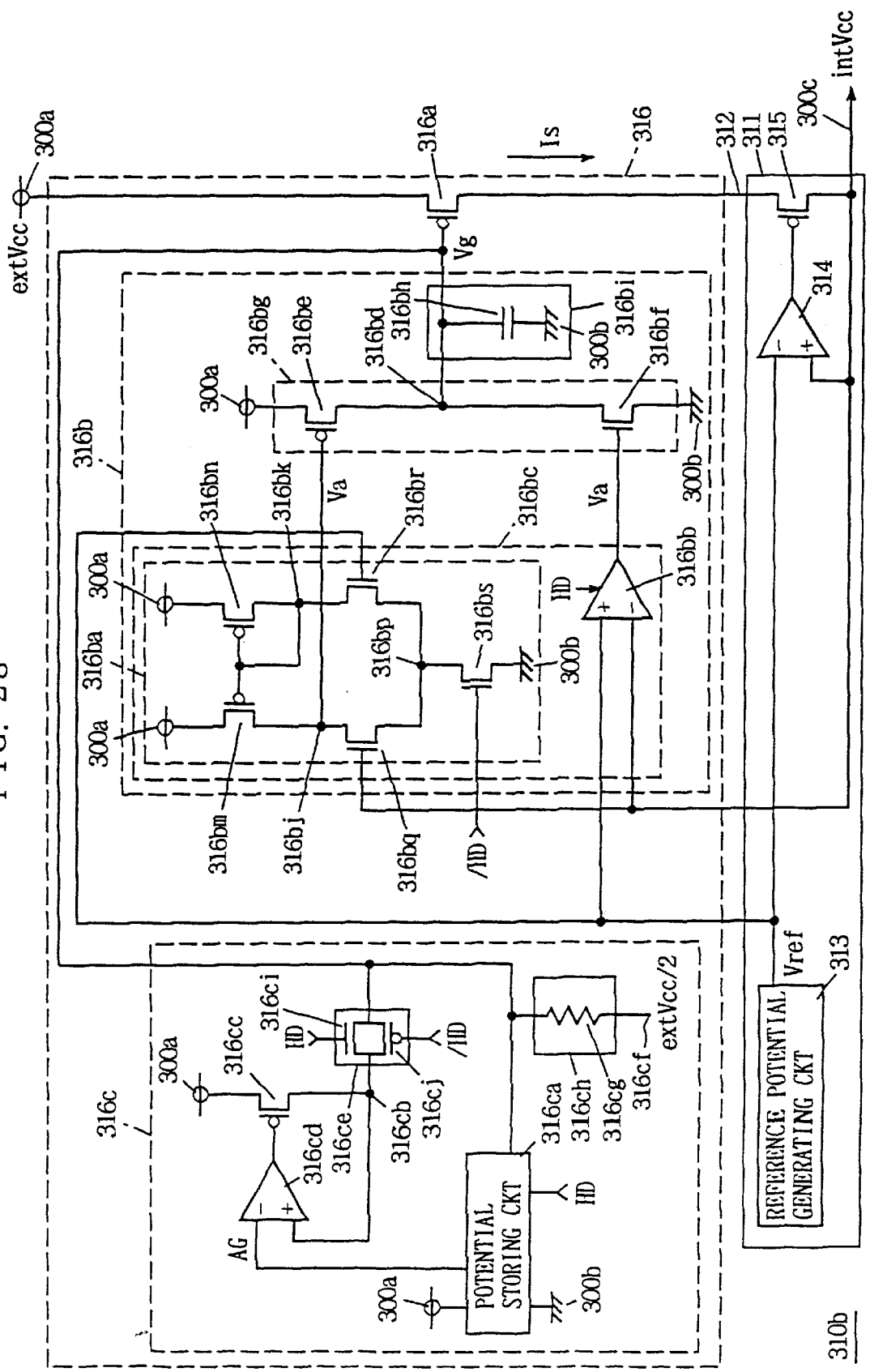
FIG. 28 shows a still further structure of the internal power supply potential generating circuit.

FIG. 28 shows a modification of internal power supply voltage generating circuit 310*b* for clocks. In the structure shown in FIG. 28, hold signal HD is used instead of the lock signal LK. The hold signal HD is set to the H level when supply of the internal clock signal extCLK is stopped. Except this point, the structure is the same as that shown in FIG. 27, and corresponding portions are denoted by the same reference characters. By using the structure shown in FIG. 28, when the supply of the external clock signal extCLK is stopped, the gate potential Vg of current control transistor 316*a* is held by potential holding circuit 316*c*. Therefore, when the supply of the external clock signal extCLK is resumed, the current Is applied to current supply node 312 can be set to the optimal value at high speed.

(Embodiment 9)

Figure 29:
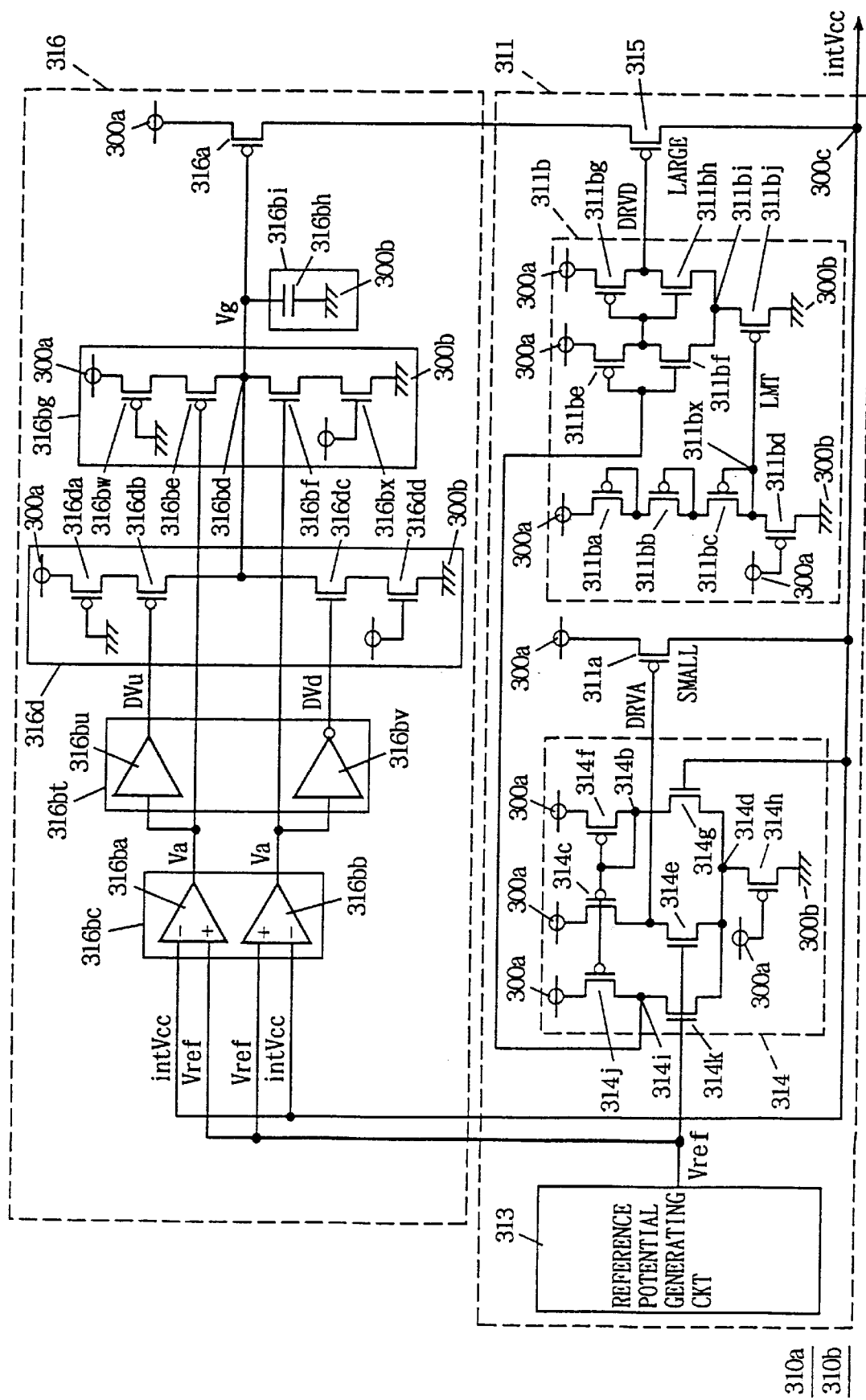
FIG. 29 shows a still further structure of the internal power supply potential generating circuit.

FIG. 29 shows a structure of a main portion of a semiconductor memory device in accordance with a ninth embodiment of the present invention. FIG. 29 shows the structures of internal power supply potential generating circuits 310*a* and 310*b*. Other structures are the same as the embodiments above. The internal power supply potential generating circuits 310*a*, and 310*b* shown in FIG. 29 differ from the above embodiments in the following points. In constant voltage circuit 311, an analog current driver transistor 311*a* connected between external power supply node 300*a* and internal power supply node 300*c* and receiving at its gate an analog driver control signal DRVA from differential amplifying circuit 314 is provided. The driver control signal DRVA is a signal obtained by amplifying a potential difference between internal power supply potential intVCC and the reference potential Vref from reference potential generating circuit 313, and it is an analog signal. The driver transistor 311*a* is rendered conductive when internal power supply potential intVCC is lower than the reference potential Vref.

Further, in differential amplifying circuit 314, a p channel MOS transistor 314*j* connected between external power supply node 300*a* and node 314*i* and having its gate connected to node 314*b*, and an n channel MOS transistor 314*k* connected between nodes 314*i* and 314*d* and having its gate connected to receive reference potential Vref are provided. The p channel MOS transistor 314*j* and p channel MOS transistor 314*f* constitute a current mirror circuit. Between the output node 314*i* of differential amplifying circuit 314 and the gate of driver transistor 315, a buffer circuit 311*b* is provided. When internal power supply potential intVCC becomes lower than the reference potential Vref by about Vref/10, buffer circuit 311*b* sets the driver control signal DRVD to extVCC−2|Vthp|, and otherwise sets it to the level of external power supply potential extVCC. Here, Vthp represents the threshold voltage of p channel MOS transistor. More specifically, buffer circuit 311*b* has a function of converting the analog signal DRVA output from the differential amplifying circuit 314 to digital driver control signal DRVD. Therefore, driver transistor 315 is rendered conductive when internal power supply potential intVCC lowers by Vref/10 or more from reference potential Vref, and otherwise it is rendered non-conductive, and it is digitally turned on/off. The internal power supply potential generating circuit in which digital control driver transistor 315 and analog control driver transistor 311*a* coexist is referred to as a mixed mode internal power supply potential generating circuit.

In current supplying circuit 316, charge pump circuit 316*bj* for adjusting gate potential Vg of current control transistor 316 includes an n channel MOS transistor 316*bx* and a p channel MOS transistor 316*bw* serving as a constant current source. The p channel MOS transistor 316*bw* is connected between p channel MOS transistor 316*be* for charging and internal power supply node 300*a*, and has its gate connected to receive ground potential GND. The n channel MOS transistor 316*bx* is connected between n channel MOS transistor 316*bf* for discharging and ground node 300*b*, and has its gate connected to receive external power supply potential extVCC. The analog charge pump circuit 316*bg* increases the gate potential Vg by charging the gate of current control transistor 316*a* when the internal power supply potential intVCC is higher than the reference potential Vref, in accordance with the analog output potential Va output from differential amplifying circuit 316*bc*, and otherwise, it lowers the gate potential Vg by discharging the gate of current control transistor 316*a*.

Current supplying circuit 316 further includes a digital converting circuit 316*bt* for converting the analog output potential Va from comparing circuit 316*bc* to output potentials DVu and DVd which change in digital manner, and a digital charge pump circuit 316*bd* for adjusting gate potential Vg of current control transistor 316*a* in accordance with output potentials DVu and DVd from digital converting circuit 316*bt*. Digital converting circuit 316*bt* includes a buffer circuit 316*bu* receiving the output potential Va from comparing circuit 316*bc* for outputting a digital output potential DVu, and an inverter buffer circuit 316*bv* receiving analog output potential Va from comparing circuit 316*bc* for generating a digital output potential DVd. A circuit 316*bu* sets the digital output potential DVu to the level of the ground potential GND when the potential level of the analog output potential Va from comparing circuit 316*bc* corresponds to the state in which internal power supply potential intVCC becomes higher by at least Vref/10 than the reference potential Vref, and otherwise it sets the digital output potential DVu to the level of the external power supply potential extVCC. Inverter buffer circuit 316*bv* sets the digital output potential DVd to the level of the external power supply potential extVCC when the analog output potential Va from comparing circuit 316*bc* corresponds to the state in which the internal power supply potential intVCC becomes lower by at least Vref/10 than the reference potential Vref, and otherwise sets the digital output potential DVd to the level of the ground potential GND. The input logic threshold voltages of these buffer circuits 316*bu* and 316*bv* are adjusted to implement such logic operations.

Figure 30:
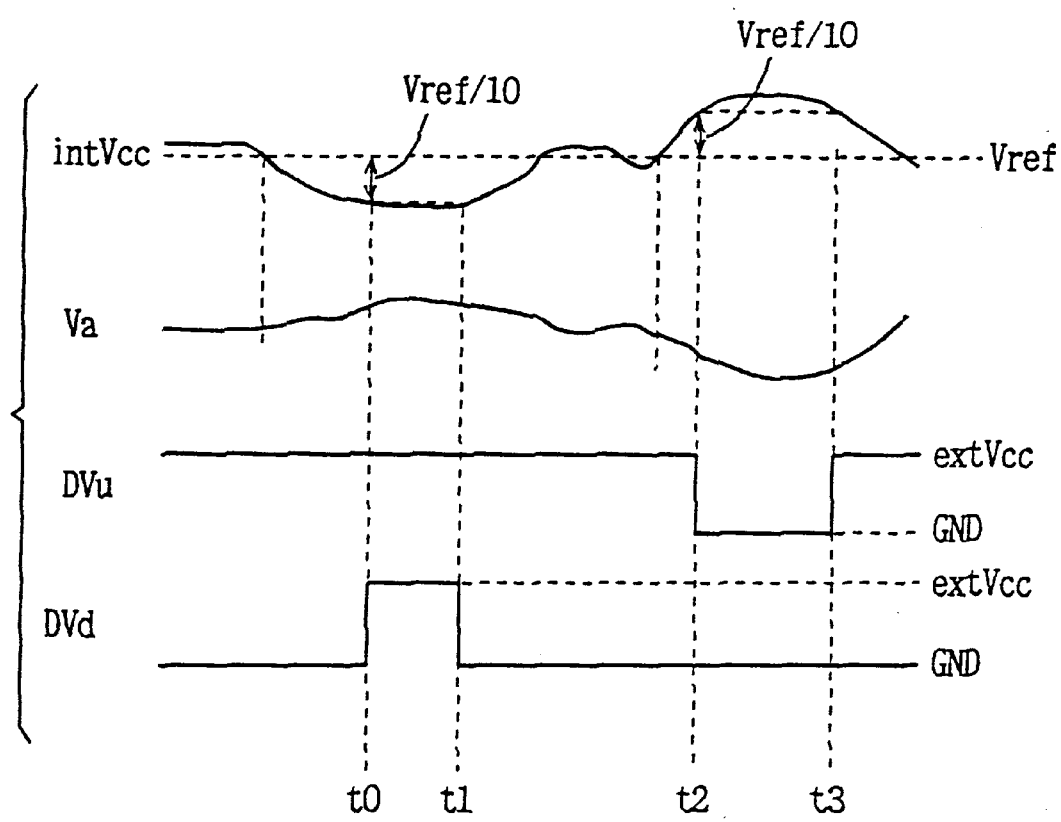
FIG. 30 is a timing chart showing the operation of the digital converting circuit shown in FIG. 29.

More specifically, as shown in FIG. 30, when the internal power supply potential intVCC lowers by Vref/10 or more from the reference potential Vref at time to, in accordance with the potential level of analog output potential Va, the digital output potential DVd is set to the level of the external power supply potential extVCC. The digital output potential DVd holds the potential level of the external power supply potential extVCC until the time t1, while the internal power supply potential intVCC is lower by at least Vref/10 than the reference potential Vref. After the time point t1, when the difference between internal power supply potential intVCC and reference potential Vref becomes smaller than Vref/10, the digital output potential DVd is set to the level of the ground potential GND. Meanwhile, at time t2, if the internal power supply potential intVCC becomes higher than the reference potential Vref by at least Vref/10, the digital output potential DVu is set to the level of the ground potential GND. At time t3, when the difference between the internal power supply potential Vcc and reference potential Vref becomes smaller than Vref/10, the digital output potential DVu is set to the level of the external power supply potential extVCC.

Digital charge pump circuit 316*d* includes a p channel MOS transistor 316*db* receiving the digital output potential DVu from buffer circuit 316*bu* for charging the gate of current control transistor 316*a*; a p channel MOS transistor 316*da* connected between p channel MOS transistor 316*db* and external power supply node 300*a* and having its gate connected to receive ground potential GND and functioning as a constant current source; an n channel MOS transistor 316*dc* receiving at its gate the digital output potential DVd from inverter buffer circuit 316*bv* for discharging the gate of current control transistor 316*a*; and an n channel MOS transistor 316*dd* connected between n channel MOS transistor 316*dc* and ground node 300*b* and having its gate connected to receive external power supply potential extVCC and functioning as a constant current source.

The buffer circuit 311*b* which applies digital control signal DRVD to the gate of current driver transistor 315 includes diode connected p channel MOS transistors 311*ba*, 311*bb* and 311*bc* connected in series between external power supply node 300*a* and node 311*bx*; an n channel MOS transistor 311*bd* connected between node 311*bx* and ground node 300*b* and having its gate connected to external power supply node 300*a*, functioning as a resistance element, a p channel MOS transistor 311*ba* and an n channel MOS transistor 311*bf* connected between external power supply node 300*a* and node 311*bi* for constituting a CMOS inverter which inverts and amplifies the output signal from differential amplifying circuit 314; a p channel MOS transistor 311*bg* and an n channel MOS transistor 311*bh* connected between external power supply mode 300*a* and node 311*bi* for constituting a CMOS inverter for inverting and amplifying an output signal from the CMOS inverter of the first stage; and a p channel MOS transistor 311*bj* connected between node 311*bi* and ground node 300*b* and having its gate connected-to node 311*bx*.

The p channel MOS transistors 311*ba*, 311*bb*, 311*bc* have threshold voltage Vthp, and output limiting potential LMT of extVCC−3|Vthp| at node 311*bx*. The p channel MOS transistor 311*bj* operates in a source follower mode, and clamps the potential at node 311*bi* at LMT+|Vthp|=extVCC−2|vthp|. The channel width of the drive transistor (transistor charging/discharging the output node) of the circuit portions operating in digital manner, that is, digital converting circuit 316*bt* and buffer circuit 311*b* is made larger than the channel width of the drive transistor (transistor for charging/discharging output node) of the circuit portion operating in analog manner, that is, comparing circuit 316*bc* and differential amplifying circuit 314. More specifically, the channel width of the drive transistor 311*a* is made smaller than the channel width of drive transistor 315. Similarly, the channel width of the transistor included in digital charge pump circuit 316*d* is made larger than the channel width of the transistor constituting the analog charge pump circuit 316*bg*. The operation will be described.

The operation when the internal power supply potential intVCC is lower than the reference potential Vref generated from reference potential generating circuit 313 will be described. In this case, as the internal power supply potential intVCC lowers, the driver control signal DRVA output from differential amplifying circuit 314 lowers from a potential near the boundary between conduction/non-conduction of analog control drive transistor 311a gradually to the ground potential. In response, the conductance of analog control drive transistor 311a increases proportionally, and accordingly, the current flowing from external power supply node 300a to internal power supply node 300c through analog control drive transistor 311a also increases.

Until the internal power supply potential intVCC lowers by at least Vref/10 from the reference potential the potential at output node 314i of differential amplifying circuit 314 is higher than the logical threshold of the inverter constituted by transistors 311be and 311bf in buffer circuit 311b. Therefore, the digital driver control signal DRVD output from buffer circuit 311b is set to the level of the external power supply potential extVCC, and digital control drive transistor 315 is rendered non-conductive. Therefore, even when the internal power supply potential intVCC lowers from reference potential Vref, current is supplied to the internal power supply node 300c only by the analog control drive transistor 311a. Therefore, if the internal power supply potential intVCC increases to the reference potential Vref in this state, digital control driver transistor 315 is kept non-conductive.

When the amount of consumption of internal power supply potential intVCC is larger than the current supplied from analog control drive transistor 311a, the internal power supply potential intVCC is continuously lowered. When the internal power supply potential intVCC becomes lower than the reference potential Vref by at least Vref/10, the potential at output node 314i of differential amplifying circuit 314 becomes lower than the logical threshold value of the inverter constituted by transistors 311be and 311bf of buffer circuit 311b, and the digital driver control signal DRVD output from buffer circuit 311b is set to the potential applied to node 311bi, that is, extVCC−2|Vthp|. In response, digital control drive transistor 315 is rendered conductive, and as a large current is supplied to internal power supply node 300c through the digital control drive transistor 315 which has wider channel width than analog control drive transistor 311b, that is, having larger current drivability, the internal power supply potential intVCC can be returned quickly to the reference potential Vref. By controlling the potential level of the lower limit of the signal DRVD, generation of an overshoot is prevented, as a large current is suppressed due to the limitation of conductance of the digital drive transistor.

When the internal power supply potential intVCC becomes higher than the reference potential Vref, the analog driver control signal DRVA increases from the potential at the boundary between conduction/non-conduction of analog control drive transistor 311a, and analog control drive transistor 311a is rendered non-conductive. Since the potential at output 314i from differential amplifying circuit 314 is also higher than the logical threshold voltage of the inverter in buffer circuit 311b, digital driver control signal DRVD attains to the level of the external power supply potential and digital control drive transistor 315 is rendered non-conductive. In this state, when the internal power supply potential intVCC is used by the internal circuitry, the internal power supply potential intVCC gradually lowers as it is consumed.

When large amount of current is supplied to internal power supply node 300c through digital control drive transistor 315, there will be a large overshoot of internal power supply potential intVCC, and if the current amount is small, there will be a large undershoot. In order to optimize the overshoot and the undershoot, current drivability of current control transistor 316a is controlled by current supplying circuit 316, in accordance with the difference between internal power supply potential intVCC and the reference potential Vref. In the current control circuit 316, when the internal power supply potential intVCC becomes lower than the reference potential Vref, the analog output potential Va output from comparing circuit 316bc increases, the p channel MOS transistor 316be and n channel MOS transistor 316bf in analog charge pump circuit 316bg are rendered non-conductive and conductive, respectively. In response, the gate potential Vg of current control transistor 316a lowers, and current drivability of the current control transistor 316a increases.

If the undershoot of external power supply potential intVCC increases and internal power supply potential intVCC becomes lower than the reference potential Vref by Vref/10 or more, the analog output potential Va output from comparing circuit 316c becomes higher than the logical threshold voltage of inverter buffer circuit 316bv in digital converting circuit 316bt, and the digital output potential DVd from the inverter buffer circuit 316bv is set to the level of the external power supply potential extVCC. Meanwhile, analog output potential Va is higher than the logical threshold voltage of buffer circuit 316bu (which is lower than the logical threshold voltage of buffer circuit 316bv), the digital output potential DVu from buffer-circuit 316bu attains to the external power supply potential extVCC, and p channel MOS transistor 316db and n channel MOS transistor 316dc in digital charge pump circuit 316d are set to the non-conductive state and conductive state, respectively. Consequently, the gate of current control transistor 316a is discharged rapidly through n channel MOS transistor 316dc having a large channel width, the current drivability of current control transistor 316a increases rapidly, and a large current is applied from external power supply node 300a to current driver transistor 315.

When the overshoot of internal power supply potential intVCC is large and internal power supply potential intVCC is increased from reference potential Vref by at least Vref/10, the analog output potential Va output from comparing circuit 316bc becomes lower than the logical threshold voltage of-buffer circuit 316bu of digital converting circuit 316bt, and the digital output potential DVu from buffer circuit 316bu is set to the level of the ground potential GND. Meanwhile, the analog output potential Va from comparing circuit 316bc is lower than the logical threshold voltage (which is set higher than the logical threshold voltage of buffer circuit 316bu) of inverter buffer circuit 316bv, and hence the output potential DVd from inverter buffer circuit 361bv is also set to the level of the ground potential GND. Consequently, the p channel MOS transistor 316db and n channel MOS transistor 316dc in digital charge pump circuit 316d are rendered conductive and non-conductive, respectively, the gate of the current control transistor 316a is quickly charged through p channel MOS transistor 316db having wide channel width, and the current drivability of current control transistor 316 lowers quickly. Consequently, the current applied from external power supply node 300a to current driver transistor 315 is reduced quickly and overshoot is suppressed.

As described above, when the mixed mode internal power supply potential generating circuit is used, when the potential difference between internal power supply potential intVCC and reference potential Vref is large, both the analog control drive transistor 311a and digital control drive transistor 315a are rendered conductive, and internal power supply potential intVCC is quickly returned to the reference potential Vref. Meanwhile, if the potential difference between internal power supply potential intVCC and reference potential Vref is small, only the analog control drive transistor 311a is rendered conductive, and the internal power supply potential intVCC is precisely returned to the reference potential Vref. Therefore, the internal power supply potential intVCC can be set at high speed and precisely to the reference potential Vref.

Further, since analog charge pump circuit 316bg and digital charge pump circuit 316d are provided in current supplying circuit 316, when the internal power supply potential intVCC is in the range from Vref−Vref/10 to Vref+Vref/10, gate of the current control transistor 316a is charged/discharged only by the analog charge pump circuit 316bg, and when it is out of this range, the gate of the current control transistor 316a is charged/discharged by both the analog charge pump circuit 316bg and digital charge pump circuit 316d. Therefore, when the internal power supply potential intVCC largely deviates from the reference potential Vref, the gate of the current control transistor 316a is charged/discharged by two charge pump circuits 316bg and 316d, and therefore the gate potential quickly comes near to the optimal value (rough adjustment of gate potential), and if the internal power supply potential intVCC is close to the reference potential Vref, the gate of current control transistor 316a is charged/discharged only by the analog charge pump circuit 316bg, and therefore the gate potential can be approached to the optimal value precisely (fine adjustment of gate potential). Therefore, the gate potential of current control transistor 316a can be set to the optimal value at high speed and precisely. The buffer 311b may be operated in digital manner, in accordance with the magnitude of intVCC and Vref. The surely current is surely adjusted by current supplying circuit 316.

[Embodiment 10]

Figure 31:
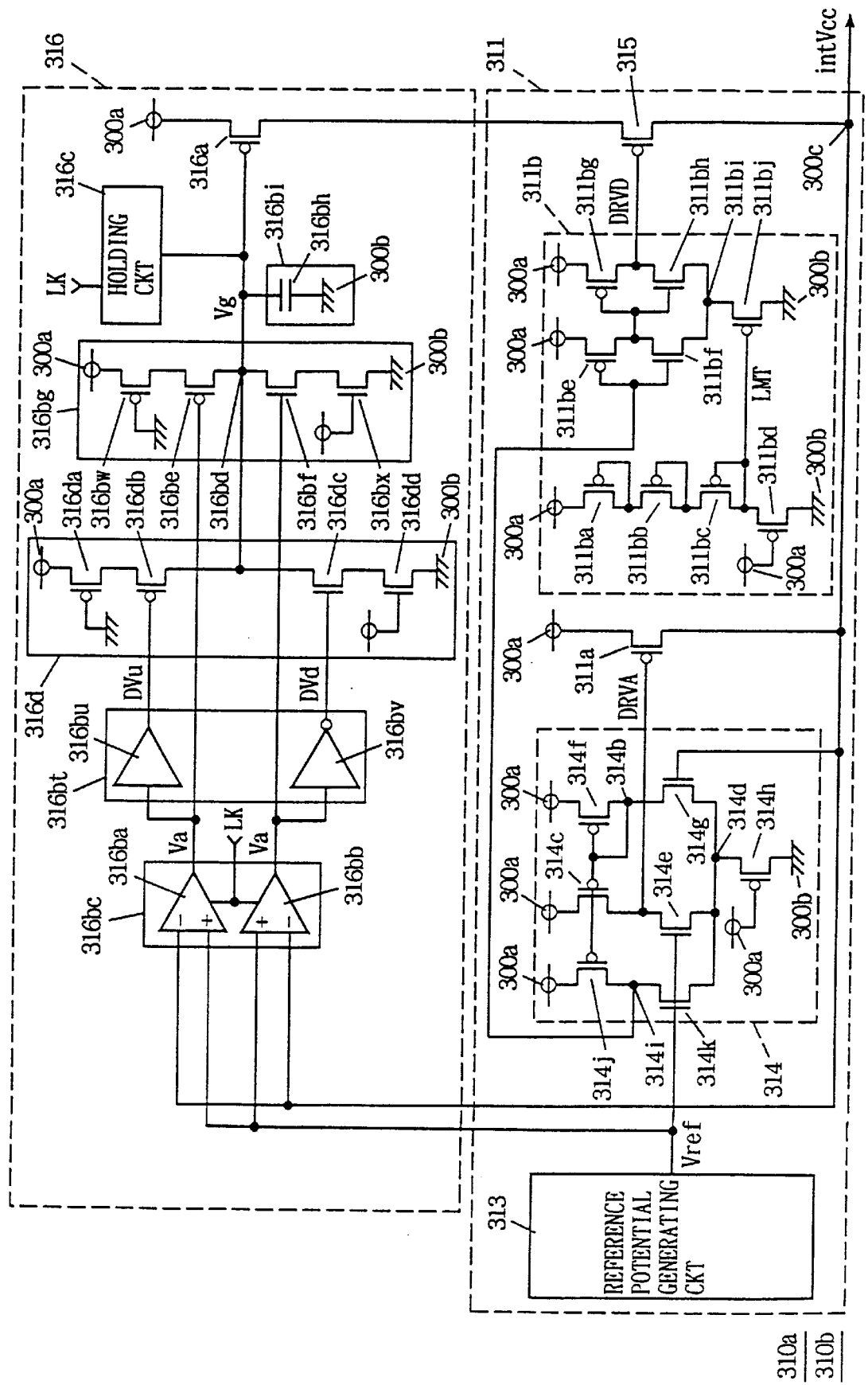
FIG. 31 shows a still further structure of the internal power supply potential generating circuit.

FIG. 31 shows a structure of a main portion of a semiconductor memory device in accordance with a tenth embodiment of the present invention. The structure of the tenth embodiment shown in FIG. 31 is the same as the structure of the ninth embodiment shown in FIG. 29 except the following points, and corresponding portions are denoted by the same reference characters. Detailed description thereof is not repeated.

In the structure shown in FIG. 31, in current supplying circuit 316, a potential holding circuit 316c for holding gate potential Vg of current control transistor 316a in response to lock in signal LK is provided. The holding circuit 316c has the same structure as the potential holding circuit 316c shown in FIG. 28.

Further, in current supplying circuit 316, comparing circuit 316bc is inactivated when the lock in signal LK is activated. The comparing circuit 316bc outputs a signal at the H level when inactivated, that is, when the internal clock signal intCLK is locked in the external clock signal extCLK. In this case, the output potential DVu of digital converting-circuit 316bt is set to the level of the external power supply potential extCLK, and digital output potential DVd is set to the level of the ground potential GND. Therefore, in the digital charge pump circuit 316d and analog charge pump circuit 316bg, p channel MOS transistors 316db and 316be as well as n channel MOS transistors 316dc and 316bf are all rendered non-conductive, and charging/discharging operation of gate potential Vg of current control transistor 316a is stopped. In holding circuit 316c, the gate potential Vg is held at the potential level at the time of lock in. At the time of lock in, internal clock signal synchronizing circuit 320 hardly performs operation for adjusting frequency/phase of internal clock signal intCLK, and internal clock signal intCLK is generated stably. Therefore, in this case, the current consumption is almost constant, and by holding the gate potential Vg of current control transistor 316a at the time of lock in, a current corresponding to the constant consumed current can be supplied to the internal power supply node 300c. More specifically, at the lock in operation, the amount of current supplied through digital control drive transistor 315 to internal power supply node 300c can be maintained at the optimal value. Consequently, the internal power supply potential intVCC with respect to the internal clock synchronizing circuit 320 can be maintained at a constant potential level, and hence internal clock signal intCLK can be generated stably.

Further, the potential holding circuit 316c includes a start up circuit 316ch, as shown in FIG. 28. Therefore, when the power is turned on, the gate potential Vg of current control transistor 316a is set to the extVCC/2, which is close to the optimal value, and hence the amount of current supplied by current control transistor 316a can be set to the optimal state at high speed after power on. Therefore, the internal power supply potential intVCC can be set to the prescribed level of reference potential Vref at high speed.

[Embodiment 11]

Figure 32:
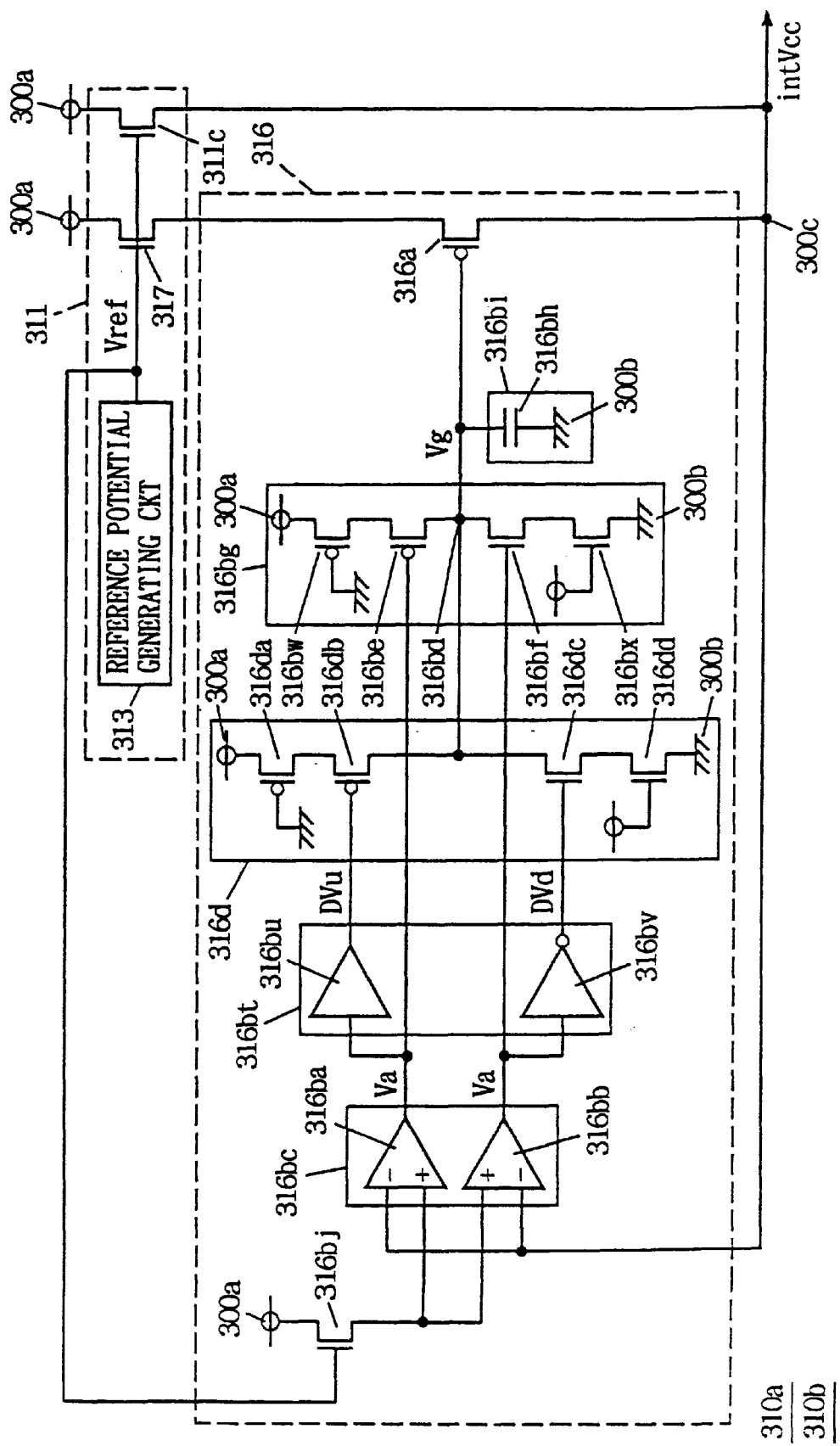
FIG. 32 shows a still further structure of the internal power supply potential generating circuit.

FIG. 32 shows a structure of a main portion of a semiconductor memory device in accordance with an eleventh embodiment of the present invention. In FIG. 32, the structures of internal power supply potential generating circuits 310a and 310b are shown. Other structures are the same as any of Embodiments 1 to 10 above, and corresponding portions are denoted by the same reference characters and detailed description thereof is not repeated. In the eleventh embodiment, the internal power supply potential intVCC is set to the potential level lower by the threshold voltage Vthn of n channel MOS transistor than reference-potential Vref.

More specifically, the constant voltage circuit 311 includes an n channel MOS transistor 311c connected between external power supply nodes 300a and 300c and receiving at its gate the reference potential Vref; and an n channel MOS transistor 317 connected between external power supply node 300a and current control transistor 316a and receiving at its gate the reference potential Vref. Current control transistor 316a directly supplies current to internal power supply node 300c.

In current control circuit 316, an n channel MOS transistor 316bj for transmitting reference potential Vref from reference potential generating circuit 313 to comparing circuit 316bc in the source follower mode is provided. The n channel MOS transistor 316bj has one conduction node (drain) connected to external power supply node 300a, and another conduction node (source) coupled to a positive input of differential amplifying circuits 316ba and 316bb included in comparing circuit 316bc. Drive transistors (n channel MOS transistors) 311c and 317 have a threshold voltage Vthn, and have the same channel length. However, in order to increase current drivability, drive transistor 317 has wider channel width than drive transistor 311c. The threshold voltage of n channel MOS transistor 316bj is also the same Vthn as drive transistors 311c and 317. Transistors 311c, 316bj and 317 have their gate potentials lower than the drain, the transistors operate in the source follower mode, and transmit the potential which is lower by the threshold voltage than the potential applied to their gates to their sources. Therefore, transistor 311c is rendered conductive when the internal power supply potential intVCC on internal power supply node 300c becomes lower than Vref–Vthn, and transmits the current to internal power supply node 300c. Meanwhile, if the internal power supply potential intVCC increases to be higher than the potential Vref–Vthn, drive transistor 311c is rendered non-conductive conductive (since the gate-source potential difference becomes smaller than the threshold voltage thereof). Drive transistor 317 serves as a current supply source for the current control transistor 310a. When the internal power supply potential intVCC increases to be higher than the potential Vref–Vthn, current control transistor 316a is rendered non-conductive, and accordingly, driver transistor 317 is also rendered non-conductive. Meanwhile, if the internal power supply potential intVCC becomes not higher than Vref–Vthn, the gate potential Vg of current control transistor 316a lowers, current control transistor 316a is rendered conductive, and accordingly, drive transistor 317 is rendered conductive as the source potential lowers, so that it supplies current to current control transistor 316a. Therefore, the drive transistor 317 is also rendered conductive/non-conductive in accordance with the potential level of internal power supply potential intVCC.

Comparing circuit 316bc compares the potential Vref–Vthn with internal power supply potential intVCC through n channel MOS transistor 316bj. Therefore, operations of digital charge pump circuit 316d and analog charge pump circuit 316bg are controlled in accordance with the difference between internal power supply potential intVCC and potential Vref–Vthn, and the gate potential Vg of current control transistor 316a is controlled accordingly. When the undershoot of internal power supply potential intVCC is small, current is supplied through drive transistor 311c, and also current is supplied through analog charge pump circuit 316bg and current control transistor 316a. If the undershoot of internal power supply potential intVCC is large, the gate potential Vg of current control transistor 316a is controlled by analog charge pump circuit 316bg and digital charge pump circuit 316d, and large current is supplied to internal power supply node 300c. Therefore, by using the structure shown in FIG. 32 also, the internal power supply potential intVCC can be stably held at the constant potential level of Vref–Vthn. In accordance with the structure shown in FIG. 32, in the constant voltage circuit 311, the difference amplifying circuit for comparing internal power supply potential intVCC with reference potential Vref is not necessary, and hence the area of occupation by the circuits can be reduced.

In the structure shown in FIG. 32, a potential holding circuit 316c which is rendered conductive in response to lock in signal LK may be provided, as in the structure of FIG. 31. At this time, the activation/inactivation of comparing circuit 316bc may be controlled in accordance with the lock in signal LK.

[Other Applications]

A clock synchronous type SRAM has been described as an example of a semiconductor memory device in the embodiments above. However, the present invention is also applicable to a synchronized type semiconductor memory device such as a synchronous DRAM which operates in synchronization with an externally applied clock signal. Further, the structure of the internal power supply potential generating circuit itself may be applied to a standard DRAM, as an internal voltage lowering circuit for generating an internal power supply potential intVCC from the external power supply potential extVCC. Further, in the internal power supply potential generating circuit, the driver transistor for-supplying current constituted by a p channel MOS transistor may be replaced by a pnp bipolar transistor.

Further, the driver transistor for supplying current constituted by an n channel MOS transistor may be replaced by an npn bipolar transistor.

Further, the structure of the internal clock signal synchronizing circuit can be applied to a general synchronizing circuit, and it can be applied to a use for generating an internal signal which has its phase/frequency synchronized with an incoming signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a comparing circuit having first and second clock signal input nodes, for detecting a difference in at least one of chase and frequency of first and second clock signals applied to said first and second clock signal input nodes and for outputting first and second comparing signals for decreasing said difference;
    a charge pump circuit receiving said first and second comparing signals for charging a charging/discharging node when said first comparing signal is active, and for discharging said charging/discharging node when said second comparing signal is active;
    a current control circuit including a transfer gate connected between said charging/discharging node and a first node, receiving a hold designating signal and rendered non-conductive when said hold designating signal is active, for outputting a current control signal in accordance with the potential at said first node; and
    an internal clock signal generating circuit of which operational current is adjusted in accordance with said current control signal, for outputting said second clock signal; wherein
    the hold designating signal is set to said active state when supply of the first clock signal to said first clock signal input mode is stopped.

2. The semiconductor device according to claim 1, wherein said internal clock signal generating circuit
    comprises cascaded inverters of an odd number of stages, an inverter at a first stage of said cascaded inverters receives an output signal of an inverter at a final stage of said cascaded inverters, and each inverter of said cascaded inverters includes a current source transistor receiving said current control signal at a control gate thereof and causing a current flow to provide the operational current for said each inverter in response to said current control signal.

3. A semiconductor device, comprising:
    an internal power supply potential generating circuit including a reference potential generating circuit which operates receiving an external power supply potential for generating a reference potential not dependent on fluctuation of said external power supply potential, for supplying an internal power supply potential corresponding to said reference potential to an internal power supply node; and
    an internal clock signal synchronizing circuit which operates using the internal power supply potential on said internal power supply node as one operational power supply potential, for generating an internal clock signal synchronized with an externally applied clock signal.

4. The semiconductor device according to claim 3, wherein said reference potential determines a level of said internal power supply potential.

5. The semiconductor device according to claim 3, wherein said internal power supply potential is substantially equal in level to said reference potential.

6. A semiconductor device comprising:

an equivoltage generator for comparing an input voltage at an input node and an output voltage at an output node to control the output voltage at said output node to be equal to the input voltage at said input node;

a resistive element coupled between said output node and a first power source, for causing a current flow between said output node and the first power source; and a clock generator having an operating current thereof determined according to the current flow through said output node and performing an oscillation operation to generate an internal clock signal;

said equivoltage generator including a current drive transistor coupled between a second power source and said output node for causing said current flow in accordance with a result of comparison, said current drive transistor having a drain connected to said resistive element through said output node.

7. The semiconductor device according to claim 6, wherein said input node receives a variable voltage as said input voltage.

8. The semiconductor device according to claim 6, wherein said resistive element comprises a variable resistance element having a variable resistance value independent of temperature.

9. The semiconductor device according to claim 6, further comprising a capacitance element coupled between said output node and ground and being charged and discharged in accordance with the output voltage at said output node.

10. The semiconductor device according to claim 6, wherein said equivoltage generator further comprises a comparator for comparing said input voltage and said output voltage to apply a signal indicating the result of comparison to a control gate of said current drive transistor.

11. The semiconductor device according to claim 6, wherein said resistive element comprises a transistor having a control gate receiving a variable gate potential.

12. The semiconductor device according to claim 6, wherein said current flow through said output node is independent of a potential at said second power source.

13. The semiconductor device according to claim 6, wherein said first power source is ground.

14. The semiconductor device according to claim 6, wherein said equivoltage generator includes a comparator for comparing said input voltage and said output voltage to produce the result of comparison, and said clock generator includes cascaded inverters of an odd number of stages, an inverter at a first stage of said cascaded inverters receiving an output signal of an inverter at a final stage of said cascaded inverters, and each inverter of said cascaded inverters including a current source transistor for causing a current flow to provide the operating current of the each inverter in accordance with the result of comparison.

15. The semiconductor device according to claim 14, wherein said current drive transistor and said current source transistor are p channel MOS transistors receiving an output signal of said comparator in common at their respective gates.

16. A semiconductor device comprising:

a resistance element coupled between an output node and a first power source node, for causing a current flow therethrough;

an equivoltage generator for comparing an input voltage at an input node and an output voltage at said output node to control said output voltage at said output node to be equal to said input voltage at said input node, said equivoltage generator including a current drive transistor for adjusting an amount of said current flow through said resistance element in accordance with a result of comparison; and a clock generator having an operating current thereof determined according to the current flow through said output node and performing an oscillation operation to generate an internal clock signal, said clock generator including a current source transistor having a control gate receiving a common voltage to a voltage at a control gate of said current drive transistor.

17. The semiconductor device according to claim 16, wherein said input node receives a variable voltage as said input voltage.

18. The semiconductor device according to claim 16, wherein said resistive element comprises a variable resistance element having a variable resistance value.

19. The semiconductor device according to claim 16, further comprising a capacitance element coupled between said output node and said first power source node and being charged and discharged in accordance with the output voltage at said output node.

20. The semiconductor device according to claim 16, wherein said equivoltage generator further includes a comparator for comparing said input voltage and said output voltage to generate an output signal in accordance with the result of comparison, said current drive transistor is coupled between a second power source node and said output node and receives the output signal of said comparator at the control gate thereof to cause the current flow from said second power source node to said output node in accordance with the output signal of said comparator, and said clock generator includes cascaded inverters of an odd number of stages, an inverter at a first stage of said cascaded inverters receiving an output signal of an inverter at a final stage of said cascaded inverters, and each inverter of said cascaded inverters is provided with said current source transistor, and each respective current source transistor receives the output signal of said comparator at the control gate thereof to provide the operating current of each respective inverter in accordance with the output signal of said comparator.

21. The semiconductor device according to claim 16, wherein said equivoltage generator further comprises a comparator for comparing said input voltage and said output voltage, and wherein said current drive transistor is coupled between a second power source node different from ground and said output node and receives an output signal of said comparator at the control gate thereof to cause the current flow from said second power source node in accordance with the output signal of said comparator.

22. The semiconductor device according to claim 21, wherein said current drive transistor and said current source transistor are p channel MOS transistors receiving the output signal of said comparator in common at their respective gates.

23. The semiconductor device according to claim 6, wherein said equivalent generator includes a comparator for comparing said input voltage with said output voltage to produce the result of comparison.

* * * * *